(12) United States Patent
Fujie et al.

(10) Patent No.: US 9,389,347 B2
(45) Date of Patent: Jul. 12, 2016

(54) COLORED COMPOSITION, INKJET INK, COLOR FILTER AND METHOD OF PRODUCING THE SAME, SOLID-STATE IMAGE SENSOR AND DISPLAY DEVICE

(75) Inventors: Yoshihiko Fujie, Shizuoka-ken (JP); Masaru Yoshikawa, Shizuoka-ken (JP); Shinichi Kanna, Shizuoka-ken (JP); Kenta Ushijima, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 305 days.

(21) Appl. No.: 13/583,877

(22) PCT Filed: Mar. 30, 2011

(86) PCT No.: PCT/JP2011/058667
§ 371 (c)(1),
(2), (4) Date: Sep. 10, 2012

(87) PCT Pub. No.: WO2011/122707
PCT Pub. Date: Oct. 6, 2011

(65) Prior Publication Data
US 2013/0012648 A1 Jan. 10, 2013

(30) Foreign Application Priority Data
Mar. 31, 2010 (JP) .................................. 2010-84603

(51) Int. Cl.
C09B 69/10 (2006.01)
G02B 5/20 (2006.01)
C09D 11/101 (2014.01)
C09D 11/328 (2014.01)
G03F 7/00 (2006.01)

(52) U.S. Cl.
CPC .............. *G02B 5/201* (2013.01); *C09B 69/101* (2013.01); *C09B 69/103* (2013.01); *C09B 69/106* (2013.01); *C09B 69/109* (2013.01); *C09D 11/101* (2013.01); *C09D 11/328* (2013.01); *G03F 7/0007* (2013.01)

(58) Field of Classification Search
CPC .. C09B 69/101; C09B 69/103; C09B 69/106; C09B 69/105
See application file for complete search history.

(56) References Cited

U.S. PATENT DOCUMENTS

| | | | | |
|---|---|---|---|---|
| 3,507,850 | A * | 4/1970 | Werner | C09B 62/443 534/573 |
| 4,619,990 | A * | 10/1986 | Elmasry | 534/573 |
| 5,578,419 | A * | 11/1996 | Itoh et al. | 430/281.1 |
| 7,368,224 | B2 * | 5/2008 | Yamaoka | C07D 231/22 430/281.1 |
| 8,486,591 | B2 * | 7/2013 | Jeong et al. | 430/7 |
| 8,778,235 | B2 * | 7/2014 | Ito et al. | 252/586 |
| 2006/0089421 | A1 | 4/2006 | Vasudevan | |
| 2006/0089422 | A1 | 4/2006 | Vasudevan | |
| 2007/0004823 | A1 | 1/2007 | Tsujihata | |
| 2007/0112134 | A1 * | 5/2007 | Seto | 525/165 |
| 2007/0117031 | A1 * | 5/2007 | Mizukawa et al. | 430/7 |
| 2008/0188662 | A1 | 8/2008 | Banning | |
| 2009/0005474 | A1 | 1/2009 | Jaunky et al. | |
| 2011/0014401 | A1 * | 1/2011 | Fujimaki et al. | 428/1.33 |
| 2011/0102529 | A1 * | 5/2011 | Yoshida et al. | 347/104 |
| 2011/0112242 | A1 * | 5/2011 | Shimanaka et al. | 524/560 |
| 2011/0217636 | A1 * | 9/2011 | Kanna et al. | 430/7 |

FOREIGN PATENT DOCUMENTS

| | | |
|---|---|---|
| CN | 101223244 A | 7/2008 |
| EP | 1129861 A1 * | 9/2001 |
| JP | 59-075205 A | 4/1984 |
| JP | 06-075375 A | 3/1994 |
| JP | 07-248413 A | 9/1995 |
| JP | 2000-129150 A | 5/2000 |
| JP | 2000-230014 A | 8/2000 |
| JP | 2002-201387 A | 7/2002 |
| JP | 3309514 B2 | 7/2002 |
| JP | 2003073358 A * | 3/2003 |
| JP | 2004-339332 A | 12/2004 |
| JP | 2005-316012 A | 11/2005 |
| JP | 3736221 B2 | 1/2006 |
| JP | 2006-176756 A | 7/2006 |
| JP | 2006-258916 A | 9/2006 |
| JP | 2007-009117 A | 1/2007 |
| JP | 2008-189932 A | 8/2008 |
| JP | 2008-292970 A | 12/2008 |
| JP | 2009-501251 A | 1/2009 |
| JP | 2009-062457 A | 3/2009 |
| JP | 2010-013639 A | 1/2010 |
| JP | 2010-065180 A | 3/2010 |
| WO | WO 2007006637 A2 * | 1/2007 |
| WO | WO 2009025287 A1 * | 2/2009 |
| WO | WO 2009116442 A1 * | 9/2009 |
| WO | WO 2009157536 A1 * | 12/2009 |
| WO | WO 2011040628 A1 * | 4/2011 |

OTHER PUBLICATIONS

Machine translation of JP 2000-129150 A, Dec. 2014.*
Derwent Abstract of JP 2003073358, 2003.*
Notice of Reasons for Rejection, mailed Sep. 24, 2014, issued in corresponding JP Application No. 2010-084603, 4 pages in English and Japanese.
Third Office Action, dated Jan. 22, 2014, issued in corresponding Chinese Application No. 201180012822.6, 9 pages in English and Chinese.
Notice of Reasons for Rejection, dated Dec. 17, 2013, issued in corresponding JP Application No. 2010-084603, 4 pages in English and Japanese.
Communication, dated Jul. 24, 2013, issued in corresponding EP Application No. 11762922.0, 6 pages in English.
International Search Report of PCT/JP2011/058667 dated May 17, 2011, 3 pages.

(Continued)

*Primary Examiner* — Nicole M Buie-Hatcher
(74) *Attorney, Agent, or Firm* — Sughrue Mion, PLLC

(57) ABSTRACT

The invention provides a colored composition including a dye multimer having an alkali-soluble group as a dye, the dye multimer having a weight-average molecular weight (Mw) of from 5,000 to 20,000 and a dispersity (weight-average molecular weight (Mw)/number-average molecular weight (Mn)) of from 1.00 to 2.50.

44 Claims, No Drawings

(56) References Cited

OTHER PUBLICATIONS

Written Opinion PCT/JP2011/058667 dated May 17, 2011, 4 pages.
The Second Notification of Examination Opinion, dated Oct. 11, 2013, issued in corresponding CN Application No. 201180012822.6, 8 pages in English and Chinese.
First Notice of Examination Opinion, dated Apr. 17, 2013, issued in corresponding CN Application No. 201180012822.6, 7 pages in English and Chinese.
Office Action dated Jan. 23, 2015 from the Taiwanese Patent Office in counterpart Taiwanese Application No. 100110763.
Office Action dated Feb. 24, 2015, issued by the Japan Patent Office in corresponding Japanese Application No. 2014-027628.
Office Action dated May 26, 2015 from the Japanese Patent Office in counterpart JP Application No. 2014-027628.
Office Action dated Apr. 21, 2015 from the Japanese Patent Office in counterpart JP Application No. 2010-084603.
Office Action dated Jun. 22, 2015 from the Korean Intellectual Property Office issued in corresponding Korean Application No. 10-2012-7023303.
Communication dated Dec. 31, 2015, issued by the Taiwan Patent Office in corresponding Taiwanese Application No. 100110763.

\* cited by examiner

COLORED COMPOSITION, INKJET INK, COLOR FILTER AND METHOD OF PRODUCING THE SAME, SOLID-STATE IMAGE SENSOR AND DISPLAY DEVICE

CROSS REFERENCE TO RELATED APPLICATIONS

This application is a National Stage of International Application No. PCT/JP2011/058667 filed Mar. 30, 2011, claiming priority based on Japanese Patent Application No. 2010-084603 filed Mar. 31, 2010, the contents of all of which are incorporated herein by reference in their entirety.

TECHNICAL FIELD

The invention relates to a colored composition, an inkjet ink, a color filter and a method of producing the same, a solid-state image sensor and a display device.

BACKGROUND ART

In recent years, demand for liquid crystal displays (LCDs), in particular color liquid crystal displays, has been increasing in accordance with development in personal computers and large-sized liquid crystal TVs. There is also an expectation for organic EL displays to become common due to the desire for improved image quality. There has also been a remarkable growth in demand for solid-state image sensors, such as CCD image sensors, as digital cameras and camera-equipped cellular phones become popular.

A color filter is a key device used in these displays or optical elements, and reduction in costs for producing color filters has been desired in addition to the improvement in image quality. Typically, a color filter includes color patterns of three primary colors, red (R), green (G) and blue (B), and these color patterns separate light passing through a display device or an image sensor into three primary colors.

Dyes used for color filters generally need to satisfy the following requirements.

Specifically, the dyes need to: have favorable spectral characteristics in terms of color reproduction; not exhibit optical disorders such as uneven optical density that may cause light scattering that lowers the contrast of liquid crystal displays, or color unevenness/roughness of solid-state image sensors; exhibit robustness against environmental conditions under which the devices are used, such as favorable heat fastness, light fastness and moisture fastness; have a large molar absorbance coefficient that enables formation of a thin film; and the like.

In the production of color filters, a pigment dispersion method has been used. Color filters produced from a colored curable composition in which a pigment is dispersed in a curable composition by photolithography or inkjetting, the colored curable composition being prepared by a pigment dispersion method, are stable with respect to light or heat due to the use of a pigment.

In the process of photolithography, colored pixels are formed by applying a radiation-sensitive composition onto a support with a spin coater, a roll coater or the like, drying the coated film, and subjecting the dried coated film to pattern exposure and development. A color filter can be obtained by repeating these processes for a number of times corresponding to the number of colors used in the color filter. Since light is used to form a pattern in photolithography, whereby positional accuracy of the obtained pattern is excellent, photolithography has been widely used as a method suitable for producing large-sized, high-resolution color filters. In recent years, photolithography has been particularly advantageous for producing solid-state image sensors that require a further increase in resolution.

As mentioned above, a further increase in the resolution of color filters for solid-state image sensors has been desired in recent years.

However, in a conventional pigment dispersion method, it has been difficult to further improve the resolution due to color unevenness caused by coarse pigment particles, or the like. Therefore, in a field in which a fine pattern is required, such as solid-state image sensors, performing photolithography in which a pigment dispersion method is employed is becoming difficult. On the other hand, in the field of liquid crystal displays, color filters produced by photolithography in which a pigment dispersion method is employed have problems such as a reduced contrast due to light scattering caused by pigment particles or an increased amount of haze, although these color filters exhibit excellent light fastness and heat fastness.

In addition to photolithography, a method in which colored layers (color pixels) are formed by discharging color ink by inkjetting has been proposed as a method of producing a color filter (see, for example, Japanese Patent Application Laid-Open (JP-A) Nos. 59-75205 and 2004-339332).

An inkjet method is a method of recording characters or images by applying ink directly onto a recording medium by jetting ink droplets from fine nozzles. An inkjet method, in which inkjet heads are sequentially moved, has an advantage in that a large-sized color filter can be produced at high productivity and favorable operability while generating low noise. In the production of color filters by an inkjet method, inkjet inks prepared by a pigment dispersion method are used. As inkjet inks prepared by a pigment dispersion method, for example, an inkjet ink for producing a color filter, which ink includes a binder component, a pigment and a solvent having a boiling point of 180° C. to 260° C. and a vapor pressure of 0.5 mmHg or less at room temperature, has been proposed (see for example, JP-A No. 2002-201387).

When inkjet inks prepared by a pigment dispersion method are used to produce a color filter, since nozzle clogging frequently occurs due to coagulation of a pigment, there has been a demand for improving discharge stability. In addition, recoverability of the state of ink discharge by a recovery operation such as wiping or purging tends to decrease. Further, there may be a case in which ink discharge deviates from the right direction as a result of performing wiping during which nozzle surfaces are scraped with the coagulated pigment.

When a dye is used instead of a pigment, an increase in resolution can be expected as a result of overcoming the problems of color unevenness/roughness in the case of color filters for solid-state image sensors; and improvement in optical properties in terms of contrast or haze can be expected in the case of color filters for liquid crystal displays or organic EL displays. In addition, in an inkjet method in which a dye is used, discharge stability is generally favorable, and the state of ink discharge can be readily recovered by performing wiping or purging even if nozzle clogging is caused cue to the increased viscosity of the ink.

Under such circumstances, use of a dye as a dye has been taken into consideration (for example, see JP-A No. 6-75375). However, a curable composition containing a dye has newly raised the following problems.

(1) Dyes generally exhibit inferior light fastness and heat fastness compared with pigments. In particular, optical properties of dyes may change due to high temperature during sputtering of ITO (indium tin oxide) that are commonly used as an electrode for liquid crystal displays (LCDs) or flat panel displays (FPDs).

(2) Since dyes tend to suppress radical polymerization reaction, design of a colored curable composition becomes difficult in a system in which radical polymerization is used as a means of curing.

(3) Since ordinary dyes have a low solubility in an alkali aqueous solution or an organic solvent (hereinafter, also simply referred to as a solvent), it is difficult to obtain a curable composition having a desired spectrum.

(4) Since dyes often interact with other components in a colored curable composition, it is difficult to adjust the solubility of a cured portion or an uncured portion (developability).

(5) When dyes have a low molar absorbance coefficient ($\epsilon$), a large amount of dye needs to be added and the amount of other components in the colored curable composition, such as a polymerizable compound (monomer), a binder, a photopolymerization initiator or the like, needs to be reduced. As a result, curability of the composition, heat fastness after curing, or developability of a cured or uncured portion, may decrease.

Due to these problems, it has been difficult to use a dye to form a colored pattern for color filters that exhibits a high resolution, an excellent ability of forming a thin film, and an excellent robustness.

In addition, since color filters for solid-state image sensors need to be formed into a thin film (for example, to a thickness of 1 μm or less), a large amount of dye need to be added in a curable composition, thereby exaggerating the problems as mentioned above.

With regard to such problems, various methods of selecting the type of initiator or increasing the amount of the initiator have been proposed (for example, see JP-A No. 2005-316012).

A method of producing a color filter has been proposed in which a colored pattern after being formed on a support is exposed to light while heating the support in order to cause polymerization while increasing the exposure temperature to increase the polymerization ratio in the system (see, for example, Japanese Patent No. 3309514).

A method of producing a color filter has been proposed in which a color filter is exposed to light between the development and the heat treatment, thereby suppressing deformation of the color filter (see, for example, JP-A No. 2006-258916).

A colored curable composition and a dye compound using a dipyrromethene dye have been studied in view of its spectral properties suitable for color filters (see for example, JP-A No. 2008-292970).

A color filter including a polymer having a triphenylmethane dye in its molecule as a dye has been proposed in view of overcoming the shortcomings in sublimation during production of color filters (see, for example, Japanese Patent No. 3736221).

In addition to the problems as described above, dye-containing colored compositions for color filters have the following problems that are unique to dyes.

(6) Penetration of dye during application of different color

When a colored pattern is formed from a colored composition using a dye, the dye tends to penetrate into a pattern (or a layer) of a different color that has been previously formed, thereby causing color mixing.

(7) Elution of dye during alkali development

In a colored composition using a dye, a large amount of dye needs to be added and, as a result, the amount of a component that contributes to photolithographic properties is relatively decreased. As a result, sensitivity of the colored composition is lowered and a pattern tends to exfoliate in a region exposed to a low amount of light. In addition, defective formation of a pattern, such as failure to obtain a desired shape or a color density of the pattern due to elution of a dye during alkali development, tends to occur.

(8) Heat diffusion (color transfer) due to heat treatment

In a colored composition using a dye, color transfer tends to occur between the adjacent pixels or between the adjacent layers when a heat treatment is performed after the film formation. The color transfer may cause color mixing.

In addition to the above problems, there is a further problem as described below.

(9) Development residues after development (development residues remaining on support or layer of different color)

Development residues may remain on a support or on a pattern (or a layer) of a different color that has been previously formed. In either case, the development residue may cause color mixing.

Among the problems (6) to (9), in particular, problems (6), (8) and (9) tend to become a cause of color mixing, which may significantly inhibit the improvement in sensitivity, which has been desired in solid-state image sensors in recent years.

JP-A No. 2008-292970 discloses the spectral characteristics originated from the light absorption properties that are unique to dipyrromethene dyes. However, JP-A No. 2008-292970 does not mention the problems such as elution of a dye during alkali development, penetration of a dye, heat diffusion (color transfer) of a dye due to heat treatment, or remaining development residues.

Japanese Patent No. 3736221 discloses the effect of suppressing sublimation derived from the characteristics of a polymer including a triphenylmethane dye. However, Japanese Patent No. 3736221 does not mention the problems such as elution of a dye during alkali development, penetration of a dye, heat diffusion (color transfer) of a dye due to heat treatment, or formation of development residues.

The invention has been made in view of such circumstances, and aims to achieve the following objects.

Specifically, the invention aims to provide a colored composition that can form a colored film in which elution of a dye during alkali development is suppressed, penetration of a dye is suppressed, heat diffusion (color transfer) of a dye due to heat treatment is suppressed, and formation of development residues is suppressed.

The invention also aims to provide an inkjet ink capable of forming colored pixels that exhibit excellent heat fastness and excellent discharge stability.

Further, the invention aims to provide a color filter in which penetration of a dye is suppressed, heat diffusion (color transfer) of a dye due to heat treatment is suppressed, and color mixing due to development residues is suppressed, the color filter exhibiting excellent heat fastness; a method of producing the color filter; a solid-state image sensor having the color filter; and a display device.

The present inventors have made studies on dipyrromethene dye compounds and, as a result, found that when a dye is made into a multimer having at least a specific molecular weight, problems such as penetration of a dye into a layer of a different color, elution of a dye during alkali development, heat diffusion (color transfer) due to heat treatment, and development residues remaining after the development can be suppressed.

Further, the present inventors have found that when a dye is adjusted so as to have a specific molecular weight distribution (dispersity), in addition to a specific molecular weight, problems such as penetration of a dye into a layer of a different color, elution of a dye during alkali development, heat diffusion (color transfer) due to heat treatment, and development residues remaining after the development can be remarkably suppressed.

Moreover, the inventors have found that similar effects can be achieved when the molecular weight and the dispersity of other types of dye compounds are adjusted to be within the same specific ranges.

Although JP-A No. 2008-292970 discloses a dye multimer (a polymer having a triphenylmethane dye in its molecule), the problems addressed by the invention are not mentioned. Accordingly, it is not possible to find a solution to these problems as mentioned above, from the teachings of JP-A No. 2008-292970.

The following are the specific embodiments for solving the problems addressed by the invention. However, the invention is not limited to these specific embodiments.

<1> A colored composition comprising a dye multimer having an alkali-soluble group as a dye, the dye multimer having a weight-average molecular weight (Mw) of from 5,000 to 20,000 and a dispersity (weight-average molecular weight (Mw)/number-average molecular weight (Mn)) of from 1.00 to 2.50.

<2> The colored composition according to <1>, further comprising a polymerizable compound, a polymerization initiator and a solvent.

<3> The colored composition according to <1> or <2>, wherein the dye multimer has an acid value of from 0.5 mmol/g to 3.0 mmol/g.

<4> The colored composition according to any one of <1> to <3>, wherein the dye multimer comprises at least one of structural units represented by following formula (A), formula (B) or formula (C), or is a dye multimer represented by following formula (D):

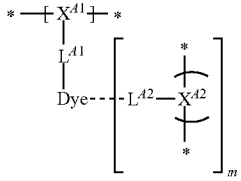

formula (A)

wherein, in the formula (A), $X^{A1}$ represents a linking group formed by polymerization; $L^{A1}$ represents a single bond or a divalent linking group; Dye represents a dye residue obtained by removing any one or more hydrogen atoms in a number of from 1 hydrogen atom to (1+m) hydrogen atoms from a dye compound; $X^{A2}$ represents a linking group formed by polymerization; $L^{A2}$ represents a single bond or a divalent linking group; m represents an integer from 0 to 3; and Dye and $L^{A2}$ may be linked to each other by any one of covalent bonding, ionic bonding or coordinate bonding;

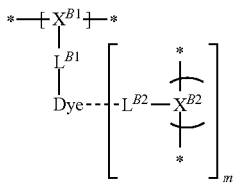

formula (B)

wherein, in the formula (B), $X^{B1}$ represents a linking group formed by polymerization; $L^{B1}$ represents a single bond or a divalent linking group; A represents a group capable of being bonded to Dye by ionic bonding or coordinate bonding; Dye represents a dye compound having a group capable of being bonded to A by ionic bonding or coordinate bonding, or a dye residue obtained by removing any one or more hydrogen atoms in a number of from 1 hydrogen atom to m hydrogen atoms from the dye compound; $X^{B2}$ represents a linking group formed by polymerization; $L^{B2}$ represents a single bond or a divalent linking group; m represents an integer from 0 to 3; and Dye and $L^{B2}$ may be linked to each other by any one of covalent bonding, ionic bonding or coordinate bonding;

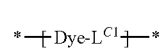

formula (C)

wherein, in the formula (C), $L^{C1}$ represents a single bond or a divalent linking group; and Dye represents a dye residue obtained by removing any two hydrogen atoms from a dye compound;

formula (D)

wherein, in the formula (D), $L^{D1}$ represents an m-valent linking group; m represents an integer from 2 to 100; and Dye represents a dye residue obtained by removing any one hydrogen atom from a dye compound.

<5> A color filter formed from the colored composition according to any one of <1> to <4>.

<6> An inkjet ink comprising the colored composition according to any one of <1> to <4>.

<7> A method of producing a color filter, the method comprising:
applying the colored composition according to any one of <1> to <4> onto a support to form a colored layer;
exposing the colored layer to light via a mask; and
developing the exposed colored layer to form a colored pattern.

<8> A method of producing a color filter, the method comprising:
providing a support having depressed portions defined by partitions; and
applying droplets of the inkjet ink according to <6> to the depressed portions by inkjetting, thereby forming colored pixels of the color filter.

<9> A solid-state image sensor comprising the color filter according to <5>.

<10> A display device comprising the color filter according to <5>.

EFFECT OF THE INVENTION

According to the invention, it is possible to provide a colored composition that can form a colored film in which elution of a dye during alkali development is suppressed, penetration of a dye is suppressed, heat diffusion (color transfer) of a dye due to heat treatment is suppressed, and formation of development residues is suppressed.

According to the invention, it is also possible to an inkjet ink capable of forming colored pixels that exhibit excellent heat fastness and excellent discharge stability.

Further, according to the invention, it is possible to provide a color filter in which penetration of a dye is suppressed, heat diffusion (color transfer) of a dye due to heat treatment is suppressed, and color mixing due to development residues is suppressed, the color filter exhibiting excellent heat fastness;

a method of producing the color filter; a solid-state image sensor having the color filter; and a display device.

DISCLOSURE OF THE INVENTION

In the following, details of the colored composition, the inkjet ink, the color filter and the method of producing the color filter, the solid-state image sensor and the display device according to the invention will be described with reference to representative exemplary embodiments of the invention. However, the invention is not limited to these embodiments.

<Colored Composition>

The colored composition of the present invention contains a dye multimer having an alkali-soluble group as a dye, the dye multimer having a weight-average molecular weight (Mw) of from 5,000 to 20,000 and a dispersity (weight-average molecular weight (Mw)/number-average molecular weight (Mn)) of from 1.00 to 2.50 (hereinafter, also referred to as a "specific dye multimer").

Hereinafter, the dispersity (weight-average molecular weight (Mw)/number-average molecular weight (Mn)) is also referred to as "dispersity (Mw/Mn)".

When the colored composition having the above-mentioned configuration is used for forming a colored film, dissolution of a dye during alkali development, infiltration of a dye, thermal diffusion (color transfer) of a dye due to heat treatment, and formation of development residues may be suppressed.

Further, the colored composition of the present invention is capable of forming a colored film having excellent robustness (heat resistance and light fastness) and excellent storage stability.

For these reasons, the colored composition of the present invention is suitable for the fabrication of a color filter by a photolithographic method or an ink-jet method.

From the viewpoint of effectively exerting the effect of the present invention, the colored composition is preferably a negative-type (negative-working) or positive-type (positive-working) colored photosensitive composition containing a specific dye multimer and a radiation-sensitive compound.

From the viewpoints of particularly effectively exerting the effect of the present invention, the colored composition is preferably a negative-type colored photosensitive composition (colored curable composition) containing a specific dye multimer, a polymerization initiator which is a radiation-sensitive compound, a polymerizable monomer, and a solvent.

Another form of the colored composition of the present invention may be, for example, an ink-jet ink containing a specific dye multimer, and at least one of a solvent and a polymerizable compound.

By using the ink-jet ink, colored pixels having excellent heat resistance may be formed, and ejection stability may be improved.

Hereinafter, the specific dye multimer is first described.

<Specific Dye Multimer>

The specific dye multimer used in the present invention is a dye multimer having a weight-average molecular weight (Mw) of from 5,000 to 20,000 and a dispersity (Mw/Mn) of from 1.00 to 2.50, and containing an alkali-soluble group.

By satisfying the above relationship, a colored film formed from the colored composition of the present invention may achieve improvements in terms of suppressed elution of a dye during alkali development, infiltration of a dye, thermal diffusion (color transfer) of a dye due to heat treatment, and formation of development residues.

If the weight-average molecular weight (Mw) is less than 5,000, it may adversely affect the thermal diffusion (color transfer) of a dye due to heat treatment, infiltration of a dye, resistance to alkali dissolution, and solvent resistance, when the colored composition is formed into a colored film.

If the weight-average molecular weight is higher than 20,000, it may particularly adversely affect the formation of development residues.

The weight-average molecular weight needs to be from 5,000 to 20,000, preferably from 5,000 to 16,000, and more preferably from 6,000 to 12,000.

Further, if the dispersity (Mw/Mn) is higher than 2.50, it may adversely affect the thermal diffusion (color transfer) of a dye due to heat treatment, infiltration of a dye, resistance to alkali dissolution, and solvent resistance, when the colored composition is formed into a colored film.

The dispersity (Mw/Mn) needs to be from 1.00 to 2.50, preferably from 1.00 to 2.20, and more preferably from 1.00 to 2.00.

The weight-average molecular weight and the molecular weight distribution represent the values measured by a gel permeation chromatography (GPC) method with a measurement device (HLC-8220GPC, trade name, development solvent: NMP, detection: RI, based on polystyrene-converted values, manufactured by Tosoh Corporation).

In the present invention, examples of a means for adjusting a weight-average molecular weight (Mw) of a dye multimer to the range of from 5,000 to 20,000 include a means for adjusting the amount of a polymerization initiator or the amount of a chain transfer agent, or a means for adjusting the reaction temperature, during the synthesis of the dye multimer.

Specifically, the amount of the polymerization initiator is preferably in the range of 2 mol % to 30 mol %, and more preferably 2 mol % to 20 mol %, with respect to the sum of a polymerizable dye monomer and a further polymerizable monomer.

Further, the amount of the chain transfer agent is preferably in the range of 1 mol % to 20 mol %, and more preferably 2 mol % to 15 mol %, with respect to the sum of a polymerizable dye monomer and a further polymerizable monomer.

Although the reaction temperature varies depending on the type of the polymerization initiator to be used, the reaction temperature is preferably adjusted to a temperature at which the polymerization initiator has a half-life being in the range of from 15 minutes to 120 minutes. For example, when V601 (trade name, manufactured by Wako Pure Chemical Industries, Ltd.) is used as a polymerization initiator, the reaction temperature is preferably in the range of from 60° C. to 90° C., and more preferably from 70° C. to 85° C.

Further, in the present invention, an example of a means for adjusting the dispersity (Mw/Mn) of the dye multimer to a range of from 1.00 to 2.50 may be a means for adjusting the dispersity by changing the type or the amount of a re-precipitation solvent.

Specifically, it is preferable to select a re-precipitation solvent in which a polymerizable dye monomer to be used is highly soluble. In addition, it is more preferable to select a solvent that exhibits a low solubility with respect to the dye multimer. Selection of a suitable solvent enables reduction in the residual ratio of the polymerizable dye monomer, and also enables selective elimination of dye multimers having a lower molecular weight in the molecular weight distribution of the dye multimer. Therefore, selecting a suitable solvent as mentioned above is particularly effective in terms of decreasing the dispersity of the dye multimer. Although it depends on the type of the polymerizable dye monomer, lower alcohols (for example, methanol, ethanol and isopropanol), acetonitrile and the like are preferably used. A combination of two or more solvents is also preferable.

Further, the amount of the re-precipitation solvent is preferably 1 to 100 times by mass, more preferably 2 to 50 times by mass the amount of a polymerization reaction solution of the dye multimer (or a solution of the dye multimer when re-precipitation is repeated).

Further, the polymerization reaction solution of the dye multimer (or a solution of the dye multimer when re-precipitation is repeated) is more preferably diluted with 0.1 to 1 time by mass the amount of the re-precipitation solvent. In this way, it is possible to effectively remove the polymerizable dye monomer and reduce the dispersity.

Further, repeating the process of re-precipitation is also preferable as a means for adjusting the dispersity. In this case, the re-precipitation may be repeated under the same conditions, or under different conditions.

The "dye multimer" in the present specification refers to a multimer having a dye skeleton whose maximum absorption wavelength is in the range of from 400 nm to 780 nm, and it is not particularly limited as long as the maximum absorption wavelength is in the above-specified range.

Examples of the dye skeleton preferably include monomethine, dimethine, trimethine, cyanine, merocyanine, dicyanostyryl, diphenylmethane, triphenylmethane, xanthene, squarylium, quinophthalone, monoazo, bisazo, disazo, trisazo, quinophthalone, anthraquinone, anthrapyridone, perylene, diketopyrrolopyrrole, isoindoline, phthalocyanine, azomethine, dioxazine and dipyrromethene dye skeletons, and metal complexes thereof.

In the present specification, the maximum absorption wavelength is a measured value of the absorption spectrum in an ethyl acetate solution (concentration: $1 \times 10^{-6}$ mol/L, optical path length: 10 mm), using a UV-Vis spectrophotometer (trade name: UV3100, manufactured by Shimadzu Corporation).

The dye multimer in accordance with the present invention has an alkali-soluble group.

Examples of the alkali-soluble group include a carboxyl group, a phosphono group and a sulfo group. Among them, a carboxyl group is preferable.

From the viewpoints of being suitably used in a photolithographic method (described later), an acid value of the specific dye multimer is preferably from 0.5 mmol/g to 3.0 mmol/g, more preferably from 0.6 mmol/g to 2.5 mmol/g, and particularly preferably from 0.7 mmol/g to 2.0 mmol/g.

Examples of the specific dye multimer in accordance with the present invention include a dimer, a trimer, an oligomer and a polymer.

The specific dye multimer in accordance with the present invention may be synthesized, for example, by any one of the following Method (1) to Method (4), or other methods. However, the present invention is not limited to this description.

Method (1) Method of Synthesizing Polymerizable Dye Monomer by Homopolymerization Reaction This method may be a method of synthesizing a polymerizable dye monomer having an alkali-soluble group by way of homopolymerization reaction; or may be a method of synthesizing the same by introducing, by way of polymer reaction, an alkali-soluble group into a dye multimer that has been synthesized by homopolymerization reaction of a polymerizable dye monomer (that may have an alkali-soluble group or may not).

Method (2) Method of Synthesizing Polymerizable Dye Monomer by Copolymerization of at Least One Polymerizable Dye Monomer with a Further Polymerizable Monomer (Comonomer)

This method may be a method of using a polymerizable dye monomer and at least one kind of a monomer having an alkali-soluble group, or may be a method of introducing, by way of polymer reaction, an alkali-soluble group into a dye multimer that has been synthesized by copolymerization reaction of at least one kind of polymerizable dye monomer and at least one kind of other polymerizable monomer (comonomer).

Method (3) Method of Synthesizing Polymerizable Dye Monomer by Introducing Dye Structure (Dye Residue) into Polymer Compound by Polymer Reaction This method may be a method of introducing, by way of polymer reaction, a dye structure (dye residue) into a polymer compound having an alkali-soluble group, or a method of introducing, by way of polymer reaction, a dye structure (dye residue) into a polymer compound (that may have an alkali-soluble group or may not).

Method (4) Method of Linking Two or More Dye Structures (Dye Residues) with Each Other Via Linking Chain This method may be a method of linking two or more dye structures (dye residues) with each other via a linking chain having an alkali-soluble group; a method of linking two or more dye structures (dye residues) and a structural unit having an alkali-soluble group with each other via a linking chain; or may be a method of linking two or more dye structures (dye residues) with each other via a linking chain and then introducing an alkali-soluble group to the resulting compound.

The specific dye multimer in accordance with the present invention is preferably an oligomer or a polymer, and more preferably an oligomer or polymer obtained by Method (1) or Method (2).

When a dye multimer used in the present invention is synthesized via copolymerization reaction (Method (2)), the comonomer is not particularly limited as long as it is copolymerizable with a polymerizable dye monomer.

Examples of the comonomer include a styrene compound, a carboxylic acid monomer, an ester, amide, an imide or anhydride thereof, and a vinyl compound.

Examples of the styrene compound include styrene, α-methylstyrene, hydroxystyrene, p-chloromethylstyrene, and m-chloromethylstyrene.

Examples of the α,β-unsaturated carboxylic acid include acrylic acid, methacrylic acid, maleic acid, fumaric acid, itaconic acid, citraconic acid, mesaconic acid, and 1-butyne-2,3,4-tricarboxylic acid.

Examples of the ester of unsaturated carboxylic acid include methyl ester, ethyl ester, 2-hydroxyethyl ester, propyl ester, butyl ester, octyl ester, dodecyl ester, 2,2,6,6-tetramethyl-4-piperidyl ester, 1,2,2,6,6-pentamethyl-4-piperidyl ester and 2-[3-(2-benzotriazolyl)-4-hydroxyphenyl]ethyl ester of α,β-unsaturated carboxylic acid.

Examples of the amide of unsaturated carboxylic acid include methylamide, dimethylamide, ethylamide, diethylamide, propylamide, dipropylamide, butylamide, dibutylamide, hexylamide, octylamide and phenylamide of α,β-unsaturated carboxylic acid.

Examples of the imide of unsaturated carboxylic acid include maleimide, itaconic imide, N-butylmaleimide, N-octylmaleimide, and N-phenylmaleimide.

Examples of the vinyl compound include vinyl acetate, N-vinylcarbazole and N-vinylpyrrolidone.

Although the copolymerization ratio of the polymerizable dye monomer with respect to the comonomer varies depending on the type of the polymerizable dye monomer, the amount of the comonomer with respect to 100 g of the polymerizable dye monomer is preferably from 5 g to 10,000 g, more preferably from 5 g to 1,000 g, and particularly preferably from 5 g to 100 g.

The "dye multimer having an alkali-soluble group" used in the present invention is preferably a dye multimer having an alkali-soluble group, which dye multimer has at least one of structural units represented by the following formula (A), formula (B) and formula (C), or a dye multimer having an alkali-soluble group and is represented by formula (D).

(Structural Unit Represented by Formula (A))

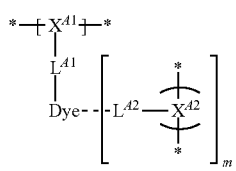

formula (A)

wherein, in the formula (A), $X^{A1}$ represents a linking group formed by polymerization; $L^{A1}$ represents a single bond or a divalent linking group; Dye represents a dye residue obtained by removing any one or more hydrogen atoms in a number of from 1 hydrogen atom to (1+m) hydrogen atoms from a dye compound; $X^{A2}$ represents a linking group formed by polymerization; $L^{A2}$ represents a single bond or a divalent linking group; m represents an integer from 0 to 3; and Dye and $L^{A2}$ may be linked to each other by any one of covalent bonding, ionic bonding or coordinate bonding;

In formula (A), each of $X^{A1}$ and $X^{A2}$ independently represents a linking group formed by polymerization, i.e., a portion that forms a repeating unit corresponding to a main chain formed by polymerization reaction. The portion indicated by two symbols * is the repeating unit.

Examples of $X^{A1}$ and $X^{A2}$ each independently include a linking group formed by polymerization of a substituted or unsubstituted unsaturated ethylene group, and a linking group formed by ring-opening polymerization of a cyclic ether, and a linking group formed by polymerization of an unsaturated ethylene group is preferable. Specific examples of the linking group include the following groups, but the linking group formed by polymerization in accordance with the present invention is not limited thereto.

In (X-1) to (X-15), * represents a portion to be linked to $L^{A1}$ or $L^{A2}$.

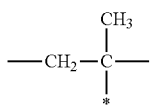
(X-1)

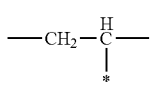
(X-2)

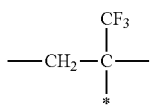
(X-3)

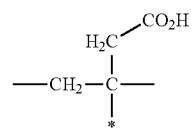
(X-4)

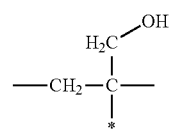
(X-5)

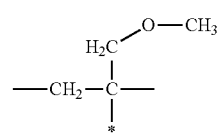
(X-6)

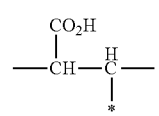
(X-7)

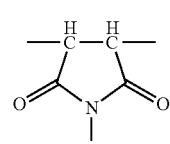
(X-8)

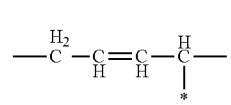
(X-9)

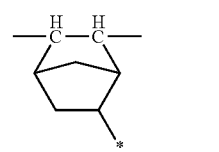
(X-10)

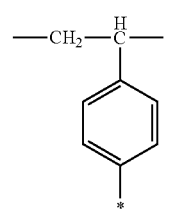
(X-11)

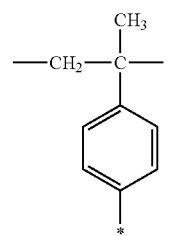
(X-12)

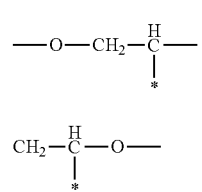
(X-13)

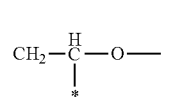
(X-14)

(X-15)

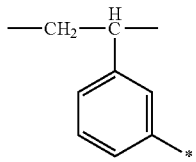

In the formula (A), $L^{A1}$ and $L^{A2}$ each independently represents a single bond or a divalent linking group. Examples of $L^{A1}$ and $L^{A2}$ each independently include a substituted or unsubstituted, linear, branched or cyclic alkylene group having 1 to 30 carbon atoms (for example, a methylene group, an ethylene group, a trimethylene group, a propylene group or a butylene group), a substituted or unsubstituted arylene group having 6 to 30 carbon atoms (for example, a phenylene group or a naphthalene group), a substituted or unsubstituted heterocyclic linking group, —CH$_2$=CH$_2$—, —O—, —S—, —NR—, —C(=O)—, —SO—, —SO$_2$—, a linking group represented by the following formula (2), a linking group represented by the following formula (3), a linking group represented by the following formula (4), or a linking group formed by connecting two or more of these groups (for example, —N(R)C(=O)—, —OC(=O)—, —C(=O)N(R)— or —C(=O)O—). R represents a hydrogen atom, an alkyl group, an aryl group or a heterocyclic group.

The divalent linking group of the present invention is not particularly limited, as long as the effect of the present invention can be exerted.

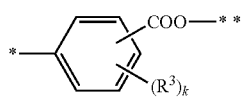
formula (2)

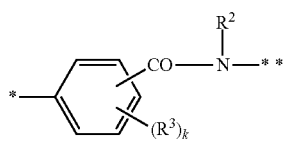
formula (3)

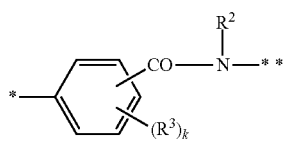
formula (4)

In the formulae (2) to (4), $R^2$ represents a hydrogen atom, an alkyl group, an aryl group or a heterocyclic group. $R^3$ represents a hydrogen atom or a substituent. k represents an integer from 0 to 4. In the formula (2) to formula (4), * represents a site to be bonded to a —C($R^1$)=CH$_2$ group in formula (1), and ** represents a site to be bonded to $L^2$ or Dye (when n=0) in the formula (1).

In the formula (A), m represents an integer from 0 to 3. When m represents 2 or greater, the two or more of $X^{A2}$ may be the same or different from each other. Similarly, when m represents 2 or more, the two or more of $L^{A2}$ may be the same or different from each other.

m preferably represents an integer from 0 to 2, more preferably 0 or 1, and particularly preferably 0.

In the formula (A), Dye represents a dye residue obtained by removing any one or more hydrogen atoms, in a number of from 1 hydrogen atom to (1+m) hydrogen atoms, from a dye compound.

Dye preferably represents a dye residue obtained by removing one or more hydrogen atoms, in a number of from 1 hydrogen atom to (1+m) hydrogen atoms, from any dye compound selected from the group consisting of a monomethine dye, a dimethine dye, a trimethine dye, a cyanine dye, a merocyanine dye, a dicyanostyryl dye, a diphenyl methane dye, a triphenyl methane dye, a xanthene dye, a squarylium dye, a quinophthalone dye, a monoazo dye, a bisazo dye, a disazo dye, a trisazo dye, a quinophthalone dye, an anthraquinone dye, an anthrapyridone dye, a perylene dye, a diketopyrrolopyrrole dye, an isoindoline dye, a phthalocyanine dye, an azomethine dye, a dioxazine dye and a dipyrromethene dye.

In the formula (A), Dye and $L^{A2}$ may be connected via any one of covalent bonding, ionic bonding or coordinate bonding, but are preferably connected via ionic bonding or coordinate bonding.

(Structural Unit Represented by Formula (B))

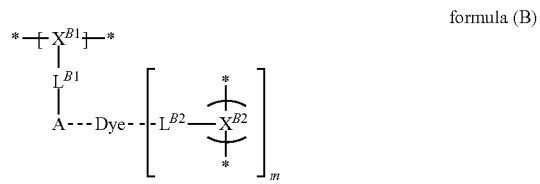
formula (B)

In the formula (B), $X^{B1}$ represents a linking group formed by polymerization; $L^{B1}$ represents a single bond or a divalent linking group; A represents a group capable of being bonded to Dye by ionic bonding or coordinate bonding; Dye represents a dye compound having a group capable of being bonded to A by ionic bonding or coordinate bonding, or a dye residue obtained by removing any one or more hydrogen atoms in a number of from 1 hydrogen atom to m hydrogen atoms from the dye compound; $X^{B2}$ represents a linking group formed by polymerization; $L^{B2}$ represents a single bond or a divalent linking group; m represents an integer from 0 to 3; and Dye and $L^{B2}$ may be linked to each other by any one of covalent bonding, ionic bonding or coordinate bonding;

$X^{B1}$, $L^{B1}$ and m in the formula (B) have the same definitions as $X^{A1}$, $L^{A1}$ and m in formula (A), respectively, and preferable ranges are also the same.

$X^{B2}$ and $L^{B2}$ in the formula (B) have the same definitions as $X^{A2}$ and $L^{A2}$ in formula (A), respectively, and preferable ranges are also the same.

The group represented by A in the formula (B) may be any group as long as it can be bonded to Dye by ionic bonding or coordinate bonding, and the group capable of ionic bonding may be either an anionic group or a cationic group. The anionic group is preferably an anionic group having a pKa of 12 or less, more preferably a pKa of 7 or less, and still more preferably a pKa of 5 or less, such as a carboxyl group, a phospho group, a sulfo group, an acylsulfonamido group, or a sulfonimido group. The anionic group may be bonded to Ma or a heterocyclic group in Dye by ionic bonding or coordinate bonding, and more preferably with Ma by ionic bonding. Preferable specific examples of the anionic group are given below, but the present invention is not limited thereto. In the following specific examples, R represents a hydrogen atom, an alkyl group, an aryl group or a heterocyclic group.

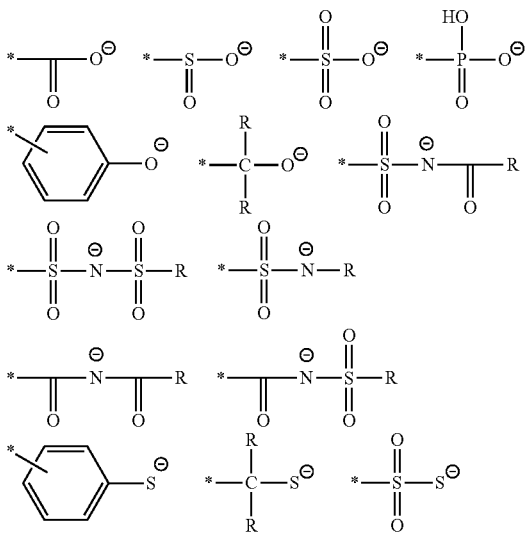

The cationic group represented by A in the formula (B) is preferably a substituted or unsubstituted onium cation (for example, a substituted or unsubstituted ammonium group, a pyridinium group, an imidazolium group, a sulfonium group or a phosphonium group), particularly preferably a substituted ammonium group.

In the formula (B), m represents an integer from 0 to 3. When m represents 2 or greater, the two or more of $X^{B2}$ may be the same or different from each other. Similarly, when m represents 2 or greater, the two or more of $L^{B2}$ may be the same or different from each other.

m preferably represents an integer from 0 to 2, more preferably 0 or 1, and particularly preferably 0.

Dye in the formula (B) represents a dye compound, or a dye residue obtained by removing any one or more hydrogen atoms, in a number of from 1 hydrogen atom to m hydrogen atoms, from the dye compound. Examples of the dye compound include the dye compounds as described in the section concerning Dye in the formula (A).

In the formula (B), Dye and $L^{B2}$ may be bonded to each other by any one of covalent bonding, ionic bonding or coordinate bonding, by ionic bonding or coordinate bonding.

(Structural Unit Represented by Formula (C))

 formula (C)

wherein, in the formula (C), $L^{C1}$ represents a single bond or a divalent linking group; and Dye represents a dye residue obtained by removing any two hydrogen atoms from a dye compound.

In the formula (C), Dye represents a divalent dye residue.

Dye is preferably a dye residue obtained by removing two hydrogen atoms from a dye compound selected from the group consisting of a monomethine dye, a dimethine dye, a trimethine dye, a cyanine dye, a merocyanine dye, a dicyanostyryl dye, a diphenyl methane dye, a triphenyl methane dye, a xanthene dye, a squarylium dye, a quinophthalone dye, a monoazo dye, a bisazo dye, a disazo dye, a trisazo dye, a quinophthalone dye, an anthraquinone dye, an anthrapyridone dye, a perylene dye, a diketopyrrolopyrrole dye, an isoindoline dye, a phthalocyanine dye, an azomethine dye, a dioxazine dye, and a dipyrromethene dye.

$L^{C1}$ in the formula (C) has the same definitions as $L^{A1}$ in formula (A), and preferable ranges are also the same.

(Copolymerization Components)

The dye multimer of the present invention may be formed only of structural units represented by formula (A), formula (B) or formula (C) (in this case, the structural units represented by formula (A), formula (B) or formula (C) contains an alkali-soluble group therein), or may be formed of at least one of the structural units represented by formula (A), formula (B) and formula (C), and a further structural unit (in this case, either or both of the at least one of the structural units represented by the formula (A), formula (B) and formula (C) and the further structural unit contain an alkali-soluble group).

The structural unit other than the structural unit represented by formula (A), formula (B) or formula (C) is preferably a structural unit having an alkali-soluble group (such as a carboxyl group, a phosphono group or a sulfo group) in a side chain thereof.

The following are specific examples of the structural unit other than the structural unit represented by formula (A), formula (B) or formula (C), but the present invention is not limited thereto.

(H-1)

(H-2)

(H-3)

(H-4)

(H-5)

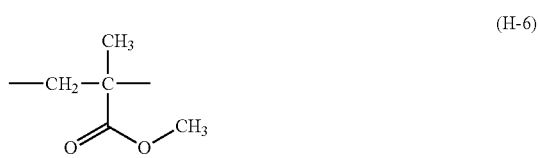
(H-6)

(H-7)

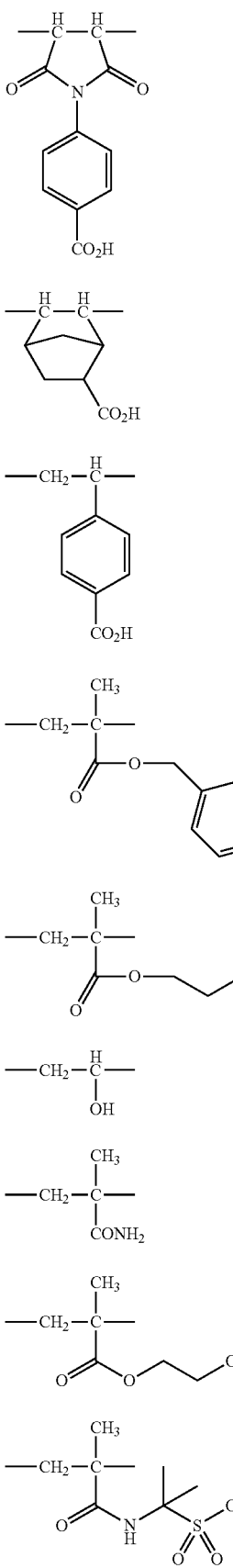
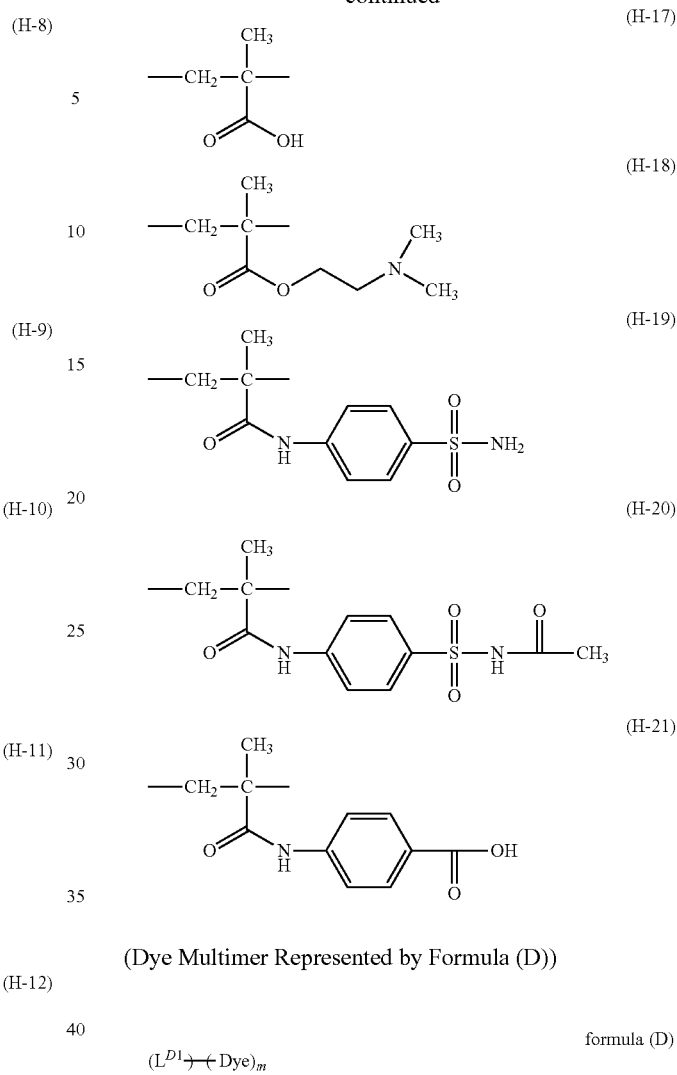

(Dye Multimer Represented by Formula (D))

$$(L^{D1})\!-\!(Dye)_m \qquad \text{formula (D)}$$

In the formula (D), $L^{D1}$ represents an m-valent linking group; m represents an integer from 2 to 100; and Dye represents a dye residue obtained by removing any one hydrogen atom from a dye compound.

m preferably represents 2 to 80, more preferably 2 to 40, and particularly preferably 2 to 10.

When m represents 2, examples of the divalent linking group represented by $L^{D1}$ preferably include a substituted or unsubstituted, linear, branched or cyclic alkylene group having 1 to 30 carbon atoms (for example, a methylene group, an ethylene group, a trimethylene group, a propylene group or a butylene group), a substituted or unsubstituted arylene group having 6 to 30 carbon atoms (for example, a phenylene group or a naphthalene group), a substituted or unsubstituted heterocyclic linking group, —CH$_2$═CH$_2$—, —O—, —S—, —NR—, —C(═O)—, —SO—, —SO$_2$—, and a linking group formed by connecting two or more of these groups (for example, —N(R)C(═O)—, —OC(═O)—, —C(═O)N(R)—, —C(═O)O— or —N(R)C(═O)N(R)—). R represents a hydrogen atom, an alkyl group, an aryl group or a heterocyclic group.

Examples of the m-valent linking group, in which m is 3 or greater, include linking groups having a substituted or unsubstituted arylene group (for example, a 1,3,5-phenylene group, a 1,2,4-phenylene group or a 1,4,5,8-naphthalene group), a heterocyclic linking group (for example, a 1,3,5-triazine group), an alkylene linking group or the like as the center mother nucleus and are formed by substituting with the above-mentioned divalent linking group.

Dye in the formula (D) has the same definitions as that of Dye in formula (A), except that Dye in the formula (D) is limited to a monovalent residue.

(Dye Monomer Represented by Formula (1))

The specific dye monomer in accordance with the present invention is obtained by polymerization of a dye monomer represented by the following formula (1). It is also preferable that the dye monomer have an alkali-soluble group.

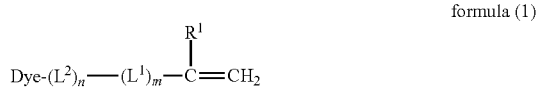

formula (1)

In formula (1), $R^1$ represents a hydrogen atom, a halogen atom, an alkyl group or an aryl group. $L^1$ represents —N($R^2$)C(=O)—, —OC(=O)—, —C(=O)N($R^2$)—, —C(=O)O—, a group represented by the following formula (2), a group represented by the following formula (3), or a group represented by the following formula (4). $L^2$ represents a divalent linking group. m and n each independently represents 0 or 1. Dye represents a dye residue. $R^2$ represents a hydrogen atom, an alkyl group, an aryl group or a heterocyclic group.

Dye in the formula (1) has the same definitions as that of Dye in formula (A), and preferable ranges are also the same.

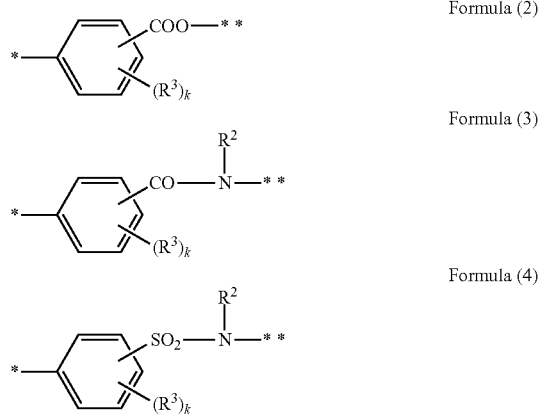

In the formula (2) to formula (4), $R^2$ represents a hydrogen atom, an alkyl group, an aryl group or a heterocyclic group. $R^3$ represents a hydrogen atom or a substituent. k represents an integer from 0 to 4. In the formula (2) to formula (4), * represents a site to be bonded to a —C($R^1$)=CH$_2$ group in formula (1), and ** represents a site to be bonded to $L^2$ or Dye (when n=0) in the formula (1).

That is, the dye monomer represented by formula (1) is a compound obtained by introducing a polymerizable group represented by -($L^2$)$_n$-($L^1$)$_m$-C($R^1$)=CH$_2$ into a dye compound.

Further, when m and n are 0, —C($R^1$)=CH$_2$ is directly introduced into the dye compound.

In formula (1), $R^1$ represents a hydrogen atom, a halogen atom, an alkyl group or an aryl group. When $R^1$ represents an alkyl group or an aryl group, $R^1$ may be substituted or unsubstituted.

When $R^1$ represents an alkyl group, it is preferably a substituted or unsubstituted, linear, branched or cyclic alkyl group, more preferably having 1 to 36 carbon atoms, and even more preferably having 1 to 6 carbon atoms. Examples of the alkyl group include a methyl group, an ethyl group, a propyl group, a butyl group, an octyl group, an isopropyl group and a cyclohexyl group.

When $R^1$ represents an aryl group, it is preferably a substituted or unsubstituted aryl group, more preferably having 6 to 18 carbon atoms, even more preferably 6 to 14, and still more preferably having 6 to 12 carbon atoms. Examples of the aryl group include a phenyl group and a naphthyl group.

When $R^1$ represents a substituted alkyl group or a substituted aryl group, examples of the substituent include a halogen atom (for example, fluorine, chlorine, bromine or iodine), an alkyl group (an alkyl group preferably having 1 to 24 carbon atoms, and more preferably having 1 to 12 carbon atoms, for example, methyl, ethyl, propyl, butyl, isopropyl, t-butyl, 2-ethylhexyl, dodecyl, cyclopropyl, cyclopentyl, cyclohexyl or adamantyl), an aryl group (an aryl group preferably having 6 to 24 carbon atoms, and more preferably having 6 to 12 carbon atoms, for example, phenyl or naphthyl), a heterocyclic group (a heterocyclic group preferably having 1 to 24 carbon atoms, and more preferably having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl or benzotriazol-1-yl), a silyl group (a silyl group preferably having 3 to 24 carbon atoms, and more preferably having 3 to 12 carbon atoms, for example, trimethylsilyl, triethylsilyl, tributylsilyl, t-butyldimethylsilyl or t-hexyldimethylsilyl), a hydroxyl group, a cyano group, a nitro group, a sulfonic acid group, a phosphonic acid group, a carboxyl group, an alkoxy group (an alkoxy group preferably having 1 to 24 carbon atoms, more preferably having 1 to 12 carbon atoms, and still more preferably having 1 to 6 carbon atoms, for example, a methoxy group, an ethoxy group, a 1-butoxy group, a 2-butoxy group, an isopropoxy group, a t-butoxy group, a dodecyloxy group or a cycloalkyloxy group, for example, cyclopentyloxy or cyclohexyloxy), an aryloxy group (an aryloxy group preferably having 6 to 24 carbon atoms, and more preferably having 6 to 12 carbon atoms, for example, phenoxy or 1-naphthoxy), a heterocyclic oxy group (a heterocyclic oxy group preferably having 1 to 24 carbon atoms, and more preferably having 1 to 12 carbon atoms, for example, 1-phenyltetrazol-5-oxy or 2-tetrahydropyranyloxy), a silyloxy group (a silyloxy group preferably having 1 to 24 carbon atoms, and more preferably having 1 to 12 carbon atoms, for example, trimethylsilyloxy, t-butyldimethylsilyloxy or diphenylmethylsilyloxy), an acyloxy group (an acyloxy group preferably having 2 to 24 carbon atoms, and more preferably having 2 to 12 carbon atoms, for example, acetoxy, pivaloyloxy, benzoyloxy or dodecanoyloxy), an alkoxycarbonyloxy group (an alkoxycarbonyloxy group preferably having 2 to 24 carbon atoms, more preferably having 2 to 12 carbon atoms, and still more preferably having 2 to 6 carbon atoms, for example, ethoxycarbonyloxy or t-butoxycarbonyloxy), a cycloalkyloxycarbonyloxy group (for example, cyclohexyloxycarbonyloxy), an aryloxycarbonyloxy group (an aryloxycarbonyloxy group preferably having 7 to 24 carbon atoms, and more preferably having 7 to 12 carbon atoms, for example, phenoxycarbonyloxy), a carbamoyloxy group (a carbamoyloxy group preferably having 1 to 24 carbon atoms, more preferably having 1 to 12 carbon atoms, and still more preferably having 1 to 6 carbon atoms, for example, N,N-dimethylcarbamoyloxy, N-butylcarbamoyloxy, N-phenylcarbamoyloxy or N-ethyl-N-phenylcarbamoyloxy), a sulfamoyloxy group (a sulfamoyloxy group preferably having 1 to 24 carbon atoms, more preferably having 1 to 12 carbon atoms, and still more preferably having 1 to 6 carbon atoms, for example, N,N-diethylsulfamoyloxy or N-propylsulfamoyloxy), an alkylsulfonyloxy group (an alkylsulfonyloxy group preferably having 1 to 24 carbon atoms, more preferably having 1 to 12 carbon atoms, and still more preferably having 1 to 6 carbon atoms, for example, methylsulfonyloxy, hexadecylsulfonyloxy or cyclohexylsulfonyloxy), an arylsulfonyloxy group (an arylsulfonyloxy group preferably having 6 to 24 carbon atoms, and more preferably having 6 to 12 carbon atoms, for example, phenylsulfonyloxy), an acyl group (an acyl group preferably having 1 to 24 carbon atoms, and more preferably having 1 to 12 carbon atoms, for example, formyl, acetyl, pivaloyl, benzoyl, tetradecanoyl or cyclohexanoyl), an alkoxycarbonyl group (an alkoxycarbonyl group preferably having 2 to 24 carbon atoms, more preferably having 2 to 12 carbon atoms, and still more preferably having 2 to 6 carbon atoms, for example, methoxycarbonyl, ethoxycarbonyl, octadecyloxycarbonyl or cyclohexyloxycarbonyl), an aryloxycarbonyl group (an aryloxycarbonyl group preferably having 7 to 24 carbon atoms, and more preferably having 7 to 12 carbon atoms, for example, phenoxycarbonyl), a carbamoyl group (a carbamoyl group preferably having 1 to 24 carbon atoms, and more preferably having 1 to 12 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl or N,N-dicyclohexylcarbamoyl), an amino group (an amino group preferably having 24 or less carbon atoms, and more preferably having 12 or less carbon atoms, for example, amino, methylamino, N,N-dibutylamino, tetradecylamino, 2-ethylhexylamino or cyclohexylamino), an anilino group (an anilino group preferably having 6 to 24 carbon atoms, and more preferably having 6 to 12 carbon atoms, for example, anilino or N-methylanilino), a heterocyclic amino group (a heterocyclic amino group preferably having 1 to 24 carbon atoms, and more preferably having 1 to 12 carbon atoms, for example, 4-pyridylamino), a carbonamido group (a carbonamido group preferably having 2 to 24 carbon atoms, and more preferably having 2 to 12 carbon atoms, for example, acetamido, benzamido, tetradecaneamido, pivaloylamido or cyclohexaneamido), an ureido group (an ureido group preferably having 1 to 24 carbon atoms, and more preferably having 1 to 12 carbon atoms, for example, ureido, N,N-dimethylureido or N-phenylureido), an imido group (an imido group preferably having 20 or less carbon atoms, and more preferably having 12 or less carbon atoms, for example, N-succinimido or N-phthalimido), an alkoxycarbonylamino group (an alkoxycarbonylamino group preferably having 2 to 24 carbon atoms, and more preferably having 2 to 12 carbon atoms, for example, methoxycarbonylamino, ethoxycarbonylamino, t-butoxycarbonylamino, octadecyloxycarbonylamino or cyclohexyloxycarbonylamino), an aryloxycarbonylamino group (an aryloxycarbonylamino group preferably having 7 to 24 carbon atoms, and more preferably having 7 to 12 carbon atoms, for example, phenoxycarbonylamino), a sulfonamido group (a sulfonamido group preferably having 1 to 24 carbon atoms, and more preferably having 1 to 12 carbon atoms, for example, methane sulfonamido, butane sulfonamido, benzene sulfonamido, hexadecane sulfonamido or cyclohexane sulfonamido), a sulfamoylamino group (a sulfamoylamino group preferably having 1 to 24 carbon atoms, and more preferably having 1 to 12 carbon atoms, for example, N,N-dipropylsulfamoylamino or N-ethyl-N-dodecylsulfamoylamino), an azo group (an azo group preferably having 1 to 24 carbon atoms, and more preferably having 1 to 12 carbon atoms, for example, phenylazo or 3-pyrazolylazo), an alkylthio group (an alkylthio group preferably having 1 to 24 carbon atoms, and more preferably having 1 to 12 carbon atoms, for example, methylthio, ethylthio, octylthio or cyclohexylthio), an arylthio group (an arylthio group preferably having 6 to 24 carbon atoms, and more preferably having 6 to 12 carbon atoms, for example, phenylthio), a heterocyclic thio group (a heterocyclic thio group preferably having 1 to 24 carbon atoms, and more preferably having 1 to 12 carbon atoms, for example, 2-benzothiazolylthio, 2-pyridylthio or 1-phenyltetrazolylthio), an alkylsulfinyl group (an alkylsulfinyl group preferably having 1 to 24 carbon atoms, and more preferably having 1 to 12 carbon atoms, for example, dodecanesulfinyl), an arylsulfinyl group (an arylsulfinyl group preferably having 6 to 24 carbon atoms, and more preferably having 6 to 12 carbon atoms, for example, phenylsulfinyl), an alkylsulfonyl group (an alkylsulfonyl group preferably having 1 to 24 carbon atoms, and more preferably having 1 to 12 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl or cyclohexylsulfonyl), an arylsulfonyl group (an arylsulfonyl group preferably having 6 to 24 carbon atoms, and more preferably having 6 to 12 carbon atoms, for example, phenylsulfonyl or 1-naphthylsulfonyl), a sulfamoyl group (a sulfamoyl group preferably having 24 or less carbon atoms, and more preferably having 16 or less carbon atoms, for example, sulfamoyl, N,N-dipropylsulfamoyl, N-ethyl-N-dodecylsulfamoyl, N-ethyl-N-phenylsulfamoyl or N-cyclohexylsulfamoyl), a sulfo group, a phosphonyl group (a phosphonyl group preferably having 1 to 24 carbon atoms, and more preferably having 1 to 12 carbon atoms, for example, phenoxyphosphonyl, octyloxyphosphonyl or phenylphosphonyl), and a phosphinoylamino group (a phosphinoylamino group preferably having 1 to 24 carbon atoms, and more preferably having 1 to 12 carbon atoms, for example, diethoxyphosphinoylamino or dioctyloxyphosphinoylamino).

Among the above-mentioned substituents, a halogen atom, an alkyl group, an aryl group, a hydroxyl group, a sulfonic acid group, a phosphonic acid group, a carboxylic acid group, an alkoxy group, an aryloxy group, an alkoxycarbonyloxy group, a cycloalkylcarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamido group, an imido group, a sulfonamido group, a sulfamoylamino group and a sulfamoyl group are preferable; an alkyl group, an aryl group, a hydroxyl group, a sulfonic acid group, a phosphonic acid group, a carboxylic acid group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, an aryloxycarbonyl group, a carbamoyl group, a carbonamido group, a sulfonamido group, a sulfamoylamino group, and a sulfamoyl group are more preferable; a hydroxyl group, a sulfonic acid group, a phosphonic acid group, a carboxylic acid group, an alkoxy group, an aryloxy group, an alkoxycarbonyloxy group, an aryloxycarbonyloxy group, a carbamoyloxy group, a sulfamoyloxy group, an alkylsulfonyloxy group, an arylsulfonyloxy group, an acyl group, an alkoxycarbonyl group, and an aryloxycarbonyl group are still more preferable; and a hydroxyl group, a sulfonic acid group, a carboxylic acid group, an alkoxy group, an alkoxycarbonyloxy group, a carbamoyloxy group, a sulfamoyloxy group, an alkylsulfonyloxy group, an acyl group, and an alkoxycarbonyl group are particularly preferable.

Among the above-mentioned particularly preferable substituents, a sulfonic acid group, a carboxylic acid group, an alkoxy group, an alkoxycarbonyloxy group, an alkylsulfonyloxy group, and an alkoxycarbonyl group are more preferable; a sulfonic acid group, a carboxylic acid group, an alkoxy group, and an alkoxycarbonyl group are still more preferable; and a sulfonic acid group, a carboxylic acid group, and an alkoxy group are particularly preferable.

In formula (1), $R^1$ preferably represents a hydrogen atom, an alkyl group or an aryl group, particularly preferably a hydrogen atom or an alkyl group.

In formula (1), when the substituent of the substituted alkyl group and the substituted aryl group represented by $R^1$ is a group which may be further substituted, the substitutable group may be substituted by one or more substituents as mentioned above, which may be the same or different.

In formula (1), $L^1$ represents —N($R^2$)C(=O)—, —OC(=O)—, —C(=O)N($R^2$)—, —C(=O)O—, a group represented by the following formula (2), a group represented by the following formula (3) or a group represented by the following formula (4). In these formulae, $R^2$ represents a hydrogen atom, an alkyl group, an aryl group or a heterocyclic group.

In the formula (1), examples of the alkyl group, the aryl group and the heterocyclic group represented by $R^2$ include the alkyl group, the aryl group and the heterocyclic group described above as the substituent of the substituted alkyl group and the substituted aryl group represented by $R^1$, and preferable embodiments thereof are also the same.

The alkyl group, the aryl group and the heterocyclic group represented by $R^2$ may be substituted by the substituent described above in the section regarding the substituent represented by $R^1$, and when these groups are substituted by two or more substituents, these substituents may be the same or different from each other.

Hereinafter, a group represented by the following formula (2), a group represented by the following formula (3), and a group represented by the following formula (4), each of which being represented by $L^1$ in the formula (1), will be described.

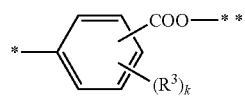

formula (2)

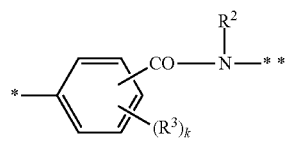

formula (3)

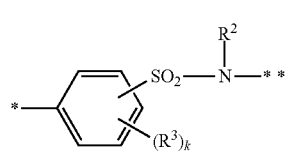

formula (4)

Here, $R^2$ represents a hydrogen atom, an alkyl group, an aryl group or a heterocyclic group, $R^3$ represents a hydrogen atom or a substituent, and k represents an integer from 0 to 4. * represents a site to be bonded to —C($R^1$)=CH$_2$ in the formula (1), and ** represents a site to be bonded to $L^2$ or Dye (when n=0) in the formula (1).

$R^2$ has the same definitions as that of $R^2$ in the formula (1), and preferable embodiments are also the same.

$R^3$ represents a hydrogen atom or a substituent. Examples of the substituent represented by $R^3$ include the substituents described above for the substituted alkyl group and the substituted aryl group represented by $R^1$, and preferable embodiments are also the same. k represents 0, 1, 2, 3 or 4. When k represents 2, 3 or 4, $R^3$ may be the same or different from each other.

When the substituent represented by $R^3$ is a group which may be further substituted, the substituent represented by $R^3$ may be substituted by one or more substituents described as the substituents of $R^1$, and when the substituent represented by $R^3$ is substituted by two or more substituents, these substituents may be the same or different from each other.

From the viewpoints of synthesis, $L^1$ preferably represents —N($R^2$)C(=O)—, —OC(=O)—, —C(=O)N($R^2$)— or —C(=O)O—, more preferably —OC(=O)—, —C(=O)N($R^2$)— or —C(=O)O—, and still more preferably —C(=O)N($R^2$)— or —C(=O)O—.

Hereinafter, $L^2$ in the formula (1) will be described.

$L^2$ represents a divalent linking group which connects $L^1$ or —C($R^1$)=CH$_2$ (when m=0) with Dye.

Examples of $L^2$ preferably include an alkylene group, an aralkylene group, an arylene group, —O—, —C(=O)—, —OC(=O)—, —OC(=O)O—, —OSO$_2$—, —OC(=O)N($R^{50}$)—, —N($R^{50}$)—, —N($R^{50}$)C(=O)—, —N($R^{50}$)C(=O)O—, —N($R^{50}$)C(=O)N($R^{51}$)—, —N($R^{50}$)SO$_2$—, —N($R^{50}$)SO$_2$N($R^{51}$)—, —S—, —S—S—, —SO—, —SO$_2$—, —SO$_2$N($R^{50}$)—, and —SO$_2$O—. Two or more of these divalent linking groups may be connected to form a divalent linking group.

Each of $R^{50}$ and $R^{51}$ independently represents a hydrogen atom, an alkyl group, an aryl group or a heterocyclic group. The alkyl group, the aryl group and the heterocyclic group represented by $R^{50}$ and $R^{51}$ include the alkyl group, the aryl group and the heterocyclic group described as the substituent represented by $R^1$, and preferable embodiments are also the same. The alkyl group, the aryl group and the heterocyclic group of $R^{50}$ and $R^{51}$ may be substituted with the substituent(s) described in the substituent of $R^1$ and when substituted with two or more substituents, those substituents may be the same as or different from every other substituent.

When $L^2$ represents an alkylene group, an aralkylene group or an arylene group, these groups substituted or unsubstituted. When these groups are substituted, the substituent may be those described as the substituents for $R^1$. When the group represented by $L^2$ is substituted by two or more substituents, these substituents may be the same or different from each other.

When $L^2$ represents an alkylene group, an aralkylene group or an arylene group, an alkylene group having 1 to 12 carbon atoms, an aralkylene group having 6 to 18 carbon atoms, and an arylene group having 6 to 18 carbon atoms are preferable; an alkylene group having 1 to 8 carbon atoms, an aralkylene group having 6 to 16 carbon atoms, and an arylene group having 6 to 12 carbon atoms are more preferable; and an alkylene group having 1 to 6 carbon atoms, and an aralkylene group having 6 to 12 carbon atoms are still more preferable.

The combination of $L^1$ and $L^2$ is preferably an embodiment in which $L^1$ represents —N($R^2$)C(=O)—, —OC(=O)—, —C(=O)N($R^2$)— or —C(=O)O—, and $L^2$ represents an alkylene group having 1 to 12 carbon atoms, an aralkylene group having 6 to 18 carbon atoms, an arylene group having 6 to 18 carbon atoms, an alkylthioether group having 2 to 18 carbon atoms, an alkylcarbonamido group having 2 to 18 carbon atoms, or an alkylaminocarbonyl group having 2 to 18 carbon atoms; more preferably an embodiment in which $L^1$ represents —OC(=O)—, —C(=O)N($R^2$)— or —C(=O)O—, and $L^2$ represents an alkylene group having 1 to 8 carbon atoms, an aralkylene group having 6 to 16 carbon atoms, an arylene group having 6 to 12 carbon atoms, an alkylthioether group having 2 to 12 carbon atoms, an alkylcarbonamido group having 2 to 12 carbon atoms, or an alkylaminocarbonyl group having 2 to 12 carbon atoms; and still more preferably an embodiment in which $L^1$ represents —C(=O)N($R^2$)— or —C(=O)O—, and $L^2$ represents an alkylene group having 1 to 6 carbon atoms, an aralkylene group having 6 to 12 carbon atoms, an alkylthioether group having 2 to 6 carbon atoms, an alkylcarbonamido group having 2 to 6 carbon atoms, or an alkylaminocarbonyl group having 2 to 6 carbon atoms.

The following are examples of the polymerizable group represented by -($L^2$)$_n$-($L^1$)$_m$-C($R^1$)=CH$_2$ in the formula (1). However, the present invention is not limited to these examples.

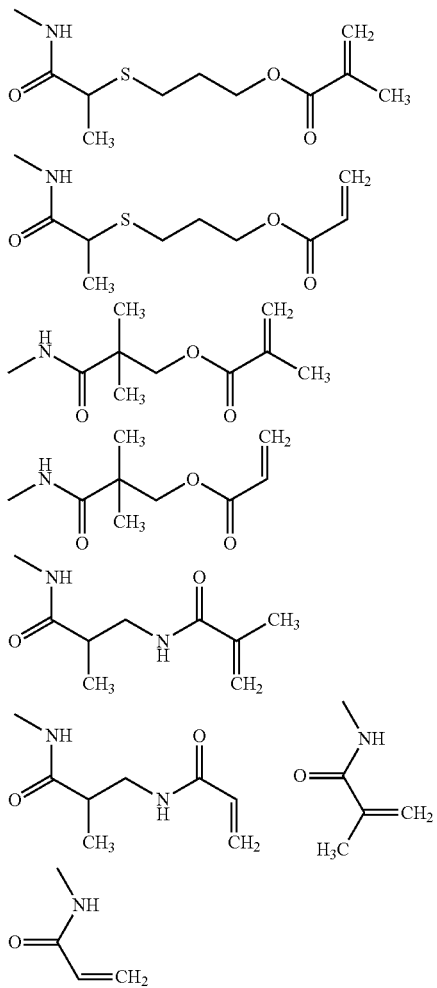

(Dye Residue)

As mentioned above, Dye in the formula (A), formula (B), formula (C), formula (D) and formula (1) preferably represents a dye residue obtained by removing one or more hydrogen atoms in a number of from 1 to (m+1) from a dye compound selected from the group consisting of a monomethine dye, a dimethine dye, a trimethine dye, a cyanine dye, a merocyanine dye, a dicyanostyryl dye, a diphenyl methane dye, a triphenyl methane dye, a xanthene dye, a squarylium dye, a quinophthalone dye, a monoazo dye, a bisazo dye, a disazo dye, a trisazo dye, a quinophthalone dye, an anthraquinone dye, an anthrapyridone dye, a perylene dye, a diketopyrrolopyrrole dye, an isoindoline dye, a phthalocyanine dye, an azomethine dye, a dioxazine dye, and a dipyrromethene dye.

Specifically, examples of the dipyrromethene dye include dipyrromethene metal complex compounds represented by the following formula (5) or the following formula (6).

However, the present invention is not limited thereto.

Dipyrromethene metal complex compound represented by formula (5)

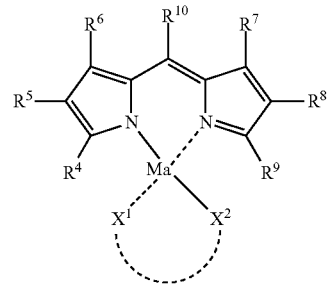

formula (5)

In the formula (5), $R^4$ to $R^9$ each independently represents a hydrogen atom or a substituent, and $R^{10}$ represents a hydrogen atom, a halogen atom, an alkyl group, an aryl group or a heterocyclic group. Ma represents a metal atom or a metal compound. $X^1$ represents a group capable of being bonded to Ma, $X^2$ represents a group that neutralizes the charge of Ma, and $X^1$ and $X^2$ may be bonded to each other to form a 5-, 6- or 7-membered ring together with Ma. Further, the dipyrromethene metal complex compound represented by the formula (5) includes a tautomer.

The site in the dipyrromethene metal complex compound represented by the formula (5) from which one or two hydrogen atoms are removed to form a dye residue is not particularly limited. However, from the viewpoint of synthesis suitability, the site is preferably one or two of $R^4$ to $R^9$, more preferably one or two of $R^4$, $R^6$, $R^7$ and $R^9$, and still more preferably one or two of $R^4$ and $R^9$.

When a dye monomer or a structural unit having an alkali-soluble group is used for introducing an alkali-soluble group to a specific dye multimer according to the present invention, one or more substituents represented by $R^4$ to $R^{10}$, $X^1$ and $X^2$ of the dipyrromethene metal complex compound represented by the formula (5) may have an alkali-soluble group. Among these substituents, any one of $R^4$ to $R^9$ and $X^1$ is preferable, any one of $R^4$, $R^6$, $R^7$ and $R^9$ is more preferable, and any one of $R^4$ and $R^9$ is still more preferable.

The dipyrromethene metal complex compound represented by formula (5) may have a functional group other than an alkali-soluble group, as long as the effect of the present invention is not impaired.

Examples of $R^4$ to $R^9$ include a halogen atom (for example, fluorine, chlorine or bromine), an alkyl group (a linear, branched or cyclic alkyl group preferably having 1 to 48 carbon atoms, and more preferably having 1 to 24 carbon atoms, for example, methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl or 1-adamantyl), an alkenyl group (an alkenyl group preferably having 2 to 48 carbon atoms, and more preferably having 2 to 18 carbon atoms, for example, a vinyl, aryl or 3-buten-1-yl group), an aryl group (an aryl group preferably having 6 to 48 carbon atoms, and more preferably having 6 to 24 carbon atoms, for example, phenyl or naphthyl), a heterocyclic group (a heterocyclic group preferably having 1 to 32 carbon atoms, and more preferably having 1 to 18 carbon atoms, for example, 2-thienyl, 4-pyridyl, 2-furyl, 2-pyrimidinyl, 1-pyridyl, 2-benzothiazole, 1-imidazole, 1-pyrazole or benzotriazol-1-yl), a silyl group (a silyl group preferably having 3 to 38 carbon atoms, and more preferably having 3 to 18 carbon atoms, for example, trimethylsilyl, triethylsilyl, tributylsilyl, t-butyldimethylsilyl or t-hexyldimethylsilyl), a hydroxyl group, a cyano group, a nitro group, an alkoxy group (an alkoxy group preferably having 1 to 48 carbon atoms, and more preferably having 1 to 24 carbon atoms, for example, methoxy, ethoxy, 1-butoxy, 2-butoxy, isopropoxy, t-butoxy, dodecyloxy or cycloalkyloxy, for example, cyclopentyloxy or cyclohexyloxy), an aryloxy group (an aryloxy group preferably having 6 to 48 carbon atoms, and more preferably having 6 to 24 carbon atoms, for example, phenoxy or 1-naphthoxy), a heterocyclic oxy group (a heterocyclic oxy group preferably having 1 to 32 carbon atoms, and more preferably having 1 to 18 carbon atoms, for example, 1-phenyltetrazol-5-oxy or 2-tetrahydropyranyloxy), a silyloxy group (a silyloxy group preferably having 1 to 32 carbon atoms, and more preferably having 1 to 18 carbon atoms, for example, trimethylsilyloxy, t-butyl dimethylsilyloxy or diphenyl methylsilyloxy), an acyloxy group (an acyloxy group preferably having 2 to 48 carbon atoms, and more preferably having 2 to 24 carbon atoms, for example, acetoxy, pivaloyloxy, benzoyloxy or dodecanoyloxy), an alkoxycarbonyloxy group (an alkoxycarbonyloxy group preferably having 2 to 48 carbon atoms, and more preferably having 2 to 24 carbon atoms, for example, ethoxycarbonyloxy, t-butoxycarbonyloxy or cycloalkyloxycarbonyloxy (for example, cyclohexyloxycarbonyloxy)), an aryloxycarbonyloxy group (an aryloxycarbonyloxy group preferably having 7 to 32 carbon atoms, and more preferably having 7 to 24 carbon atoms, for example, phenoxycarbonyloxy), a carbamoyloxy group (a carbamoyloxy group preferably having 1 to 48 carbon atoms, and more preferably having 1 to 24 carbon atoms, for example, N,N-dimethylcarbamoyloxy, N-butylcarbamoyloxy, N-phenylcarbamoyloxy or N-ethyl-N-phenylcarbamoyloxy), a sulfamoyloxy group (a sulfamoyloxy group preferably having 1 to 32 carbon atoms, and more preferably having 1 to 24 carbon atoms, for example, N,N-diethylsulfamoyloxy or N-propylsulfamoyloxy), an alkylsulfonyloxy group (an alkylsulfonyloxy group preferably having 1 to 38 carbon atoms, and more preferably having 1 to 24 carbon atoms, for example, methylsulfonyloxy, hexadecylsulfonyloxy or cyclohexylsulfonyloxy), an arylsulfonyloxy group (an arylsulfonyloxy group preferably having 6 to 32 carbon atoms, and more preferably having 6 to 24 carbon atoms, for example, phenylsulfonyloxy), an acyl group (an acyl group preferably having 1 to 48 carbon atoms, and more preferably having 1 to 24 carbon atoms, for example, formyl, acetyl, pivaloyl, benzoyl, tetradecanoyl or cyclohexanoyl), an alkoxycarbonyl group (an alkoxycarbonyl group preferably having 2 to 48 carbon atoms, and more preferably having 2 to 24 carbon atoms, for example, methoxycarbonyl, ethoxycarbonyl, octadecyloxycarbonyl, cyclohexyloxycarbonyl or 2,6-di-tert-butyl-4-methylcyclohexyloxycarbonyl), an aryloxycarbonyl group (an aryloxycarbonyl group preferably having 7 to 32 carbon atoms, and more preferably having 7 to 24 carbon atoms, for example, phenoxycarbonyl), a carbamoyl group (a carbamoyl group preferably having 1 to 48 carbon atoms, and more preferably having 1 to 24 carbon atoms, for example, carbamoyl, N,N-diethylcarbamoyl, N-ethyl-N-octylcarbamoyl, N,N-dibutylcarbamoyl, N-propylcarbamoyl, N-phenylcarbamoyl, N-methyl N-phenylcarbamoyl or N,N-dicyclohexylcarbamoyl), an amino group (an amino group preferably having 32 or less carbon atoms, and more preferably having 24 or less carbon atoms, for example, amino, methylamino, N,N-dibutylamino, tetradecylamino, 2-ethylhexylamino or cyclohexylamino), an anilino group (an anilino group preferably having 6 to 32 carbon atoms, and more preferably having 6 to 24 carbon atoms, for example, anilino or N-methylanilino), a heterocyclic amino group (a heterocyclic amino group preferably having 1 to 32 carbon atoms, and more preferably having 1 to 18 carbon atoms, for example, 4-pyridylamino), a carbonamido group (a carbonamido group preferably having 2 to 48 carbon atoms, and more preferably having 2 to 24 carbon atoms, for example, acetamido, benzamido, tetradecaneamido, pivaloylamido or cyclohexaneamido), an ureido group (an ureido group preferably having 1 to 32 carbon atoms, and more preferably having 1 to 24 carbon atoms, for example, ureido, N,N-dimethylureido or N-phenylureido), an imido group (an imido group preferably having 36 or less carbon atoms, and more preferably having 24 or less carbon atoms, for example, N-succinimido or N-phthalimido), an alkoxycarbonylamino group (an alkoxycarbonylamino group preferably having 2 to 48 carbon atoms, and more preferably having 2 to 24 carbon atoms, for example, methoxycarbonylamino, ethoxycarbonylamino, t-butoxycarbonylamino, octadecyloxycarbonylamino or cyclohexyloxycarbonylamino), an aryloxycarbonylamino group (an aryloxycarbonylamino group preferably having 7 to 32 carbon atoms, and more preferably having 7 to 24 carbon atoms, for example, phenoxycarbonylamino), a sulfonamido group (a sulfonamido group preferably having 1 to 48 carbon atoms, and more preferably having 1 to 24 carbon atoms, for example, methanesulfonamido, butanesulfonamido, benzenesulfonamido, hexadecanesulfonamido or cyclohexanesulfonamido), a sulfamoylamino group (a sulfamoylamino group preferably having 1 to 48 carbon atoms, and more preferably having 1 to 24 carbon atoms, for example, N,N-dipropylsulfamoylamino or N-ethyl-N-dodecylsulfamoylamino), an azo group (an azo group preferably having 1 to 32 carbon atoms, and more preferably having 1 to 24 carbon atoms, for example, phenylazo or 3-pyrazolylazo), an alkylthio group (an alkylthio group preferably having 1 to 48 carbon atoms, and more preferably having 1 to 24 carbon atoms, for example, methylthio, ethylthio, octylthio or cyclohexylthio), an arylthio group (an arylthio group preferably having 6 to 48 carbon atoms, and more preferably having 6 to 24 carbon atoms, for example, phenylthio), a heterocyclic thio group (a heterocyclic thio group preferably having 1 to 32 carbon atoms, and more preferably having 1 to 18 carbon atoms, for example, 2-benzothiazolylthio, 2-pyridylthio or 1-phenyltetrazolylthio), an alkylsulfinyl group (an alkylsulfinyl group preferably having 1 to 32 carbon atoms, and more preferably having 1 to 24 carbon atoms, for example, dodecanesulfinyl), an arylsulfinyl group (an arylsulfinyl group preferably having 6 to 32 carbon atoms, and more preferably having 6 to 24 carbon atoms, for example, phenylsulfinyl), an alkylsulfonyl group (an alkylsulfonyl group preferably having 1 to 48 carbon atoms, and more preferably having 1 to 24 carbon atoms, for example, methylsulfonyl, ethylsulfonyl, propylsulfonyl, butylsulfonyl, isopropylsulfonyl, 2-ethylhexylsulfonyl, hexadecylsulfonyl, octylsulfonyl or cyclohexylsulfonyl), an arylsulfonyl group (an arylsulfonyl group preferably having 6 to 48 carbon atoms, and more preferably having 6 to 24 carbon atoms, for example, phenylsulfonyl or 1-naphthylsulfonyl), a sulfamoyl group (a sulfamoyl group preferably having 32 or less carbon atoms, and more preferably having 24 or less carbon atoms, for example, sulfamoyl, N,N-dipropylsulfamoyl, N-ethyl-N-dodecylsulfamoyl, N-ethyl-N-phenylsulfamoyl or N-cyclohexylsulfamoyl), a sulfo group, a phosphonyl group (a phosphonyl group preferably having 1 to 32 carbon atoms, and more preferably having 1 to 24 carbon atoms, for example, phenoxyphosphonyl, octyloxyphosphonyl or phenylphosphonyl), and a phosphinoylamino group (a phosphinoylamino group preferably having 1 to 32 carbon atoms, and more preferably having 1 to 24 carbon atoms, for example, diethoxyphosphinoylamino or dioctyloxyphosphinoylamino).

Among these groups, $R^4$ and $R^9$ preferably represent an alkylamino group, an arylamino group, a carbonamido group, a ureido group, an imido group, an alkoxycarbonylamino group or a sulfonamido group, more preferably a carbonamido group, a ureido group, an alkoxycarbonylamino group or a sulfonamido group, still more preferably a carbonamido group, a ureido group, an alkoxycarbonylamino group or a sulfonamido group, and particularly preferably a carbonamido group or a ureido group.

Among these groups, $R^5$ and $R^8$ preferably represent an alkoxycarbonyl group, an aryloxycarbonyl group, a carbamoyl group, an alkylsulfonyl group, an arylsulfonyl group, a nitrile group, an imido group or a carbamoylsulfonyl group, more preferably an alkoxycarbonyl group, an aryloxycarbonyl group, a carbamoyl group, an alkylsulfonyl group, a nitrile group, an imido group or a carbamoylsulfonyl group, still more preferably an alkoxycarbonyl group, an aryloxycarbonyl group, a carbamoyl group, a nitrile group, an imido group or a carbamoylsulfonyl group, and particularly preferably an alkoxycarbonyl group, an aryloxycarbonyl group or a carbamoyl group.

Among these groups, $R^6$ and $R^7$ preferably represent a substituted or unsubstituted alkyl group, a substituted or unsubstituted aryl group or a substituted or unsubstituted heterocyclic group, and more preferably a substituted or unsubstituted alkyl group or a substituted or unsubstituted aryl group.

When $R^6$ and $R^7$ represent an alkyl group, examples of the alkyl group preferably include a linear, branched or cyclic, substituted or unsubstituted alkyl group having 1 to 12 carbon atoms, more specifically, for example, the alkyl group may be a methyl group, an ethyl group, an n-propyl group, an isopropyl group, a cyclopropyl group, an n-butyl group, an i-butyl group, a t-butyl group, a cyclobutyl group, a cyclopentyl group, a cyclohexyl group or a benzyl group, more preferably a branched or cyclic, substituted or unsubstituted alkyl group having 1 to 12 carbon atoms, still more specifically, for example, an isopropyl group, a cyclopropyl group, an i-butyl group, a t-butyl group, a cyclobutyl group, a cyclopentyl group or a cyclohexyl group, even more preferably a secondary or tertiary substituted or unsubstituted alkyl group having 1 to 12 carbon atoms, more specifically, for example, an isopropyl group, a cyclopropyl group, an i-butyl group, a t-butyl group, a cyclobutyl group and a cyclohexyl group.

When $R^6$ and $R^7$ represent an aryl group, examples of the aryl group preferably include a substituted or unsubstituted phenyl group and a substituted or unsubstituted naphthyl group, and more preferably a substituted or unsubstituted phenyl group.

When $R^6$ and $R^7$ represent a heterocyclic group, examples of the heterocyclic group preferably include a substituted or unsubstituted 2-thienyl group, a substituted or unsubstituted 4-pyridyl group, a substituted or unsubstituted 3-pyridyl group, a substituted or unsubstituted 2-pyridyl group, a substituted or unsubstituted 2-furyl group, a substituted or unsubstituted 2-pyrimidinyl group, a substituted or unsubstituted 2-benzothiazolyl group, a substituted or unsubstituted 1-imidazolyl group, a substituted or unsubstituted 1-pyrazolyl group and a substituted or unsubstituted benzotriazol-1-yl group, and more preferably a substituted or unsubstituted 2-thienyl group, a substituted or unsubstituted 4-pyridyl group, a substituted or unsubstituted 2-furyl group, a substituted or unsubstituted 2-pyrimidinyl group and a substituted or unsubstituted 1-pyridyl group.

In the formula (5), Ma represents a metal atom or a metal compound. The metal atom or the metal compound may be any metal atom or metal compound, as long as it can form a complex, and examples thereof include a divalent metal atom, a divalent metal oxide, a divalent metal hydroxide and a divalent metal chloride.

Specific examples of Ma include Zn, Mg, Si, Sn, Rh, Pt, Pd, Mo, Mn, Pb, Cu, Ni, Co and Fe, metal chlorides including AlCl, InCl, FeCl, $TiCl_2$, $SnCl_2$, $SiCl_2$ and $GeCl_2$, metal oxides including TiO and VO, and metal hydroxides including $Si(OH)_2$.

Among these, the metal atom or the metal compound is preferably Fe, Zn, Mg, Si, Pt, Pd, Mo, Mn, Cu, Ni, Co, TiO or VO, more preferably Zn, Mg, Si, Pt, Pd, Cu, Ni, Co or VO, particularly preferably Zn, Cu, Co or VO, and most preferably Zn, from the viewpoints of stability, spectral properties, heat resistance, light fastness, production suitability and the like of the complex.

Further, in the formula (5), $R^{10}$ represents a hydrogen atom, a halogen atom, an alkyl group, an aryl group or a heterocyclic group, and preferably a hydrogen atom.

$X^1$ in the formula (5) may be any group as long as it is capable of being bonded to Ma, and specific examples thereof include water, alcohols (for example, methanol, ethanol and propanol), as well as the compounds described in "Metal Chelates" [1] Takeichi Sakaguchi and Kyohei Ueno (1995 Nankodo), "Metal Chelates" [2] (1996), "Metal Chelates" [3] (1997), and the like. Among them, from the viewpoints of production suitability, water, carboxylic acid compounds and alcohols are preferable, and water and carboxylic acid compounds are more preferable.

In the formula (5), examples of the "group that neutralizes the charge of Ma" represented by $X^2$ preferably include a halogen atom, a hydroxyl group, a carboxylic acid group, a phosphonic acid group and a sulfonic acid group. From the viewpoints of production suitability, a halogen atom, a hydroxyl group, a carboxylic acid group and a sulfonic acid group are preferable, and a hydroxyl group and a carboxylic acid group are more preferable.

In formula (5), $X^1$ and $X^2$ may be bonded to each other to form a 5-, 6- or 7-membered ring together with Ma. The 5-, 6- or 7-membered ring may be a saturated or unsaturated ring. Further, the 5-, 6- or 7-membered ring may be formed by carbon atoms alone, or may be a heterocycle having at least one atom selected from a nitrogen atom, an oxygen atom and/or a sulfur atom.

In a preferred embodiment of the compound represented by formula (5), each of $R^4$ to $R^9$ independently is a preferable embodiment of $R^4$ to $R^9$ as explained above, $R^{10}$ is a preferable embodiment of $R^{10}$ as explained above, Ma represents Zn, Cu, Co or VO, $X^1$ represents water or a carboxylic acid compound, $X^2$ represents a hydroxyl group or a carboxylic acid group, and $X^1$ and $X^2$ may be bonded to each other to form a 5- or 6-membered ring.

Dipyrromethene Metal Complex Compound Represented by Formula (6)

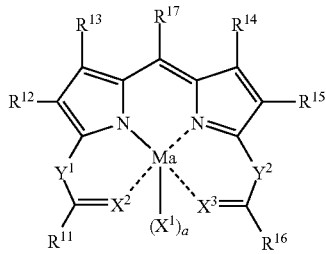

formula (6)

In the formula (6), $R^{11}$ and $R^{16}$ each independently represents an alkyl group, an alkenyl group, an aryl group, a heterocyclic group, an alkoxy group, an aryloxy group, an alkylamino group, an arylamino group or a heterocyclic amino group. $R^{12}$ to $R^{15}$ each independently represents a hydrogen atom or a substituent. $R^{17}$ represents a hydrogen atom, a halogen atom, an alkyl group, an aryl group or a heterocyclic group. Ma represents a metal atom or a metal compound. $X^2$ and $X^3$ represent NR (R represents a hydrogen atom, an alkyl group, an alkenyl group, an aryl group, a heterocyclic group, an acyl group, an alkylsulfonyl group or an arylsulfonyl group), a nitrogen atom, an oxygen atom or a sulfur atom. $Y^1$ and $Y^2$ represent NR (R represents a hydrogen atom, an alkyl group, an alkenyl group, an aryl group, a heterocyclic group, an acyl group, an alkylsulfonyl group or an arylsulfonyl group), a nitrogen atom or a carbon atom. $R^{11}$ and $Y^1$ may be bonded to each other to form a 5-, 6- or 7-membered ring, and $R^{16}$ and $Y^2$ may be bonded to each other to form a 5-, 6- or 7-membered ring. $X^1$ represents a group capable of being bonded to Ma, and a represents 0, 1 or 2. Further, the dipyrromethene metal complex compound represented by the formula (6) includes a tautomer.

Although the site in the dipyrromethene metal complex compound represented by the formula (6) from which one or two hydrogen atoms are removed to form a dye residue is not particularly limited, and is one or two sites selected from $R^{11}$ to $R^{17}$, $X^1$, and $Y^1$ to $Y^2$.

Among them, from the viewpoints of synthesis suitability, one or two sites selected from $R^{11}$ to $R^{16}$ and $X^1$ are preferable, one or two sites selected from $R^{11}$, $R^{13}$, $R^{14}$ and $R^{16}$ are more preferable, and one or two sites selected from $R^{11}$ and $R^{16}$ are still more preferable.

When a dye monomer having an alkali-soluble group or a structural unit having an alkali-soluble group is used for introducing an alkali-soluble group to a specific dye multimer in the present invention, one or more substituents selected from $R^{11}$ to $R^{17}$, $X^1$, and $Y^1$ to $Y^2$ of the dipyrromethene metal complex compound represented by the formula (6) may have an alkali-soluble group. Among these substituents, any one of $R^{11}$ to $R^{16}$ and $X^1$ is preferable, any one of $R^{11}$, $R^{13}$, $R^{14}$ and $R^{16}$ is more preferable, and any one of $R^{11}$ and $R^{16}$ is still more preferable.

The dipyrromethene metal complex compound represented by formula (6) may also have a functional group other than an alkali-soluble group, as long as the effect of the present invention is not impaired.

$R^{12}$ to $R^{15}$ have the same definitions as that of $R^5$ to $R^8$ in the formula (5), respectively, and preferable embodiments are also the same. $R^{17}$ has the same definitions as that of $R^{10}$ in the formula (5), and preferable embodiments are also the same.

Ma has the same definitions as that of Ma in the formula (5), and preferred ranges are also the same.

More specifically, regarding $R^{12}$ to $R^{15}$ in the formula (6), $R^{12}$ and $R^{15}$ preferably represent an alkoxycarbonyl group, an aryloxycarbonyl group, a carbamoyl group, an alkylsulfonyl group, an arylsulfonyl group, a nitrile group, an imido group or a carbamoylsulfonyl group, more preferably an alkoxycarbonyl group, an aryloxycarbonyl group, a carbamoyl group, an alkylsulfonyl group, a nitrile group, an imido group or a carbamoylsulfonyl group, still more preferably an alkoxycarbonyl group, an aryloxycarbonyl group, a carbamoyl group, a nitrile group, an imido group or a carbamoylsulfonyl group, and particularly preferably an alkoxycarbonyl group, an aryloxycarbonyl group or a carbamoyl group.

$R^{13}$ and $R^{14}$ preferably represent a substituted or unsubstituted alkyl group, a substituted or unsubstituted aryl group or a substituted or unsubstituted heterocyclic group, and more preferably a substituted or unsubstituted alkyl group or a substituted or unsubstituted aryl group. Specific examples of $R^6$ and $R^7$ in formula (5) may be mentioned as the more preferable examples of the alkyl group, aryl group and heterocyclic group.

In the formula (6), each of $R^{11}$ and $R^{16}$ preferably represents an alkyl group (a linear, branched or cyclic alkyl group preferably having 1 to 36 carbon atoms, more preferably having 1 to 12 carbon atoms, such as methyl, ethyl, propyl, isopropyl, butyl, isobutyl, t-butyl, hexyl, 2-ethylhexyl, dodecyl, cyclopropyl, cyclopentyl, cyclohexyl or 1-adamantyl), an alkenyl group (an alkenyl group preferably having 2 to 24 carbon atoms, and more preferably having 2 to 12 carbon atoms, such as vinyl, aryl or 3-buten-1-yl), an aryl group (an aryl group preferably having 6 to 36 carbon atoms, and more preferably having 6 to 18 carbon atoms, such as phenyl or naphthyl), a heterocyclic group (a heterocyclic group preferably having 1 to 24 carbon atoms, and more preferably having 1 to 12 carbon atoms, such as 2-thienyl, 4-pyridyl, 2-furyl, 2-pyrimidinyl, 2-pyridyl, 2-benzothiazole, 1-imidazole, 1-pyrazole or benzotriazol-1-yl), an alkoxy group (an alkoxy group preferably having 1 to 36 carbon atoms, and more preferably having 1 to 18 carbon atoms, such as methoxy, ethoxy, propyloxy, butoxy, hexyloxy, 2-ethylhexyloxy, dodecyloxy or cyclohexyloxy), an aryloxy group (an aryloxy group preferably having 6 to 24 carbon atoms, and more preferably having 1 to 18 carbon atoms, such as phenoxy or naphthyloxy), an alkylamino group (an alkylamino group preferably having 1 to 36 carbon atoms, and more preferably having 1 to 18 carbon atoms, such as methylamino, ethylamino, propylamino, butylamino, hexylamino, 2-ethylhexylamino, isopropylamino, t-butylamino, t-octylamino, cyclohexylamino, N,N-diethylamino, N,N-dipropylamino, N,N-dibutylamino or N-methyl-N-ethylamino), an arylamino group (an arylamino group preferably having 6 to 36 carbon atoms, and more preferably having 6 to 18 carbon atoms, such as phenylamino, naphthylamino, N,N-diphenylamino or N-ethyl-N-phenylamino) or a heterocyclic amino group (a heterocyclic amino group preferably having 1 to 24 carbon atoms, and more preferably having 1 to 12 carbon atoms, such as 2-aminopyrrole, 3-aminopyrazole, 2-amino pyridine or 3-amino pyridine).

Among these groups, each of $R^{11}$ and $R^{16}$ preferably represents an alkyl group, an alkenyl group, an aryl group, a heterocyclic group, an alkylamino group, an arylamino group or a heterocyclic amino group, more preferably an alkyl group, an alkenyl group, an aryl group or a heterocyclic group, still more preferably an alkyl group, an alkenyl group or an aryl group, and particularly preferably an alkyl group.

In the formula (6), when the alkyl group, alkenyl group, aryl group, heterocyclic group, alkoxy group, aryloxy group, alkylamino group, arylamino group or heterocyclic amino group represented by $R^{11}$ and $R^{16}$ is a group which may be further substituted, it may be substituted by any of the substituents described as the substituents for $R^1$ of formula (1), and when the group is substituted by two or more substituents, these substituents may be the same or different from each other.

In the formula (6), each of $X^2$ and $X^3$ represents NR, a nitrogen atom, an oxygen atom or a sulfur atom. R represents a hydrogen atom, an alkyl group (a linear, branched or cyclic alkyl group preferably having 1 to 36 carbon atoms, and more preferably having 1 to 12 carbon atoms, for example, methyl, ethyl, propyl, isopropyl, butyl, isobutyl, t-butyl, hexyl, 2-ethylhexyl, dodecyl, cyclopropyl, cyclopentyl, cyclohexyl or 1-adamantyl), an alkenyl group (an alkenyl group preferably having 2 to 24 carbon atoms, and more preferably having 2 to 12 carbon atoms, for example, a vinyl, aryl or 3-buten-1-yl group), an aryl group (an aryl group preferably having 6 to 36 carbon atoms, and more preferably having 6 to 18 carbon atoms, for example, phenyl or naphthyl), a heterocyclic group (a heterocyclic group preferably having 1 to 24 carbon atoms, and more preferably having 1 to 12 carbon atoms, for example, 2-thienyl, 4-pyridyl, 2-furyl, 2-pyrimidinyl, 1-pyridyl, 2-benzothiazolyl, 1-imidazolyl, 1-pyrazolyl or benzotriazol-1-yl), an acyl group (an acyl group preferably having 1 to 24 carbon atoms, and more preferably having 2 to 18 carbon atoms, for example, acetyl, pivaloyl, 2-ethylhexyl, benzoyl or cyclohexanoyl), an alkylsulfonyl group (an alkylsulfonyl group preferably having 1 to 24 carbon atoms, and more preferably having 1 to 18 carbon atoms, for example, methylsulfonyl, ethylsulfonyl, isopropylsulfonyl or cyclohexylsulfonyl) or an arylsulfonyl group (an arylsulfonyl group preferably having 6 to 24 carbon atoms, and more preferably having 6 to 18 carbon atoms, for example, phenylsulfonyl or naphthylsulfonyl).

The alkyl group, alkenyl group, aryl group, heterocyclic group, acyl group, alkylsulfonyl group or arylsulfonyl group represented by R may be substituted by any of the substituents described as the substituents for $R^1$ of the following formula (1), and when the group is substituted by plural substituents, these substituents may be the same or different from each other.

In the formula (6), $Y^1$ and $Y^2$ represent NR, a nitrogen atom or a carbon atom, and R has the same definitions as that of R for NR represented by $X^2$ and $X^3$, and preferable embodiments are also the same.

In the formula (6), $R^{11}$ and $Y^1$ may be bonded to each other to form a 5-membered ring together with the carbon atom (for example, cyclopentane, pyrrolidine, tetrahydrofuran, dioxolane, tetrahydrothiophene, pyrrole, furan, thiophene, indole, benzofuran or benzothiophene), a 6-membered ring (for example, cyclohexane, piperidine, piperazine, morpholine, tetrahydropyran, dioxane, pentamethylenesulfide, dithiane, benzene, piperidine, piperazine, pyridazine, quinoline or quinazoline) or a 7-membered ring (for example, cycloheptane or hexamethyleneimine).

In the formula (6), $R^{16}$ and $Y^2$ may be bonded to each other to form a 5-membered ring together with the carbon atom (for example, cyclopentane, pyrrolidine, tetrahydrofuran, dioxolane, tetrahydrothiophene, pyrrole, furan, thiophene, indole, benzofuran or benzothiophene), a 6-membered ring (for example, cyclohexane, piperidine, piperazine, morpholine, tetrahydropyran, dioxane, pentamethylenesulfide, dithiane, benzene, piperidine, piperazine, pyridazine, quinoline or quinazoline) or a 7-membered ring (for example, cycloheptane or hexamethyleneimine).

In the formula (6), when the 5-, 6- or 7-membered ring formed by $R^{11}$ and $Y^1$ or $R^{16}$ and $Y^2$ can be substituted, it may be substituted by any of the substituents described as the substituents for $R^1$ of formula (1), and when the group is substituted by two or more substituents, these substituents may be the same or different from each other.

In the formula (6), $X^1$ represents a group capable of being bonded to Ma, and specific examples thereof include the groups represented by $X^1$ in the formula (5), and preferable embodiments are also the same. a represents 0, 1 or 2.

In a preferable embodiment of the compound represented by the formula (6), each of $R^{12}$ to $R^{15}$ is independently any one of the preferable embodiments of $R^5$ to $R^8$ in the formula (5), $R^{17}$ is any one of the preferable embodiments of $R^{10}$ in the formula (5), Ma represents Zn, Cu, Co or VO, $X^2$ represents NR (R represents a hydrogen atom or an alkyl group), a nitrogen atom or an oxygen atom, $X^3$ represents NR (R represents a hydrogen atom or an alkyl group) or an oxygen atom, $Y^1$ represents NR (R represents a hydrogen atom or an alkyl group), a nitrogen atom or a carbon atom, $Y^2$ represents a nitrogen atom or a carbon atom, $R^{11}$ and $R^{16}$ each independently represents an alkyl group, an aryl group, a heterocyclic group, an alkoxy group or an alkylamino group, $X^1$ represents a group that bonds via an oxygen atom, and a represents 0 or 1. $R^{11}$ and $Y^1$ may be bonded to each other to form a 5-membered or a 6-membered ring, or $R^{16}$ and $Y^2$ may be bonded to each other to form a 5- or 6-membered ring.

In a more preferable embodiment of the compound represented by the formula (6), $R^{12}$ to $R^{15}$ each independently represents any one of preferable embodiments of $R^5$ to $R^8$ in the compound represented by formula (5), $R^{17}$ represents any one of preferable embodiments of $R^{10}$ in the formula (5), Ma represents Zn, $X^2$ and $X^3$ represent an oxygen atom, $Y^1$ represents NH, $Y^2$ represents a nitrogen atom, $R^{11}$ and $R^{16}$ each independently represents an alkyl group, an aryl group, a heterocyclic group, an alkoxy group or an alkylamino group, $X^1$ represents a group that bonds via an oxygen atom, and a represents 0 or 1. $R^{11}$ and $Y^1$ may be bonded to each other to form a 5- or 6-membered ring, or $R^{16}$ and $Y^2$ may be bonded to each other to form a 5- or 6-membered ring.

The molar absorption coefficient of the dipyrromethene metal complex compound represented by the formula (5) and the formula (6) is preferably as high as possible, from the viewpoint of film thickness. The maximum absorption wavelength (λmax) is preferably in the range of from 520 nm to 580 nm, and more preferably from 530 nm to 570 nm, from the viewpoint of improving color purity. The maximum absorption wavelength and the molar absorption coefficient are measured by a spectrophotometer (UV-2400PC, trade name, manufactured by Shimadzu Corporation).

The melting point of the dipyrromethene metal complex compound represented by the formula (5) and the formula (6) is preferably not too high from the viewpoint of solubility.

The dipyrromethene metal complex compound represented by the formula (5) and the formula (6) may be synthesized by the methods described in U.S. Pat. Nos. 4,774,339 and 5,433,896, Japanese Patent Application Laid-Open (JP-A) Nos. 2001-240761 and 2002-155052, Japanese Patent No. 3614586, Aust. J. Chem, 1965, 11, 1835-1845, J. H. Boger et al, Heteroatom Chemistry, Vol. 1, No. 5, 389 (1990), and the like. Specifically, the method described in paragraphs [0131] to [0157] of JP-A No. 2008-292970 may be applied.

(Exemplary Compounds of Specific Dye Multimer)

The following are exemplary compounds of the specific dye multimer used in the present invention. However, the present invention is not limited to these exemplary compounds.

In the exemplary compounds, "wt %" refers to "% by mass".

| Exemplary Compound | a (wt %) | b (wt %) |
|---|---|---|
| 1-1 | 100 | 0 |
| 1-2 | 95 | 5 |
| 1-3 | 90 | 10 |
| 1-4 | 88 | 12 |
| 1-5 | 85 | 15 |
| 1-6 | 82 | 18 |
| 1-7 | 80 | 20 |
| 1-8 | 78 | 22 |
| 1-9 | 75 | 25 |
| 1-10 | 70 | 30 |

| Exemplary Compound | a (wt %) | b + c (wt %) |
|---|---|---|
| 2-1 | 83 | 17 |
| 2-2 | 77 | 23 |
| 2-3 | 71 | 29 |
| 2-4 | 65 | 35 |
| 2-5 | 60 | 40 | a (mol-%) = b (mol-%)

| Exemplary Compound | a (wt %) | b (wt %) |
|---|---|---|
| 3-1 | 100 | 0 |
| 3-2 | 91 | 9 |
| 3-3 | 85 | 15 |
| 3-4 | 80 | 20 |
| 3-5 | 77 | 23 |

| Exemplary Compound | a (wt %) | b + c (wt %) |
|---|---|---|
| 4-1 | 83 | 17 |
| 4-2 | 72 | 28 |
| 4-3 | 65 | 35 |
| 4-4 | 61 | 39 |
| 4-5 | 57 | 43 | a (mol-%) = b (mol-%)

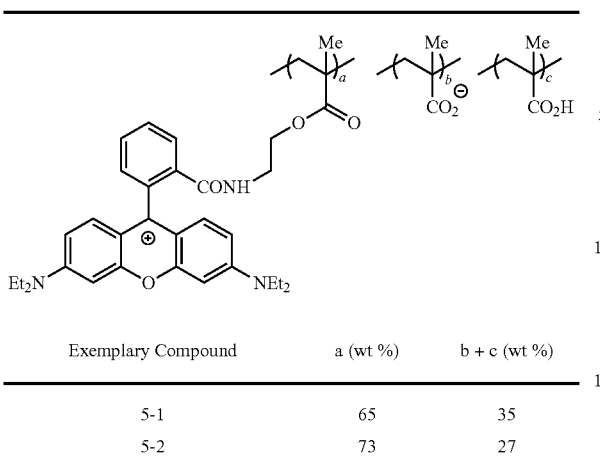
| Exemplary Compound | a (wt %) | b + c (wt %) |
| --- | --- | --- |
| 5-1 | 65 | 35 |
| 5-2 | 73 | 27 |
a (mol-%) = b (mol-%)
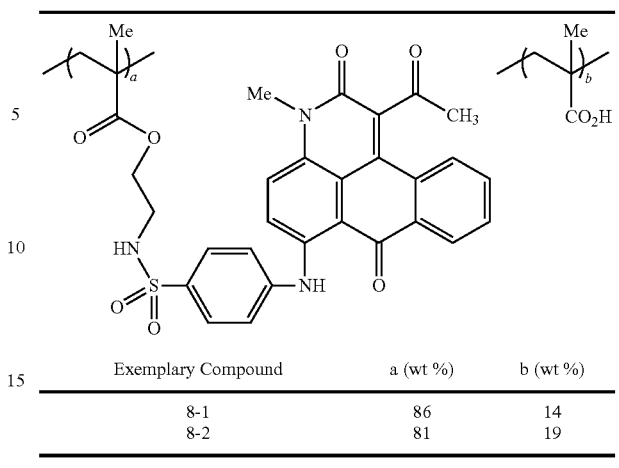
| Exemplary Compound | a (wt %) | b (wt %) |
| --- | --- | --- |
| 8-1 | 86 | 14 |
| 8-2 | 81 | 19 |
Exemplary Compound 6-1
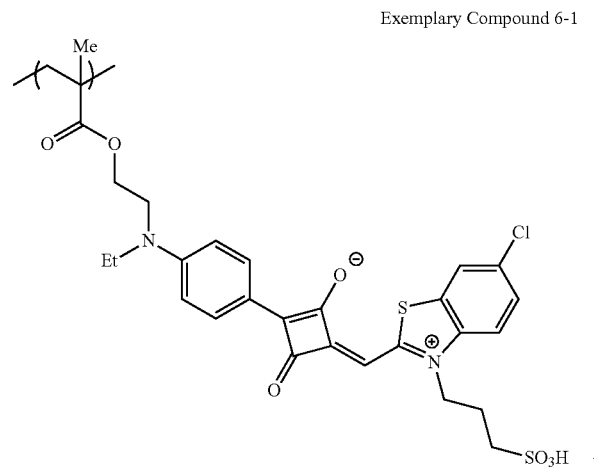
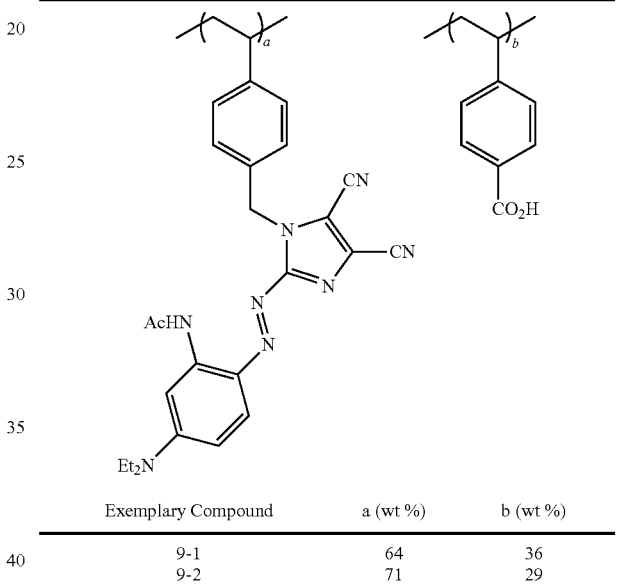
| Exemplary Compound | a (wt %) | b (wt %) |
| --- | --- | --- |
| 9-1 | 64 | 36 |
| 9-2 | 71 | 29 |
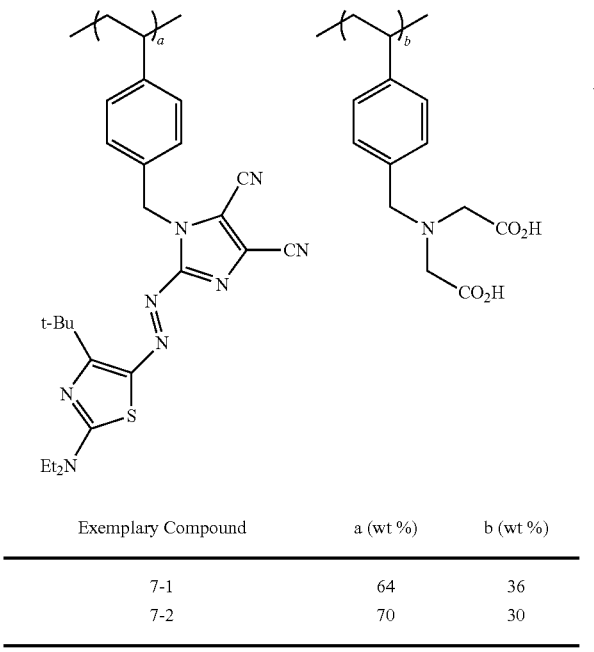
| Exemplary Compound | a (wt %) | b (wt %) |
| --- | --- | --- |
| 7-1 | 64 | 36 |
| 7-2 | 70 | 30 |
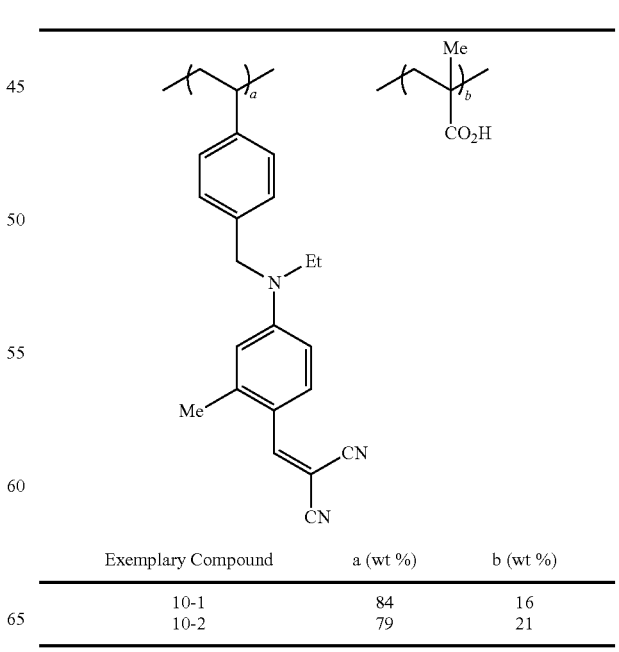
| Exemplary Compound | a (wt %) | b (wt %) |
| --- | --- | --- |
| 10-1 | 84 | 16 |
| 10-2 | 79 | 21 |

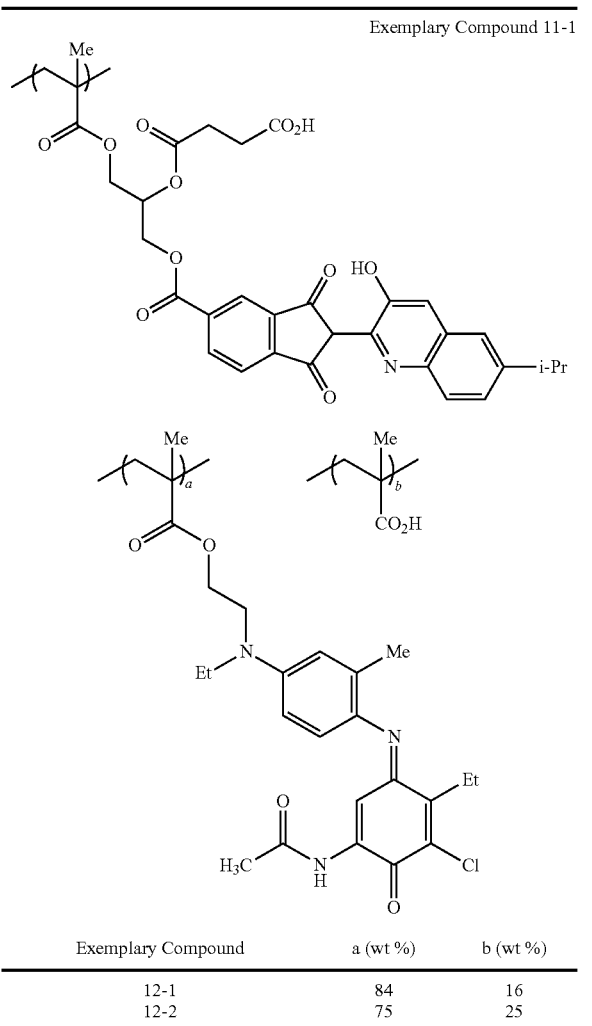

Exemplary Compound 11-1

| Exemplary Compound | a (wt %) | b (wt %) |
|---|---|---|
| 12-1 | 84 | 16 |
| 12-2 | 75 | 25 |

(Synthesis Example of Specific Dye Multimer)

Hereinafter, examples of the method of synthesizing some of the exemplary compounds of the specific dye multimer will be illustrated. However, the present invention is not limited thereto.

Synthesis of Exemplary Compound 1-4

5.0 g of the following dye monomer 1, 0.68 g of methacrylic acid and 240 mg of n-dodecanethiol as a chain transfer agent were dissolved in 32 ml of propylene glycol monomethyl ether acetate (PGMEA), followed by stirring at 85° C. under nitrogen, and 542 mg of dimethyl 2,2'-azobis(2-methylpropionate) were added thereto. Then, 240 mg of dimethyl 2,2'-azobis(2-methylpropionate) were further added twice at 2-hour intervals, and the temperature was elevated to 90° C., followed by stirring for another 2 hours. After the completion of reaction, the reaction solution was added dropwise to 400 ml of acetonitrile. The resulting crystal was collected by filtering to give an exemplary compound 1-4 (4.8 g).

The following dye monomer 1 can be synthesized by, for example by a synthesis method described in JP-A No. 2008-292970.

The weight-average molecular weight of the compound can be controlled by adjusting the amount of the chain transfer agent and the reaction temperature, and the dispersity can be controlled by changing the type and the amount of a re-precipitation solvent.

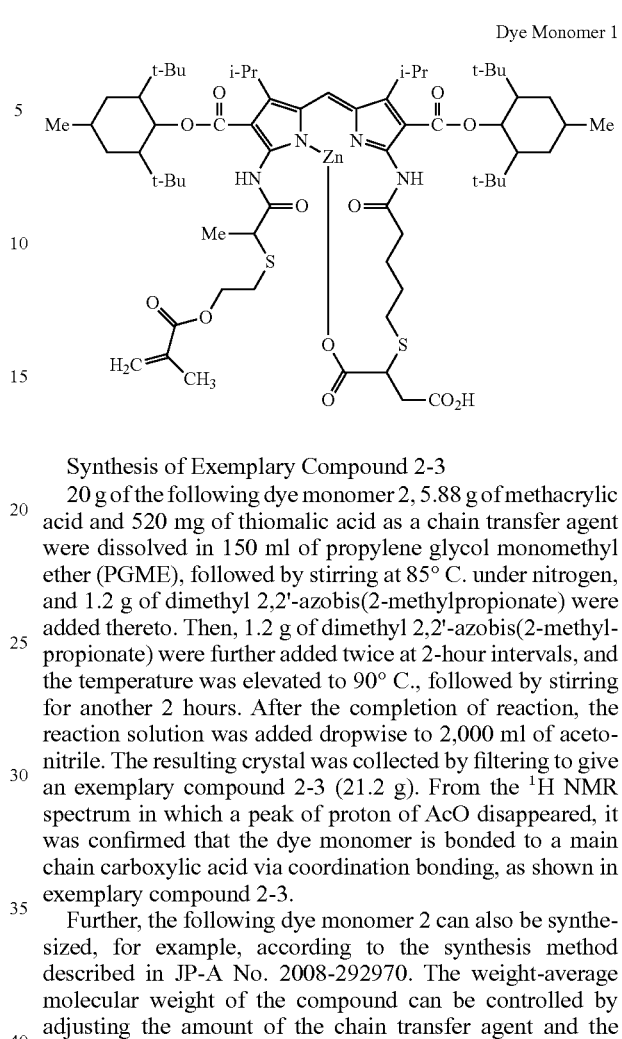

Dye Monomer 1

Synthesis of Exemplary Compound 2-3

20 g of the following dye monomer 2, 5.88 g of methacrylic acid and 520 mg of thiomalic acid as a chain transfer agent were dissolved in 150 ml of propylene glycol monomethyl ether (PGME), followed by stirring at 85° C. under nitrogen, and 1.2 g of dimethyl 2,2'-azobis(2-methylpropionate) were added thereto. Then, 1.2 g of dimethyl 2,2'-azobis(2-methylpropionate) were further added twice at 2-hour intervals, and the temperature was elevated to 90° C., followed by stirring for another 2 hours. After the completion of reaction, the reaction solution was added dropwise to 2,000 ml of acetonitrile. The resulting crystal was collected by filtering to give an exemplary compound 2-3 (21.2 g). From the $^1$H NMR spectrum in which a peak of proton of AcO disappeared, it was confirmed that the dye monomer is bonded to a main chain carboxylic acid via coordination bonding, as shown in exemplary compound 2-3.

Further, the following dye monomer 2 can also be synthesized, for example, according to the synthesis method described in JP-A No. 2008-292970. The weight-average molecular weight of the compound can be controlled by adjusting the amount of the chain transfer agent and the reaction temperature, and the dispersity can be controlled by changing the type and the amount of a re-precipitation solvent.

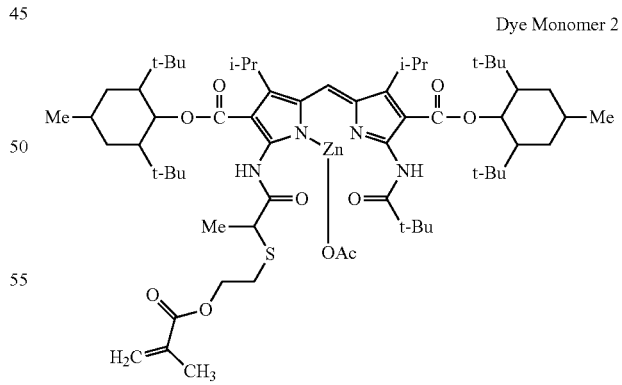

Dye Monomer 2

Exemplary Compound 4-3

6.5 g of the following dye monomer 4, 3.5 g of methacrylic acid and 420 mg of n-dodecanethiol as a chain transfer agent were dissolved in 40 ml of methyl cellosolve, followed by stirring at 85° C. under nitrogen, and 478 mg of dimethyl 2,2'-azobis(2-methylpropionate) were added thereto. Then, 478 mg of dimethyl 2,2'-azobis(2-methylpropionate) were further added twice at 2-hour intervals, and the temperature was elevated to 90° C., followed by stirring for another 2 hours. After the completion of reaction, the solvent was removed by evaporation and the resulting residue was suspended in methanol. The resulting crystal was collected by filtering to give an exemplary compound 4-3 (8.0 g).

The following dye monomer 4 can be synthesized, for example, according to the synthesis method described in Japanese Patent No. 3736221. The weight-average molecular weight of the compound can be controlled by adjusting the amount of the chain transfer agent and the reaction temperature, and the dispersity can be controlled by changing the type and the amount of a re-precipitation solvent.

Dye Monomer 4

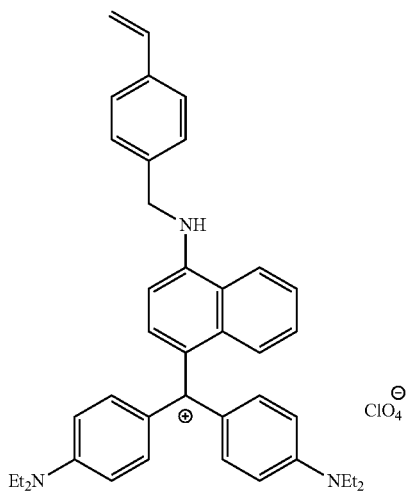

In the colored composition of the present invention, the specific dye multimer may be used alone or in a combination of two or more thereof. Further, a specific dye and a dye other than the specific dye may be used in combination in the colored composition of the present invention. Examples of the dye other than the specific dye multimer will be described hereinafter.

The content of the specific dye multimer (the total content when two or more dye multimers are used) with respect to the total solid content of the colored composition of the present invention is preferably in the range of from 0.1% by mass to 70% by mass, more preferably from 1% by mass to 65% by mass, and particularly preferably from 5% by mass to 60% by mass.

When the specific dye multimer and a dye other than the specific dye multimer are used, the total solid content thereof with respect to the total solid content of the colored composition is preferably in the range of 1% by mass to 70% by mass, more preferably 20% by mass to 65% by mass, and particularly preferably 40% by mass to 60% by mass. From the viewpoint of reducing the film thickness, the specific dye multimer of the present invention is particularly effective for increasing the amount of the dye with respect to the total solid content of the colored composition.

In order to further improve the spectral properties of the resulting colored film, other colorants (pigments or dyes) may also be used in combination in the colored composition of the present invention.

Specific examples of the pigment include, but are not limited to, Color Index PIGMENT RED 9, 19, 38, 43, 97, 122, 123, 144, 149, 166, 168, 177, 179, 180, 192, 215, 216, 208, 217, 220, 223, 224, 226, 227, 228, 240, PIGMENT BLUE 15, 15:6, 16, 22, 29, 60, 64, PIGMENT GREEN 7, 36, 58, PIGMENT YELLOW 20, 24, 86, 81, 83, 93, 108, 109, 110, 117, 125, 137, 138, 139, 147, 148, 153, 154, 166, 168, 185, PIGMENT ORANGE 36, and PIGMENT VIOLET 23.

Specific examples of the dye include, but are not limited to, Color Index ACID RED 52, 87, 92, 122, 486, SOLVENT RED 8, 24, 83, 109, 125, 132, DISPERSE RED 60, 72, 88, 206, BASIC RED 12,27, ACID BLUE 9, 40, 83, 129, 249, SOLVENT BLUE 25, 35, 36, 55, 67, 70, DISPERSE•BLUE 56, 81, 60, 87, 149, 197, 211, 214, BASIC BLUE 1, 7, 26, 77, ACID GREEN 18, SOLVENT GREEN 3, BASIC GREEN 1, ACID YELLOW 38, 99, SOLVENT YELLOW 25, 88, 89, 146, DISPERSE YELLOW 42, 60, 87, 198, and BASIC YELLOW 21.

These dyes or pigments may be used in a combination of two or more thereof in order to obtain a desired color.

<Polymerizable Compound>

The colored composition of the present invention preferably contains a polymerizable compound.

The polymerizable compound is preferably an addition-polymerizable compound having at least one ethylenically unsaturated double bond, and is selected from compounds having at least one terminal ethylenically unsaturated bond, and preferably two or more terminal ethylenically unsaturated bonds.

These compounds are well-known in the related industry field, and can be used in the present invention without being particularly limited.

These polymerizable compounds have chemical forms of a monomer, a prepolymer (i.e., a dimer, a trimer and an oligomer), a mixture thereof or a copolymer thereof. Examples of the monomer and the copolymer thereof include unsaturated carboxylic acid (for example, acrylic acid, methacrylic acid, itaconic acid, crotonic acid, isocrotonic acid or maleic acid), an ester thereof, and an amide thereof, and preferable examples include an ester of an unsaturated carboxylic acid with an aliphatic polyhydric alcohol compound, and an amide of an unsaturated carboxylic acid with an aliphatic polyvalent amine compound. Further, an adduct of an unsaturated carboxylic acid ester or an amide having a nucleophilic substituent such as a hydroxyl group, an amino group or a mercapto group with a monofunctional or polyfunctional isocyanate or epoxy, and a dehydration condensate of an unsaturated carboxylic acid ester or an amide having a nucleophilic substituent such as a hydroxy group, an amino group or a mercapto group with a monofunctional or polyfunctional carboxylic acid are also preferably used. Further, an adduct of an unsaturated carboxylic acid ester or amide having an electrophilic substituent such as an isocyanate group or an epoxy group with a monofunctional or polyfunctional alcohol, amine or thiol, and a substituted reaction product of an unsaturated carboxylic acid ester or amide having a detachable substituent such as a halogen group or a tosyloxy group with a monofunctional or polyfunctional alcohol, amine or thiol are also preferable. In addition, as another example, compound groups in which the unsaturated carboxylic acid is replaced with unsaturated phosphonic acid, styrene, vinyl ether or the like are also possible.

Specific examples of the monomer of the ester of an aliphatic polyhydric alcohol compound and an unsaturated carboxylic acid include an acrylic acid ester, a methacrylic acid ester and an itaconic acid ester.

Examples of the acrylic acid ester include ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and isocyanuric acid EO-modified triacrylate.

Examples of the methacrylic acid ester include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis-[p-(methacryloxyethoxy)phenyl]dimethylmethane.

Examples of the itaconic acid ester include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of the crotonic acid ester include ethylene glycol dicrotonate, tetramethylene glycol dicrotonate, pentaerythritol dicrotonate, and sorbitol tetracrotonate. Examples of the isocrotonic acid ester include ethylene glycol diisocrotonate, pentaerythritol diisocrotonate, and sorbitol tetraisocrotonate. Examples of the maleic acid ester include ethylene glycol dimaleate, triethylene glycol dimaleate, pentaerythritol dimaleate, and sorbitol tetramaleate.

Preferable examples of other esters to be used include the aliphatic alcohol esters described in Japanese Examined Patent Application Publication (JP-B) No. 51-47334 and JP-A No. 57-196231, those containing an aromatic backbone described in JP-A Nos. 59-5240, 59-5241 and 2-226149, and those containing an amino group described in JP-A No. 1-165613. The above-mentioned ester monomers may be used as a mixture.

In addition, a monomer containing an acid group may also be used, and examples thereof include (meth)acrylic acid, pentaerythritol triacrylate succinic acid monoester, dipentaerythritol pentaacrylate succinic acid monoester, pentaerythritol triacrylate maleic acid monoester, dipentaerythritol pentaacrylate maleic acid monoester, pentaerythritol triacrylate phthalic acid monoester, dipentaerythritol pentaacrylate phthalic acid monoester, pentaerythritol triacrylate tetrahydrophthalic acid monoester, and dipentaerythritol pentaacrylate tetrahydrophthalic acid monoester. In particular, pentaerythritol triacrylate succinic acid monoester is preferable from the viewpoints of developability and sensitivity.

Specific examples of the monomer of the amide of the aliphatic polyvalent amine compound and the unsaturated carboxylic acid include methylene bis-acrylamide, methylene bis-methacrylamide, 1,6-hexamethylene bis-acrylamide, 1,6-hexamethylene bis-methacrylamide, diethylenetriamine tris-acrylamide, xylylene bis-acrylamide, and xylylene bis-methacrylamide. Examples of other preferable amide monomers include those having a cyclohexylene structure described in JP-B No. 54-21726.

Alternatively, an urethane type addition-polymerizable compound produced by using addition reaction between an isocyanate and a hydroxyl group is also preferable, and specific examples thereof include a vinyl urethane compound containing two or more polymerizable vinyl groups in one molecule as described in JP-B No. 48-41708, which is obtained by adding a vinyl monomer containing a hydroxyl group represented by the following formula (A) to a polyisocyanate compound having two or more isocyanate groups in one molecule.

Formula $CH_2=C(R^{10})COOCH_2CH(R^{11})OH$ ($R^{10}$ and $R^{11}$ represent H or $CH_3$)

Urethane acrylates such as those described in JP-A No. 51-37193, JP-B Nos. 2-32293 and 2-16765; or the urethane compounds having an ethylene oxide-based skeleton described in JP-B Nos. 58-49860, 56-17654, 62-39417 and 62-39418, are also preferable. If the addition polymerizable compounds having an amino structure or a sulfide structure in the molecule, as described in JP-A Nos. 63-277653, 63-260909 and 1-105238, are used, a photopolymerizable composition that exhibits superior photosensitizing speed may be obtained.

Other examples include polyfunctional acrylates or methacrylates such as the polyester acrylates and epoxy acrylates obtained by reacting an epoxy resin and (meth)acrylic acid, such as those described in JP-A No. 48-64183, JP-B Nos. 49-43191 and 52-30490; the specific unsaturated compounds described in JP-B Nos. 46-43946, 1-40337 and 1-40336; and the vinylphosphonic acid-based compounds described in JP-A No. 2-25493. Under certain circumstances, the structure containing a perfluoroalkyl group described in JP-A No. 61-22048 is also suitably used. The compounds described in Journal of the Adhesion Society of Japan, Vol. 20, No. 7, pp. 300-308 (1984) as photocurable monomers and oligomers may also be used.

Details of these polymerizable compounds, such as the structure, the number of the compounds to be used in combination, the amount to be added, or the like may be arbitrarily determined according to the designed properties of the colored composition. For example, polymerizable compounds are selected in terms of the following aspects.

From the viewpoints of sensitivity, a structure containing more unsaturated groups per molecule is more preferable, and bi- or higher functional structure is typically preferred. Further, a tri- or higher functional compound is preferable in order to enhance the strength of the image portion, i.e., the cured film, and a method of controlling both sensitivity and strength by using compounds having different functional numbers or different kinds of polymerizable groups (for example, acrylic acid esters, methacrylic acid esters, styrene compounds and vinyl ether compounds) in combination is also effective. From the viewpoints of curing sensitivity, a compound having two or more (meth)acrylic acid ester structures is preferably used, more preferably three or more, and most preferably four or more. From the viewpoints of curing sensitivity, and developability of unexposed portions, a compound containing a carboxyl group or an EO-modified structure is preferable. From the viewpoints of curing sensitivity and the strength of exposed portions, a compound containing a urethane bond is preferably used.

The selection and the use of the polymerizable compound are important factors also in terms of compatibility and dispersibility with other components (for example, a resin, a photopolymerization initiator, and a pigment) in the colored composition. For example, the compatibility may be improved by using a compound having a low purity or by using two or more kinds of compounds in combination. It is also possible to select a specific structure in order to improve adhesion with respect to a substrate.

In view of the above, preferable examples include bisphenol A diacrylate, bisphenol A diacrylate EO-modified product, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, pentaerythritol tetraacrylate EO-modified product, dipentaerythritol hexaacrylate EO-modified product, and pentaerythritol triacrylate succinic acid monoester. Preferable examples of commercially available products include urethane oligomers UAS-10 and UAB-140 (all trade names, manufactured by Nippon Paper Industries Co., Ltd.), DPHA-40H (trade name, manufactured by Nippon Kayaku Co., Ltd.), UA-306H, UA-306T, UA-306I, AH-600, T-600 and AI-600 (all trade names, manufactured by Kyoeisha Chemical Co., Ltd.), and UA-7200 (trade name, manufactured by Shin-Nakamura Chemical Co., Ltd.)

Among them, bisphenol A diacrylate EO-modified product, pentaerythritol triacrylate, pentaerythritol tetraacrylate, dipentaerythritol pentaacrylate, dipentaerythritol hexaacrylate, tri(acryloyloxyethyl)isocyanurate, pentaerythritol tetraacrylate EO-modified product, dipentaerythritol hexaacrylate EO-modified product, and pentaerythritol triacrylate succinic acid monoester are more preferable. As the commercially available products, DPHA-40H (trade name, manufactured by Nippon Kayaku Co., Ltd.), and UA-306H, UA-306T, UA-306I, AH-600, T-600 and AI-600 (all trade names, manufactured by Kyoeisha Chemical Co., Ltd.) are more preferable.

The content of the polymerizable compound in the solid content of the colored composition of the present invention is preferably 1% by mass to 90% by mass, more preferably 5% by mass to 80% by mass, and still more preferably 10% by mass to 70% by mass.

<Polymerization Initiator>

The colored composition of the present invention may contain a polymerization initiator.

The colored composition preferably contains a photopolymerization initiator, which is a radiation-sensitive compound, as the polymerization initiator.

The photopolymerization initiator is a compound that decomposes with light to initiate and accelerate the polymerization of a polymerizable component, such as the above-mentioned polymerizable compound. In particular, the photopolymerization initiator is preferably a compound that absorbs light having a wavelength in a region of from 300 nm to 500 nm.

The photopolymerization initiator may also have a property to initiate polymerization with heat, in addition to the property to initiate the polymerization with light as described above.

Further, the photopolymerization initiators may be used alone or in a combination of two or more thereof.

Examples of the photopolymerization initiator used in the present invention include an organic halogenated compound, an oxodiazole compound, a carbonyl compound, a ketal compound, a benzoin compound, an acridine compound, an organic peroxide compound, an azo compound, a coumarin compound, an azide compound, a metallocene compound, a hexaaryl biimidazole compound, an organic borate compound, a disulfonic acid compound, an oxime compound, an onium salt compound, an acylphosphine(oxide) compound, and an alkylamino compound.

The following are details of the respective compounds.

Specific examples of the organic halogenated compound include compounds such as those described in Wakabayashi et al., "Bull Chem. Soc Japan" 42, 2924 (1969), U.S. Pat. No. 3,905,815, JP-B No. 46-4605, JP-A No. 48-36281, 55-32070, 60-239736, 61-169835, 61-169837, 62-58241, 62-212401, 63-70243 or 63-298339, M. P. Hutt "Journal of Heterocyclic Chemistry" 1 (No 3), (1970), or the like. In particular, an oxazole compound substituted by a trihalomethyl group and an s-triazine compound can be mentioned.

The s-triazine compound is more preferably an s-triazine derivative in which at least one mono-, di- or tri-halogen-substituted methyl group is bonded to an s-triazine ring. Specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the oxodiazole compound include 2-trichloromethyl-5-styryl-1,3,4-oxodiazole, 2-trichloromethyl-5-(cyanostyryl)-1,3,4-oxodiazole, 2-trichloromethyl-5-(naphth-1-yl)-1,3,4-oxodiazole, and 2-trichloromethyl-5-(4-styryl)styryl-1,3,4-oxodiazole.

Examples of the carbonyl compound include benzophenone and benzophenone derivatives such as Michler's ketone, 2-methylbenzophenone, 3-methylbenzophenone, 4-methylbenzophenone, 2-chlorobenzophenone, 4-bromobenzophenone or 2-carboxybenzophenone; acetophenone derivatives such as 2,2-dimethoxy-2-phenylacetophenone, 2,2-diethoxyacetophenone, 1-hydroxycyclohexyl phenyl ketone, α-hydroxy-2-methylphenyl propanone, 1-hydroxy-1-methylethyl-(p-isopropylphenyl)ketone, 1-hydroxy-1-(p-dodecylphenyl)ketone, 2-methyl-(4'-(methylthio)phenyl)-2-morpholino-1-propanone, 1,1,1-trichloromethyl-(p-butylphenyl) ketone or 2-benzyl-2-dimethylamino-4-morpholinobutyrophenone; thioxanthone and thioxanthone derivatives such as 2-ethylthioxanthone, 2-isopropylthioxanthone, 2-chlorothioxanthone, 2,4-dimethylthioxanthone, 2,4-diethylthioxanthone or 2,4-diisopropylthioxanthone; and benzoic acid ester derivatives such as ethyl p-dimethylaminobenzoate or ethyl p-diethylaminobenzoate.

Examples of the ketal compound include benzyl methyl ketal, and benzyl-β-methoxyethyl ethyl acetal.

Examples of the benzoin compound include m-benzoin isopropyl ether, benzoin isobutyl ether, benzoin methyl ether, and methyl-o-benzoyl benzoate.

Examples of the acridine compound include 9-phenyl acridine, and 1,7-bis(9-acridinyl)heptane.

Examples of the organic peroxide compound include trimethylcyclohexanone peroxide, acetylacetone peroxide, 1,1-bis(tert-butylperoxy)-3,3,5-trimethylcyclohexane, 1,1-bis (tert-butylperoxy)cyclohexane, 2,2-bis(tert-butylperoxy) butane, tert-butyl hydroperoxide, cumene hydroperoxide, diisopropylbenzene hydroperoxide, 2,5-dimethylhexane-2, 5-dihydroperoxide, 1,1,3,3-tetramethylbutyl hydroperoxide, tert-butylcumyl peroxide, dicumyl peroxide, 2,5-dimethyl-2, 5-di(tert-butylperoxy)hexane, 2,5-oxanoyl peroxide, succinic peroxide, benzoyl peroxide, 2,4-dichlorobenzoyl peroxide, diisopropylperoxy dicarbonate, di-2-ethylhexylperoxy dicarbonate, di-2-ethoxyethylperoxy dicarbonate, dimethoxyisopropylperoxy carbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy laurate, 3,3',4,4'-tetra-(t-butylperoxycarbonyl)benzophenone, 3,3',4, 4'-tetra-(t-hexylperoxycarbonyl)benzophenone, 3,3',4,4'-tetra-(p-isopropylcumylperoxycarbonyl)benzophenone, carbonyl di(t-butylperoxydihydrogen diphthalate), and carbonyl di(t-hexylperoxydihydrogen diphthalate).

Examples of the azo compound include azo compounds such as those described in JP-A No. 8-108621.

Examples of the coumarin compound include 3-methyl-5-amino-((s-triazin-2-yl)amino)-3-phenylcoumarin, 3-chloro-5-diethylamino-((s-triazin-2-yl)amino)-3-phenylcoumarin, and 3-butyl-5-dimethylamino-((s-triazin-2-yl)amino)-3-phenylcoumarin.

Examples of the azide compound include organic azide compounds such as those described in U.S. Pat. Nos. 2,848, 328, 2,852,379 and 2,940,853, and 2,6-bis(4-azidebenzylidene)-4-ethylcyclohexanone (BAC-E).

Examples of the metallocene compound include various titanocene compounds such as those described in JP-A Nos. 59-152396, 61-151197, 63-41484, 2-249, 2-4705 and 5-83588, for example, dicyclopentadienyl-Ti-bis-phenyl, dicyclopentadienyl-Ti-bis-2,6-difluorophen-1-yl, dicyclopentadienyl-Ti-bis-2,4-difluorophen-1-yl, dicyclopentadienyl-Ti-bis-2,4,6-trifluorophen-1-yl, dicyclopentadienyl-Ti-bis-2,3,5,6-tetrafluorophen-1-yl, dicyclopentadienyl-Ti-bis-2,3,4,5,6-pentafluorophen-1-yl, dimethylcyclopentadienyl-Ti-bis-2,6-difluorophen-1-yl, dimethylcyclopentadienyl-Ti-bis-2,4,6-trifluorophen-1-yl, dimethylcyclopentadienyl-Ti-bis-2,3,5,6-tetrafluorophen-1-yl, dimethylcyclopentadienyl-Ti-bis-2,3,4,5,6-pentafluorophen-1-yl, and iron-arene complexes such as those described in JP-A No. 1-304453 and 1-152109.

Examples of the hexaaryl biimidazole compound include various compounds such as those described in JP-B No. 6-29285, U.S. Pat. Nos. 3,479,185, 4,311,783 and 4,622,286. Specific examples thereof include 2,2'-bis(o-chlorophenyl)-4,4',5,5'-tetraphenyl biimidazole, 2,2'-bis(o-bromophenyl)-4,4',5,5'-tetraphenyl biimidazole, 2,2'-bis(o,p-dichlorophenyl)-4,4',5,5'-tetraphenyl biimidazole, 2,2'-bis(o-chlorophenyl)-4,4',5,5'-tetra(m-methoxyphenyl) biimidazole, 2,2'-bis(o,o'-dichlorophenyl)-4,4',5,5'-tetraphenyl biimidazole, 2,2'-bis(o-nitrophenyl)-4,4',5,5'-tetraphenyl biimidazole, 2,2'-bis(o-methylphenyl)-4,4',5,5'-tetraphenyl biimidazole, and 2,2'-bis(o-trifluorophenyl)-4,4', 5,5'-tetraphenyl biimidazole.

Specific examples of the organic borate compound include organic borates such as those described in, for example, JP-A Nos. 62-143044, 62-150242, 9-188685, 9-188686, 9-188710, 2000-131837, 2002-107916 and 2002-116539, Japanese Patent No. 2764769, and Kunz, Martin "Rad Tech '98. Proceeding Apr. 19-22, 1998, Chicago"; organic boron sulfonium complexes or organic boron oxosulfonium complexes such as those described in JP-A Nos. 6-157623, 6-175564 and 6-175561; organic boron iodonium complexes such as those described in JP-A Nos. 6-175554 and 6-175553; organic boron phosphonium complexes such as those described in JP-A No. 9-188710; and organic boron transition metal-coordinated complexes such as those described in JP-A Nos. 6-348011, 7-128785, 7-140589, 7-306527 and 7-292014.

Examples of the disulfonic acid compound include compounds such as those described in JP-A No. 61-166544 and 2002-328465.

Examples of the oxime compound include compounds such as those described in J. C. S. Perkin II (1979) 1653-1660, J. C. S. Perkin II (1979) 156-162, Journal of Photopolymer Science and Technology (1995) 202-232 and JP-A No. 2000-66385; and compounds such as those described in JP-A No. 2000-80068 and PCT Japanese Translation Patent Publication No. 2004-534797.

Examples of the onium salt compound include diazonium salts such as those described in S. I. Schlesinger, Photogr. Sci. Eng., 18, 387 (1974) and T. S. Bal et al., Polymer, 21, 423 (1980); ammonium salts such as those described in U.S. Pat. No. 4,069,055, JP-A No. 4-365049, and the like; phosphonium salts such as those described in U.S. Pat. Nos. 4,069,055 and 4,069,056; and iodonium salts such as those described in EP-A No. 104,143 and JP-A Nos. 2-150848 and 2-296514.

The iodonium salt that can be used in the present invention is a diaryl iodonium salt. From the viewpoints of stability, the diaryl iodonium salt is preferably substituted by two or more electron-donating groups such as an alkyl group, an alkoxy group or an aryloxy group.

Examples of the sulfonium salt that can be used in the present invention include sulfonium salts such as those described in EP-A Nos. 370,693, 390,214, 233,567, 297,443 and 297,442, U.S. Pat. Nos. 4,933,377, 4,161,811, 4,760,013, 4,734,444 and 2,833,827, and German Patent Nos. 2,904, 626, 3,604,580 and 3,604,581. The sulfonium salt is preferably substituted by an electron-withdrawing group from the viewpoints of stability and sensitivity. The electron-withdrawing group preferably has a Hammett value of higher than 0. Examples of the preferable electron-withdrawing group include a halogen atom and a carboxylic acid group.

In addition, examples of other preferable sulfonium salts include a triaryl sulfonium salt that has one substituent having a coumarin or anthraquinone structure, and absorbs light having a wavelength of 300 nm or higher. Another preferable sulfonium salt is a triaryl sulfonium salt that has an aryloxy group or an arylthio group as a substituent and absorbs light having a wavelength of 300 nm or more.

Examples of the onium salt compound also include selenonium salts such as those described in J. V. Crivello et al, Macromolecules, 10(6), 1307 (1977) and J. V. Crivello et al, J. Polymer Sci. Polymer Chem. Ed., 17, 1047 (1979), and arsonium salts such as those described in C. S. Wen et al, Teh, Proc. Conf. Rad. Curing ASIA, p 478 Tokyo, October (1988).

Examples of the acylphosphine (oxide) compound include IRGACURE 819, DAROCURE 4265 and DAROCURE TPO (all trade names, manufactured by BASF).

Examples of the alkylamino compound include a compound having a dialkylamino phenyl group and an alkylamine compound, such as those described in paragraph [0047] of JP-A No. 9-281698, JP-A Nos. 6-19240 and 6-19249. Specific examples of the compound having a dialkylamino phenyl group include compounds such as ethyl p-dimethylaminobenzoate, and dialkylamino phenyl carbaldehyde such as p-diethylamino benzcarbaldehyde or 9-julolidyl carbaldehyde, and specific examples of the alkylamine compound include triethanolamine, diethanolamine and triethylamine.

The above-mentioned initiators may be optionally used as the photopolymerization initiator. From the viewpoints of exposure sensitivity, a triazine compound (s-triazine compound) of an organic halogenated compound, a ketal compound, a benzoin compound, a metallocene compound, a hexaaryl biimidazole compound, an oxime compound, an acyl phosphine(oxide) compound or a hexaalkylamino compound is more preferable; at least one compound selected from the group consisting of a triazine compound, an oxime compound, a hexaaryl biimidazole compound and an alkylamino compound is still more preferable; and an oxime compound is most preferable.

In particular, when the colored composition of the present invention is used in the formation of colored pixels of a color filter of a solid-state image sensor, the concentration of a pigment in the composition increases in terms of formulation, whereby the amount of the photopolymerization initiator decreases to lower the sensitivity. Further, when exposure is carried out using a stepper, the use of an initiator that generates a halogen-containing compound during, such as a triazine compound, may cause corrosion of the equipment. Taking into consideration these problems, an oxime compound is a preferred photopolymerization initiator that satisfies sensitivity and other performances. In particular, an oxime compound which absorbs light at a wavelength of 365 nm is most preferred.

In the present invention, among the oxime compounds, a compound represented by the following formula (d) is preferable from the viewpoints of sensitivity, stability over time, and coloration during post-heating. Other compounds such as IRGACURE OXE-01 and OXE-02 (trade names, manufactured by BASF Japan) are also preferable.

Formula (d)

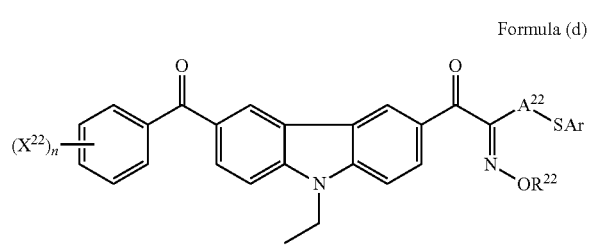

In the formula (d), $R^{22}$ and $X^{22}$ each independently represents a monovalent substituent, $A^{22}$ represents a divalent organic group, Ar represents an aryl group, and n represents an integer from 1 to 5.

$R^{22}$ is preferably an acyl group in terms of increasing sensitivity. Specifically, an acetyl group, a propionyl group, a benzoyl group or a tolyl group is preferable.

From the viewpoints of increasing the sensitivity and inhibiting the coloration by heating over time, $A^{22}$ is preferably an unsubstituted alkylene group, an alkylene group substituted by an alkyl group (for example, a methyl group, an ethyl group, a tert-butyl group or a dodecyl group), an alkylene group substituted by an alkenyl group (for example, a vinyl group or an allyl group), or an alkylene group substituted by an aryl group (for example, a phenyl group, a p-tolyl group, a xylyl group, a cumenyl group, a naphthyl group, an anthryl group, a phenanthryl group or a styryl group).

From the viewpoints of increasing the sensitivity and inhibiting the coloration by heating over time, Ar is preferably a substituted or unsubstituted phenyl group. When Ar is a substituted phenyl group, the substituent is preferably a halogen group such as a fluorine atom, a chlorine atom, a bromine atom or an iodine atom.

From the viewpoints of improving the solvent solubility and the absorption efficiency in a long-wavelength region, $X^{22}$ is preferably an alkyl group which may have a substituent, an aryl group which may have a substituent, an alkenyl group which may have a substituent, an alkynyl group which may have a substituent, an alkoxy group which may have a substituent, an aryloxy group which may have a substituent, an alkylthioxy group which may have a substituent, an arylthioxy group which may have a substituent, or an amino group which may have a substituent.

Further, n in the formula (d) preferably represents an integer of 1 to 2.

The following are specific examples of the oxime compound suitable for the colored composition of the present invention, but the present invention is not limited thereto.

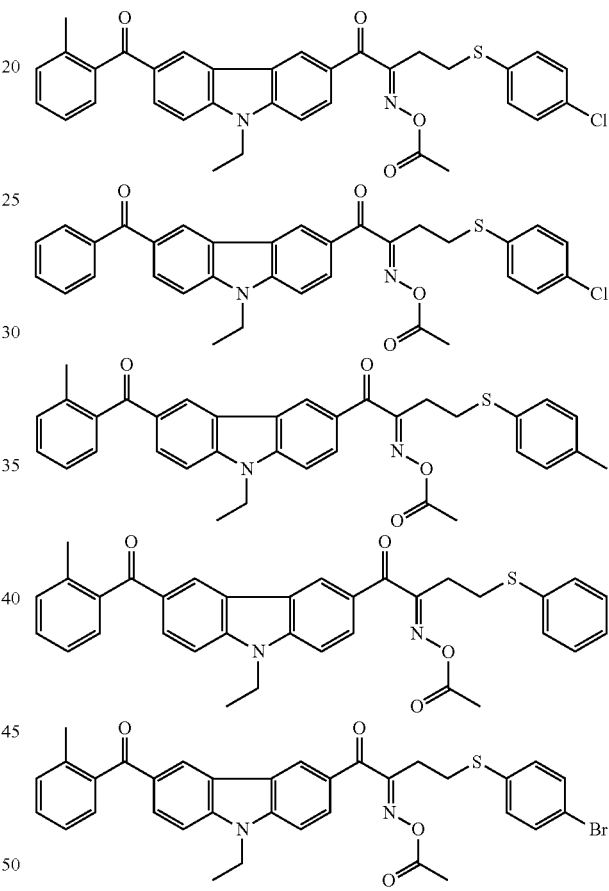

The content of the photopolymerization initiator in the colored composition of the present invention is preferably in the range of from 0.1% by mass to 50% by mass, more preferably from 0.5% by mass to 30% by mass, and particularly preferably from 1% by mass to 20% by mass, with respect to the total solid content of the composition. When the content of the photopolymerization initiator is within the above range, favorable sensitivity and pattern formability can be achieved.

<Naphthoquinonediazide Compound>

When the colored composition of the present invention is a positive-type (positive-working) colored photosensitive composition, it is preferable to include a naphthoquinonediazide compound as a radiation-sensitive compound in the colored composition of the present invention.

The naphthoquinonediazide compound is a compound having at least one o-quinonediazide group, and examples thereof include o-naphthoquinonediazide-5-sulfonic acid ester, o-naphthoquinonediazide-5-sulfonic acid amide, o-naphthoquinonediazide-4-sulfonic acid ester, and o-naphthoquinonediazide-4-sulfonic acid amide. These ester or amide compounds may be produced by, for example, a known method using a phenol compound represented by the formula (I) described in JP-A Nos. 2-84650 and 3-49437.

In a case in which the colored composition of the present invention is a positive-type colored photosensitive composition, the content of the naphthoquinonediazide compound in the colored composition is preferably in the range of from 2% by mass to 50% by mass, and more preferably from 2% by mass to 30% by mass.

<Alkali-Soluble Resin>

The colored composition of the present invention preferably further contains an alkali-soluble resin. When the colored composition includes an alkali-soluble resin, the developability and the pattern formability can be improved.

The alkali-soluble resin is a linear organic polymer and may be appropriately selected from alkali-soluble resins having at least one group that promotes alkali solubility (such as a carboxyl group, a phosphonate group or a sulfonate group) in the molecule (preferably a molecule in which an acrylic copolymer or a styrene copolymer forms a main chain). Among them, a resin which is soluble in an organic solvent and is developable by a weak alkali aqueous solution is more preferable.

For the production of the alkali-soluble resin, for example, a known radical polymerization method is applicable. Polymerization conditions for producing an alkali-soluble resin by a radical polymerization method, such as the temperature, the pressure, the type or the amount of a radical initiator, and the type of a solvent are easy to determine for a person skilled in the art, and these conditions can be determined through experimentation.

The linear organic polymer used as the alkali-soluble resin is preferably a polymer having carboxylic acid at the side chain thereof, and examples thereof include a methacrylic acid copolymer, an acrylic acid copolymer, an itaconic acid copolymer, a crotonic acid copolymer, a maleic acid copolymer and a partially esterified maleic acid copolymer, and an acidic cellulose derivative having carboxylic acid at a side chain thereof, and a polymer obtained by adding an acid anhydride to a hydroxyl group-containing polymer. In particular, a copolymer of (meth)acrylic acid and a further monomer that can be copolymerized with (meth)acrylic acid is suitable as the alkali-soluble resin. Examples of such monomers copolymerizable with (meth)acrylic acid include alkyl (meth)acrylate, aryl(meth)acrylate, and a vinyl compound. Specific examples of the alkyl(meth)acrylate and aryl(meth) acrylate include methyl(meth)acrylate, ethyl(meth)acrylate, propyl(meth)acrylate, butyl(meth)acrylate, isobutyl(meth) acrylate, pentyl(meth)acrylate, hexyl(meth)acrylate, octyl (meth)acrylate, phenyl(meth)acrylate, benzyl(meth)acrylate, tolyl(meth)acrylate, naphthyl(meth)acrylate, and cyclohexyl (meth)acrylate. Examples of the vinyl compound include styrene, α-methyl styrene, vinyl toluene, glycidyl methacrylate, acrylonitrile, vinyl acetate, N-vinyl pyrrolidone, tetrahydrofurfuryl methacrylate, a polystyrene macromonomer, and a polymethylmethacrylate macromonomer.

The alkali-soluble resin is preferably a polymer (a) obtained by polymerizing monomer components in which a compound represented by the following formula (ED) (hereinafter, also referred to as "ether dimer") as an essential monomer component is included.

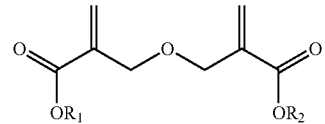

formula (ED)

In the formula (ED), $R^1$ and $R^2$ each independently represents a hydrogen atom or a hydrocarbon group having 1 to 25 carbon atoms which may have a substituent.

Since the colored composition of the present invention contains the polymer (a), heat resistance and transparency of a cured coating film formed from the composition can be further improved.

In the formula (ED) representing an ether dimer, the hydrocarbon group having 1 to 25 carbon atoms which may have a substituent, represented by $R^1$ and $R^2$, is not particularly limited, and examples thereof include a linear or branched alkyl group such as a methyl group, an ethyl group, an n-propyl group, an isopropyl group, an n-butyl group, an isobutyl group, a t-butyl group, a t-amyl group, a stearyl group, a lauryl group or a 2-ethyl hexyl group; an aryl group such as a phenyl group; a cycloaliphatic group such as a cyclohexyl group, a t-butyl cyclohexyl group, a dicyclopentadienyl group, a tricyclodecanyl group, an isobornyl group, an adamantyl group or a 2-methyl-2-adamantyl group; an alkoxy group-substituted alkyl group such as a 1-methoxyethyl group or a 1-ethoxyethyl group; and an aryl group-substituted alkyl group such as a benzyl group. Among these, the substituent is particularly preferably a group of primary or secondary carbon, which is not readily detached by acid or heat, such as a methyl group, an ethyl group, a cyclohexyl group or a benzyl group, is preferable from the viewpoints of heat resistance.

Specific examples of the ether dimer include: dimethyl-2,2'-[oxybis(methylene)]bis-2-propenoate, diethyl-2,2'-[oxybis(methylene)]bis-2-propenoate, di(n-propyl)-2,2'-[oxybis(methylene)]bis-2-propenoate, di(isopropyl)-2,2'-[oxybis(methylene)]bis-2-propenoate, di(n-butyl)-2,2'-[oxybis(methylene)]bis-2-propenoate, di(isobutyl)-2,2'-[oxybis(methylene)]bis-2-propenoate, di(t-butyl)-2,2'-[oxybis(methylene)]bis-2-propenoate, di(t-amyl)-2,2'-[oxybis(methylene)]bis-2-propenoate, di(stearyl)-2,2'-[oxybis(methylene)]bis-2-propenoate, di(lauryl)-2,2'-[oxybis(methylene)]bis-2-propenoate, di(2-ethylhexyl)-2,2'-[oxybis(methylene)]bis-2-propenoate, di(1-methoxyethyl)-2,2'-[oxybis(methylene)]bis-2-propenoate, di(1-ethoxyethyl)-2,2'-[oxybis(methylene)]bis-2-propenoate, dibenzyl-2,2'-[oxybis(methylene)]bis-2-propenoate, diphenyl-2,2'-[oxybis(methylene)]bis-2-propenoate, dicyclohexyl-2,2'-[oxybis(methylene)]bis-2-propenoate, di(t-butylcyclohexyl)-2,2'-[oxybis(methylene)]bis-2-propenoate, di(dicyclopentadienyl)-2,2'-[oxybis(methylene)]bis-2-propenoate, di(tricyclodecanyl)-2,2'-[oxybis(methylene)]bis-2-propenoate, di(isobornyl)-2,2'-[oxybis(methylene)]bis-2-propenoate, diadamantyl-2,2'-[oxybis(methylene)]bis-2-propenoate, di(2-methyl-2-adamantyl)-2,2'-[oxybis(methylene)]bis-2-propenoate, and the like.

Among these, dimethyl-2,2'-[oxybis(methylene)]bis-2-propenoate, diethyl-2,2'-[oxybis(methylene)]bis-2-propenoate, dicyclohexyl-2,2'-[oxybis(methylene)]bis-2-propenoate, and dibenzyl-2,2'-[oxybis(methylene)]bis-2-propenoate are preferred.

These ether dimers may be used alone or in a combination of two or more thereof.

The structure derived from the compound represented by the formula (ED) may be formed by including other monomers for copolymerization.

Among these, a benzyl(meth)acrylate/(meth)acrylic acid copolymer or a multi-component copolymer of benzyl(meth) acrylate/(meth)acrylic acid/other monomer(s) is particularly preferable. Other examples include a copolymer formed by including 2-hydroxyethyl methacrylate, and copolymers described in JP-A No. 7-140654, such as a 2-hydroxypropyl (meth)acrylate/polystyrene macromonomer/benzyl methacrylate/methacrylic acid copolymer, a 2-hydroxy-3-phenoxypropyl acrylate/polymethyl methacrylate macromonomer/ benzyl methacrylate/methacrylic acid copolymer, a 2-hydroxyethyl methacrylate/polystyrene macromonomer/ methyl methacrylate/methacrylic acid copolymer, and a 2-hydroxyethyl methacrylate/polystyrene macromonomer/ benzyl methacrylate/methacrylic acid copolymer.

Further, an alkali-soluble resin having a polymerizable group may be used to improve the crosslinking efficiency of the colored composition according to the present invention.

As the alkali-soluble resin having a polymerizable group, an alkali-soluble resin containing an ally group, a (meth) acrylic group or an aryloxyalkyl group at a side chain thereof is useful. Preferable examples of the alkali-soluble resin having a polymerizable group include:

an urethane-modified acrylic resin containing a polymerizable double bond obtained by reacting an isocyanate group and an OH group in advance, while leaving one isocyanate group being unreacted, and reacting a compound containing a (meth)acryloyl group and an acrylic resin containing a carboxyl group;

an acrylic resin containing an unsaturated group obtained by reacting an acrylic resin containing a carboxyl group and a compound having both an epoxy group and a polymerizable double bond in the molecule;

an acrylic resin containing a polymerizable double bond obtained by reacting an acid pendant-type epoxy acrylate resin, an acrylic resin containing an OH group, and a dibasic acid anhydride having a polymerizable double bond;

a resin obtained by reacting an acrylic resin containing an OH group, an isocyanate and a compound having a polymerizable group; and a resin obtained by basic treatment of a resin containing, at a side chain thereof, an ester group having a leaving group such as a halogen atom or a sulfonate group, at the α- or β-position, as described in JP-A Nos. 2002-229207 and 2003-335814.

The acid value of the alkali-soluble resin is preferably in the range of from 30 mgKOH/g to 200 mgKOH/g, more preferably from 50 mgKOH/g to 150 mgKOH/g, and most preferably from 70 mgKOH/g to 120 mgKOH/g.

The weight-average molecular weight (Mw) of the alkali-soluble resin is preferably in the range of from 2,000 to 50,000, more preferably from 5,000 to 30,000, and most preferably from 7,000 to 20,000.

The content of the alkali-soluble resin in the colored composition is preferably in the range of from 1% by mass to 15% by mass, more preferably from 2% by mass to 12% by mass, and particularly preferably from 3% by mass to 10% by mass, with respect to the total solid content of the composition.

(Alkali-Soluble Phenol Resin)

When the colored composition of the present invention is a positive-type colored photosensitive composition, an alkali-soluble phenol resin may be used as a binder. An alkali-soluble phenol resin may be suitably used in a case in which the colored photosensitive composition of the present invention is a positive-type composition. Examples of the alkali-soluble phenol resin include a novolak resin and a vinyl polymer.

Examples of the novolak resin include products obtained by condensing a phenol with an aldehyde in the presence of an acid catalyst. Examples of the phenols include phenol, cresol, ethylphenol, butylphenol, xylenol, phenylphenol, catechol, resorcinol, pyrogallol, naphthol and bisphenol A.

Examples of the aldehydes include formaldehyde, p-formaldehyde, acetaldehyde, propionaldehyde and benzaldehyde.

The phenols and the aldehydes may be used alone or in a combination of two or more kinds thereof.

Specific examples of the novolak resin include condensates of m-cresol, p-cresol or a mixture thereof with formalin.

The molecular weight distribution of the novolak resin may be controlled by means of, for example, fractionation. Further, a low-molecular weight component having a phenolic hydroxyl group, such as bisphenol C or bisphenol A, may be mixed in the novolak resin.

<Crosslinking Agent>

The colored composition of the present invention may contain a crosslinking agent.

The crosslinking agent is not particularly limited as long as the film is cured by crosslinking reaction. Examples of the crosslinking agent include: (a) an epoxy resin; (b) a melamine compound, a guanamine compound, a glycoluryl compound or a urea compound, each of which is substituted by at least one group selected from a methylol group, an alkoxymethyl group and an acyloxymethyl group; and (c) a phenol compound, a naphthol compound or a hydroxyanthracene compound, each of which is substituted by at least one group selected from a methylol group, an alkoxymethyl group and an acyloxymethyl group. Among them, a polyfunctional epoxy resin is preferable as the crosslinking agent.

The (a) epoxy resin is not particularly limited, as long as it is crosslinkable and has an epoxy group. Examples thereof include divalent glycidyl group-containing low-molecular weight compounds such as bisphenol A diglycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline; trivalent glycidyl group-containing low-molecular weight compounds represented by trimethylolpropane triglycidyl ether, trimethylolphenol triglycidyl ether, and TrisP-PA triglycidyl ether; tetravalent glycidyl group-containing low-molecular weight compounds represented by pentaerythritol tetraglycidyl ether and tetramethylol bisphenol A tetraglycidyl ether; polyvalent glycidyl group-containing low-molecular weight compounds such as dipentaerythritol pentaglycidyl ether and dipentaerythritol hexaglycidyl ether; and glycidyl group-containing high-molecular weight compounds represented by polyglycidyl(meth)acrylate and a 1,2-epoxy-4-(2-oxiranyl)cyclohexane adduct of 2,2-bis(hydroxymethyl)-1-butanol.

The number of the substituents in the crosslinking agent (b), which are selected from a methylol group, an alkoxymethyl group and an acyloxymethyl group, is from 2 to 6 in the case of a melamine compound, and from 2 to 4 in the case of a glycoluril compound, a guanamine compound or a urea compound. Preferably, the number of the substituents is from 5 to 6 in the case of a melamine compound, and from 3 to 4 in the case of a glycoluril compound, a guanamine compound or a urea compound.

Hereinafter, the (b) melamine compound, guanamine compound, glycoluril compound and urea compound may be collectively referred to as a compound relating to (b) (a methylol group-containing compound, an alkoxymethyl group-containing compound or an acyloxymethyl group-containing compound).

The methylol group-containing compound relating to (b) is obtained by heating the alkoxymethyl group-containing compound relating to (b) in an alcohol in the presence of an acid catalyst such as hydrochloric acid, sulfuric acid, nitric acid or methanesulfonic acid. The acyloxymethyl group-containing compound relating to (b) is obtained by mixing the methylol group-containing compound relating to (b) and an acyl chloride while stirring, in the presence of a basic catalyst.

Specific examples of the compounds having the foregoing substituents and relating to (b) will be given below.

Examples of the melamine compound include hexamethylolmelamine, hexamethoxymethylmelamine, compounds in which one to five methylol groups of hexamethylolmelamine are methoxymethylated or a mixture thereof, hexamethoxyethylmelamine, hexaacyloxymethylmelamine, and compounds in which one to five methylol groups in hexamethylolmelamine are acyloxymethylated or a mixture thereof.

Examples of the guanamine compound include tetramethylolguanamine, tetramethoxymethylguanamine, compounds in which from one to three methylol groups in tetramethylolguanamine are methoxymethylated or a mixture thereof, tetramethoxyethylguanamine, tetraacyloxymethylguanamine, and compounds in which from one to three methylol groups in tetramethylolguanamine are acyloxymethylated or a mixture thereof.

Examples of the glycoluril compound include tetramethylolglycoluril, tetramethoxymethylglycoluryl, compounds in which one to three methylol groups in tetramethyloylglycoluryl are methoxymethylated or a mixture thereof, and compounds in which one to three methylol groups in tetramethylolglycoluryl are acyloxymethylated or a mixture thereof.

Examples of the urea compound include tetramethylolurea, tetramethoxymethylurea, compounds in which one to three methylol groups in tetramethylolurea are methoxymethylated or a mixture thereof, and tetramethoxyethylurea.

The compounds relating to (b) may be used alone or in a combination thereof.

The crosslinking agent (c), i.e., a phenol compound, a naphthol compound or a hydroxyanthracene compound, which is substituted by at least one group selected from a methylol group, an alkoxymethyl group and an acyloxymethyl group, contributes not only to suppressed intermixing with a topcoat photoresist but also to further increase in film strength by thermal crosslinking, similarly to the case of the crosslinking agent (b) described above.

Hereinafter, these compounds may be collectively referred to as a compound relating to (c) (a methylol group-containing compound, an alkoxymethyl group-containing compound or an acyloxymethyl group-containing compound).

The number of a methylol group, an acyloxymethyl group and an alkoxymethyl group in the crosslinking agent (c) should be at least two per molecule. A phenolic compound in which all of the 2- and 4-positions of a phenolic compound, which serves as the skeleton, are substituted is preferable from the viewpoints of thermal crosslinking properties and storage stability. Further, as the naphthol compound or hydroxyanthracene compound to serve as the skeleton, compounds in which all of the ortho- and para-positions with respect to the OH group are substituted are preferable. The 3- or 5-position of the phenol compound that serves as the skeleton may be substituted or unsubstituted. Further, in the naphthol compound that serves as the skeleton, positions other than the ortho-position with respect to the OH group may be substituted or unsubstituted.

The methylol group-containing compound relating to (c) is obtained by reacting, as a starting material, a compound having a hydrogen atom at the ortho- or para-position (2- or 4-position) with respect to the phenolic OH group with formalin in the presence of a basic catalyst such as sodium hydroxide, potassium hydroxide, ammonia or a tetraalkylammonium hydroxide.

The alkoxymethyl group-containing compound relating to (c) is obtained by heating the methylol group-containing compound relating to (c) in an alcohol in the presence of an acid catalyst such as hydrochloric acid, sulfuric acid, nitric acid or methanesulfonic acid.

The acyloxymethyl group-containing compound relating to (c) is obtained by reacting the methylol group-containing compound relating to (c) with an acyl chloride in the presence of a basic catalyst.

Examples of the skeleton compound in the crosslinking agent (c) include a phenol compound, a naphthol compound and a hydroxyanthracene compound in which the ortho- or para-position with respect to the phenolic OH group is unsubstituted, such as phenol, isomers of cresol, 2,3-xylenol, 2,5-xylenol, 3,4-xylenol, 3,5-xylenol, bisphenols (such as bisphenol A), 4,4'-bishydroxybiphenyl, TRISP-PA (trade name, manufactured by Honshu Chemical Industry Co., Ltd.), naphthol, dihydroxynaphthalene and 2,7-dihydroxyanthracene.

Specific examples of the crosslinking agent (c) include trimethylolphenol, tri(methoxymethyl)phenol, compounds in which one to two methylol groups of trimethylolphenol are methoxymethylated, trimethylol-3-cresol, tri(methoxymethyl)-3-cresol, compounds in which one to two methylol groups of trimethylol-3-cresol are methoxymethylated, dimethylolcresol such as 2,6-dimethylol-4-cresol, tetramethylol bisphenol A, tetramethoxymethyl bisphenol A, compounds in which one to three methylol groups of tetramethylol bisphenol A are methoxymethylated, tetramethylol-4,4'-bishydroxybiphenyl, tetramethoxymethyl-4,4'-bishydroxybiphenyl, a hexamethylol compound of TrisP-PA, a hexamethoxymethyl compound of TrisP-PA, compounds in which one to five methylol groups of a hexamethylol compound of TrisP-PA are methoxymethylated, and bishydroxymethylnaphthalenediol.

As an example of the hydroxyanthracene compounds, 1,6-dihydroxymethyl-2,7-dihydroxyanthracene is mentioned.

Examples of the acyloxymethyl group-containing compound include compounds in which a part or all of the methylol groups in the foregoing methylol group-containing compounds are acyloxymethylated.

Among these compounds, preferable are trimethylolphenol, bishydroxymethyl-p-cresol, tetramethylol bisphenol A, a hexamethylol compound of TrisP-PA (manufactured by Honshu Chemical Industry Co., Ltd.), and phenol compounds in which the methylol groups in the foregoing compounds are substituted by an alkoxymethyl group or both a methylol group and an alkoxymethyl group.

These compounds relating to (c) may be used alone or in a combination of two or more kinds thereof.

When the colored composition of the present invention contains a crosslinking agent, the total content of the crosslinking agent is preferably from 1% by mass to 70% by mass, more preferably from 5% by mass to 50% by mass, and particularly preferably from 7% by mass to 30% by mass, with respect to the total solid content (mass) of the composition.

When the total content of the crosslinking agent is within the above-specified range, a sufficient curing degree and a sufficient dissolution property of uncured portions may be retained, and deficiency in the curing degree at cured portions, and significant reduction in the dissolution property in uncured portions may be suppressed.

<Solvent>

The colored composition of the present invention may contain a solvent.

The applications of the colored composition according to the present invention are not particularly limited, but for example, specifically, the colored composition of the present invention may be used in the fabrication of a color filter by a photolithographic method, or in the fabrication of a color filter by an ink-jet method.

In addition, solvents or other additives are optionally appropriately used in view of the desired applications or the like.

The following is to explain a case in which the colored composition of the present invention is used in the fabrication of a color filter by a photolithographic method.

The colored composition of the present invention (a colored composition in the form of a colored photosensitive composition) used in a photolithographic method preferably includes a solvent.

Examples of the solvent include liquids selected from the following organic solvents, and the solvent may be selected based on the solubility and coatability of respective components in the colored composition. The solvent to be used is not particularly limited insofar as it satisfies such properties, but is preferably selected after consideration of the safety.

Specific examples of the solvent include esters such as ethyl acetate, n-butyl acetate, isobutyl acetate, amyl formate, isoamyl acetate, butyl propionate, isopropyl butyrate, ethyl butyrate, butyl butyrate, methyl oxyacetate, ethyl oxyacetate, butyl oxyacetate, methyl methoxyacetate, ethyl methoxyacetate, butyl methoxyacetate, methyl ethoxyacetate, ethyl ethoxyacetate, methyl 3-oxypropionate, ethyl 3-oxypropionate, methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate, ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate;

ethers such as diethylene glycol dimethyl ether, tetrahydrofuran, ethylene glycol monomethyl ether, ethylene glycol monoethyl ether, methyl cellosolve acetate(ethylene glycol monomethyl ether acetate), ethyl cellosolve acetate(ethylene glycol monoethyl ether acetate), diethylene glycol monomethyl ether, diethylene glycol monoethyl ether, diethylene glycol monobutyl ether, diethylene glycol monoethyl ether acetate, diethylene glycol monobutyl ether acetate, propylene glycol methyl ether, propylene glycol monomethyl ether acetate, propylene glycol ethyl ether acetate, and propylene glycol propyl ether acetate; ketones such as methyl ethyl ketone, cyclohexanone, 2-heptanone and 3-heptanone; and aromatic hydrocarbons such as toluene and xylene.

Among them, methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, diethylene glycol monoethyl ether acetate, diethylene glycol monobutyl ether acetate, propylene glycol methyl ether, and propylene glycol monomethyl ether acetate (PGMEA) are more preferable.

Although these solvents may be used alone, it is also preferable to use a mixture of two or more kinds from the viewpoints of solubility of an ultraviolet absorbent and an alkali-soluble resin, improvements in the coating surface, or the like. In this case, a mixed solution of two or more kinds selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether and propylene glycol methyl ether acetate, is particularly preferable.

The content of the solvent in the colored composition of the present invention is preferably in the range of from 50% by mass to 90% by mass, more preferably from 60% by mass to 95% by mass, and most preferably from 70% by mass to 90% by mass. The content of the solvent within the above-specified range is advantageous from the viewpoints of suppressing the occurrence of foreign materials.

Further, when the colored composition is used in the fabrication of a color filter by an ink-jet method, as will be described hereinafter, the content of the solvent (D) is preferably lower from the viewpoints of curability, and the solvent (D) may not be used at all in some embodiments.

<Surfactant>

From the viewpoints of improving the coatability, various kinds of surfactants may be added to the colored composition of the present invention. Various surfactants such as a fluorosurfactant, a nonionic surfactant, a cationic surfactant, an anionic surfactant, and a silicone surfactant can also be used as the surfactant.

In particular, when the colored composition of the present invention contains a fluorosurfactant, liquid properties (in particular, fluidity) of the colored composition when it is prepared as a coating solution may be further improved. As a result, uniformity in coating thickness may be further improved and the amount of liquid to be used may be further decreased.

In other words, when a film is formed using a coating solution which is a colored composition containing a fluorosurfactant, a surface tension of the coating solution with respect to a surface to be coated is decreased and wettability with respect to the surface to be coated is improved, thereby improving coatability of the coating solution. Accordingly, a film having a thickness with suppressed unevenness can be suitably formed even when a thin film having a thickness of several micrometers is formed with a small liquid amount.

The content of fluorine in the fluorosurfactant is preferably in the range of from 3% by mass to 40% by mass, more preferably from 5% by mass to 30% by mass, and particularly preferably from 7% by mass to 25% by mass. A fluorosurfactant containing fluorine in an amount within the above range is effective in terms of forming a coating film with suppressed thickness unevenness and reducing the amount of the coating solution to be used, and also exhibits favorable solubility in the colored composition.

Examples of the fluorosurfactant include MEGAFAC F171, MEGAFAC F172, MEGAFAC F173, MEGAFAC F176, MEGAFAC F177, MEGAFAC F141, MEGAFAC F142, MEGAFAC F143, MEGAFAC F144, MEGAFAC R30, MEGAFAC F437, MEGAFAC F479, MEGAFAC F482, MEGAFAC F780, MEGAFAC F781 (all trade names, manufactured by DIC Corporation), FLUORAD FC430, FLUORAD FC431, FLUORAD FC171 (all trade names, manufactured by Sumitomo 3M Limited.), SURFLON S-382, SURFLON SC-101, SURFLON SC-103, SURFLON SC-104, SURFLON SC-105, SURFLON SC-1068, SURFLON SC-381, SURFLON SC-383, SURFLON SC393, SURFLON KH-40 (all trade names, manufactured by Asahi Glass Co., Ltd.), and CW-1 (trade name, manufactured by AstraZeneca K.K.).

Specific examples of the nonionic surfactant include glycerol propoxylate, polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, sorbitan fatty acid ester (PLURONIC L10, L31, L61, L62, 10R5, 17R2, 25R2, TETRONIC 304, 701, 704, 901, 904, 150R1, all trade names, manufactured by BASF Japan).

Specific examples of the cationic surfactant include phthalocyanine derivatives (trade name: EFKA-745, manufactured by Morishita & Co., Ltd.), organosiloxane polymer KP341 (trade name, manufactured by Shin-Etsu Chemical Co., Ltd.), (meth)acrylic (co)polymers POLYFLOW No. 75, No. 90 and No. 95 (trade name, manufactured by Kyoeisha Chemical Co., Ltd.), and W001 (trade name, available from Yusho Co., Ltd.).

Specific examples of the anionic surfactant include W004, W005, and W017 (all trade names, available from Yusho Co., Ltd.).

Examples of the silicone surfactant include TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, TORAY SILICONE SH8400 (all trade names, manufactured by Toray Silicone Co., Ltd.), TSF-4440, TSF-4300, TSF-4445, TSF-444(4)(5)(6)(7)6, TSF-4460, TSF-4452 (all trade names, manufactured by Momentive Performance Materials Inc.), KP341 (trade name, manufactured by Shin-Etsu Silicone Co., Ltd.), and BYK323, BYK330 (all trade names, manufactured by BYK Chemie).

The surfactants may be used alone or in a combination of two or more kinds thereof <Polymerization Inhibitor>

With regard to the colored composition of the present invention, it is desirable to add a small amount of polymerization inhibitor for suppressing undesired thermal polymerization of a polymerizable compound during the production or storage of the colored composition.

Examples of the polymerization inhibitor that can be used in the present invention include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylene bis(4-methyl-6-t-butylphenol), and an N-nitrosophenylhydroxyamine cerium (I) salt.

An addition amount of the polymerization inhibitor is preferably from about 0.01% by mass to about 5% by mass with respect to the total mass of the composition.

<Additives>

The colored composition of the present invention may contain various additives as necessary, for example, a filler, a high-molecular weight compound other than the above-mentioned compounds, an adhesion promoter, an antioxidant, an ultraviolet absorbent, and an aggregation inhibitor. Examples of these additives include additives described in paragraph numbers [0274] to [0276] of JP-A No. 2008-292970.

<Preparation Method of Colored Composition>

In connection with the preparation of the colored composition of the present invention, the above-mentioned components of the composition may be mixed together, or may be mixed sequentially after dissolving each component in a solvent. The order of adding the components or operation conditions to prepare the composition is not particularly limited.

For example, all of the components may be dissolved in a solvent in a single step to prepare a composition, or each of the components may be prepared as two or more solutions such that these solutions are mixed to prepare the composition when it is used (coated).

The thus prepared composition may be subjected to filtration before it is used, with a filter having a pore diameter of preferably from 0.01 µm to 3.0 µm, and more preferably a pore diameter of from 0.05 µm to 0.5 µm.

The colored composition of the present invention can be suitably used in the formation of colored pixels of color filters or the like for liquid crystal displays (LCDs) or solid-state image sensors (for example, CCD or CMOS). In particular, the colored composition can be suitably used in the formation of color filters for solid-state image sensors such as CCD and CMOS.

When a colored composition is used for the fabrication of a color filter by a photolithographic method, for example, the colored composition of the present invention is particularly suitable in the formation of a color filter for solid-state image sensors, in which a colored pattern is formed as a thin film with a minute size, and a favorable rectangular cross-sectional profile is also required.

Specifically, when the size of pixel pattern that forms a color filter (length of a side of the pixel pattern when viewed from a direction normal to the substrate) is 2 µm or less (for example, in a range of from 0.5 µm to 2.0 µm), the area of each pixel pattern is so small that its sensitivity tends to be significantly decreased especially due to a decrease in color separation properties caused by infiltration or transfer of one color to another color or formation of residues. Such problems are even more significant when a pixel pattern has a size in a range of from 0.5 µm to 1.7 µm (in particular, from 0.5 µm to 1.2 µm).

In this regard, when the colored composition of the present invention is used, it is possible to prepare a color filter that exhibits favorable pattern formability and suppressed color mixing such as infiltration or color transfer, and suppressed formation of residues, even when the color pixel has a size of 2 µm or less.

Generally, a colored composition using a dye tends to cause color mixing due to the nature of a dye that readily infiltrates into a pattern (or a layer) of a different color previously formed, during a coating process. Further, the colored composition using a dye requires a large amount of the dye, whereby the relative content of components contributing to photolithographic properties is decreased. As a result, there may be defective formation of a pattern, such as exfoliation of a pattern at portions exposed to an insufficient amount of light due to reduced sensitivity, failure to obtaining a desired shape or a desired color density due to dissolution of the dye during alkali development, and the like. Moreover, when a heat treatment is performed after the formation of a film, the colored composition using a dye tends to cause color transfer between adjacent pixels or between adjacent layers (thermal diffusion due to heat treatment).

However, by using the colored composition of the present invention in which a specific dye multimer is contained, it is possible to fabricate a colored film (color filter) in which problems unique to a dye, such as infiltration of a dye to a previously applied color layer, dissolution of a dye during alkali development, and thermal diffusion (color transfer) caused by heat treatment, are significantly suppressed while maintaining the transparency equivalent to a case in which a dye is used.

<Color Filter and Fabrication Method Thereof>

The color filter of the present invention is formed by using the colored composition of the present invention. Accordingly, the color filter of the present invention exhibits suppressed color mixing that may be caused by color infiltration, color transfer, and formation of development residues. Further, the color filter of the present invention also exhibits excellent heat resistance.

Hereinafter, the method of forming a color filter by a photolithographic method using the colored composition of the present invention will be described.

As the method of forming a pattern by a photolithographic method using the colored composition of the present invention, for example, the method described in paragraph numbers [0277] to [0284] of JP-A No. 2008-292970 may be used.

Specifically, the method includes a step of forming a colored layer by applying the colored composition onto a support ("colored layer formation step"), exposing the formed colored layer through a mask ("exposure step"), and developing the exposed colored layer to form a colored pattern ("development step"). The method including these steps is also referred to as a method of fabricating a color filter according to the present invention.

<Colored Layer Formation Step>

In the method of fabricating a color filter according to the present invention, first, the colored composition of the present invention is applied onto a support by a coating method such as spin coating, cast coating or roll coating, thereby forming a coating layer. The coating layer is optionally subjected to pre-baking, and then dried to form a colored layer (colored layer formation step).

Examples of the support used in the method of fabricating a color filter in accordance with the present invention include supports to be used for liquid crystal display devices and the like, for example, soda-lime glass, borosilicate glass (PYREX™ (registered trademark) glass), quartz glass and supports obtained by depositing a transparent conductive film on these glass supports; photoelectric conversion device substrates to be used for image sensors and the like, for example, silicon substrates; and complementary metal oxide semiconductor (CMOS) substrates. These substrates may have a black stripe that defines the pixels from each other. An undercoat layer may be optionally formed on these supports for the purpose of improving adhesion with respect to an upper layer, suppressing diffusion of substances, or flattening the surface of the substrate.

When the colored composition is applied onto a support by spin-coating, it is possible to drop a suitable organic solvent on the support and rotate the support prior to dropping the colored composition, in order to improve compatibility of the colored composition with respect to the support to reduce the amount of the colored composition used for the application.

The conditions for pre-baking may include heating the support using a hot plate or an oven at 70° C. to 130° C. for about 0.5 minutes to 15 minutes.

The thickness of the colored layer formed from the colored composition is appropriately selected depending on the purposes. Generally, the thickness of the colored layer is preferably in the range of 0.2 µm to 5.0 µm, more preferably 0.3 µm to 2.5 µm, and most preferably 0.3 µm to 1.5 µm. The thickness of the colored layer mentioned here is a film thickness measured after performing the pre-baking.

<Exposure Step>

Next, in the fabrication method of the color filter of the present invention, the colored layer formed on the support is exposed to light or radiation through a mask (exposure step).

The light or radiation used for the exposure is preferably g-line, h-line, i-line, KrF or ArF, and particularly preferably i-line. When i-line is used for the exposure, the exposure dose is preferably from 100 mJ/cm$^2$ to 10,000 mJ/cm$^2$.

Examples of other usable radiation sources include an ultrahigh pressure, high pressure, medium pressure or low pressure mercury lamp, a chemical lamp, a carbon-arc lamp, a xenon lamp, a metal halide lamp, visible and ultraviolet laser sources, a fluorescent lamp, a tungsten lamp, and sunlight.

(Exposure Step Using Laser Source)

When a laser source is used in the exposure step, ultraviolet laser may be used as the light source. Laser is an acronym of Light Amplification by Stimulated Emission of Radiation. The oscillator and amplifier of the laser utilize the phenomenon of induced emission that occurs in a substance with population inversion, and generate monochromatic light having even higher coherency and directionality by means of amplification and oscillation of light waves. Examples of the excitation medium of the laser include crystal, glass, liquid, dye and gas, and known lasers having an oscillation wavelength in the ultraviolet region, such as a solid laser, a liquid laser, a gas laser or a semiconductor laser, may be used in these media. Among them, a solid laser and a gas laser are preferable from the viewpoints of laser output and oscillation wavelength.

With respect to the wavelength of the laser that can be used in the exposure step using a laser source, an ultraviolet laser having a wavelength of preferably from 300 nm to 380 nm and more preferably from 300 nm to 360 nm is preferable, because such the wavelength within this range corresponds to a wavelength to which a resist (a colored composition) is sensitive.

Specifically, an Nd:YAG laser (third harmonic: 355 nm), which is a relatively cheap solid laser with particularly high output, and an excimer laser (XeCl: 308 nm, XeF: 353 nm) may be preferably used.

The exposure dose with respect to the target (a colored layer) is preferably in the range of 1 mJ/cm$^2$ to 100 mJ/cm$^2$, and more preferably 1 mJ/cm$^2$ to 50 mJ/cm$^2$. This range of the exposure dose is preferable from the viewpoints of productivity of the formed pattern.

The exposing apparatus that can be used in the exposure step using a laser source is not particularly limited, and examples thereof include commercially available apparatuses such as CALLISTO (trade name, manufactured by V Technology Co., Ltd.), EGIS (trade name, manufactured by V Technology Co., Ltd.) and DF2200G (trade name, manufactured by Dainippon Screen Mfg. Co., Ltd.), and other apparatuses may also be preferably used.

A light-emitting diode (LED) and a laser diode (LD) may be used as an active radiation source. Specifically, when an ultraviolet radiation source is necessary, an ultraviolet LED and an ultraviolet LD may be used. For example, Nichia Corporation has placed an ultraviolet LED having a main emission spectrum in a wavelength range between 365 nm and 420 nm on the market. When an even shorter wavelength is desired, an LED disclosed in U.S. Pat. No. 6,084,250, which can emit active radiation centered at between 300 nm and 370 nm, may be used. Other ultraviolet LEDs are also available and can emit radiation of different ultraviolet ranges. The active radiation source in the present invention is preferably a UV-LED and particularly preferably a UV-LED having a peak wavelength of from 340 nm to 370 nm.

Since an ultraviolet laser exhibits favorable parallelism, pattern exposure can be performed without a mask. However, use of a mask during pattern exposure is preferred because the linearity of the pattern can be further improved.

The exposed colored layer may be heated using a hot plate or an oven at 70° C. to 180° C. for 0.5 minutes to 15 minutes, prior to the subsequent development treatment.

Further, exposure may be performed while allowing a nitrogen gas to flow in a chamber so as to suppress oxidative fading of the dye in the colored layer.

<Development Step>

Subsequently, the exposed colored layer is developed using a developer solution (development step). In this way, a negative-type or positive-type colored pattern (resist pattern) may be formed.

The developer solution may be a combination of various organic solvents or an alkaline aqueous solution, as long as it dissolves uncured parts and does not dissolve cured parts in the colored layer. When the developer solution is an alkaline aqueous solution, it is preferable to adjust the alkali concentration such that the pH is from 11 to 13, more preferably from 11.5 to 12.5. Specifically, an alkaline aqueous solution in which the concentration of tetraethylammonium hydroxide has been adjusted to be from 0.001% by mass to 10% by mass, preferably from 0.01% by mass to 5% by mass, may be used as a developer solution.

The development time is preferably in the range of from 30 seconds to 300 seconds, more preferably from 30 seconds to 120 seconds. The development temperature is preferably 20° C. to 40° C., and more preferably 23° C.

The development may be performed by using a paddle system, a shower system, a spray system or the like.

It is preferable to perform washing with water after the development with an alkali aqueous solution. The method for washing is appropriately selected according to the purpose, and one example is to perform a rinse treatment by supplying purified water in shower form while rotating a support such as a silicon wafer substrate at a rotation speed of 10 rpm to 500 rpm, from ejection nozzles positioned above the rotational center of the support.

Thereafter, the colored pattern may be optionally subjected to post-heating and/or post-exposure to accelerate the curing of the colored pattern (post-curing step).

<Post-Curing Step>

In the present invention, after the step of forming a pattern by the above-mentioned development, a post-curing step for further curing the resulting pattern is preferably carried out.

The post-curing can be carried out by heating (post-heating) and/or exposure (post-exposure such as ultraviolet irradiation), and the resulting pattern is further cured to suppress dissolution of the pattern during formation of a colored layer for a colored pattern of the subsequent color, or to improve the solvent resistance of pixels of the resulting color filter.

The post-curing step is preferably an ultraviolet irradiation step in which ultraviolet irradiation is performed.

—Ultraviolet Irradiation Step—

In the ultraviolet irradiation step, curing of a pattern by post-exposure is carried out.

Specifically, the pattern which has been subjected to a development treatment in the pattern-forming step is irradiated, for example, with ultraviolet light (ultraviolet light) at an irradiation dose [mJ/cm$^2$] of at least 10 times the exposure dose [mJ/cm$^2$] in the exposure treatment prior to the development. By irradiating the developed pattern with ultraviolet light for a predetermined time period, between the development treatment in the pattern-forming step and the heating treatment to be described hereinafter, color transfer during the subsequent heating may be effectively suppressed. If the irradiation dose in this step is less than 10 times, color transfer between the colored pixels or between the adjacent layers may be not suppressed.

The irradiation dose of ultraviolet light is preferably from 12 times to 200 times the exposure dose in the pattern-forming step, and more preferably from 15 times to 100 times.

The post-exposure may be carried out with g-line, h-line, i-line, KrF, ArF, ultraviolet light, an electron beam, X-rays or the like, preferably with g-line, h-line, i-line or ultraviolet light, and particularly preferably ultraviolet light. When irradiation is performed with ultraviolet light (UV curing), it is preferably carried out at a low temperature from 20° C. to 50° C. (preferably from 25° C. to 40° C.). The wavelength of ultraviolet light preferably includes a wavelength ranging from 200 nm to 300 nm. As the light source, a high pressure mercury lamp, a low pressure mercury lamp, or the like may be used. The irradiation time is in the range of 10 seconds to 180 seconds, preferably 20 seconds to 120 seconds, and more preferably 30 seconds to 60 seconds.

The light source for irradiating ultraviolet light may be, for example, an ultra high pressure mercury lamp, a high pressure mercury lamp, a low pressure mercury lamp, a deep ultraviolet lamp or the like. Among them, a light source that irradiates ultraviolet light including light at a wavelength of 275 nm or less, and may irradiate light in which an irradiation illuminance [mW/cm$^2$] of the light at a wavelength of 275 nm or less is 5% or more with respect to the integral irradiation illuminance of the light at all wavelengths in the ultraviolet light is preferable. By adjusting the irradiation illuminance of the light at a wavelength of 275 nm or less in the ultraviolet light to be 5% or more, the effect of suppressing color transfer between the colored pixels or the adjacent upper and lower layers, and the effect of improving light fastness may be further improved. From these viewpoints, it is preferable that the post-exposure by ultraviolet irradiation is performed by using a light source that differs from the light source used in the exposure performed at the pattern-forming step (a bright line such as i-line). Specifically, a high pressure mercury lamp, a low pressure mercury lamp or the like is suitably used. For the similar reasons, the irradiation illuminance [mW/cm$^2$] of the light at a wavelength of 275 nm or less is preferably 7% or more with respect to the integral irradiation illuminance of the light at all wavelengths in the ultraviolet light. Further, it is desirable that the upper limit of the irradiation illuminance of the light at a wavelength of 275 nm or less is 25% or less.

The "integral irradiation illuminance" refers to the sum (area) of illuminances of respective wavelengths of light included in the irradiated light, which is shown as the area of a curve drawn in a graph in which the illuminance at each spectral wavelength (radiation energy passing through a unit area/unit time; [mW/m$^2$]) represents the vertical axis and the wavelength [nm] of the light represents the horizontal axis.

The integral irradiation illuminance of ultraviolet light used in the post-exposure is preferably 200 mW/cm$^2$ or more. If the integral irradiation illuminance is 200 mW/cm$^2$ or more, effects of suppressing color transfer between the colored pixels or between the adjacent upper and lower layers, and improving light fastness may be improved more effectively. The integral irradiation illuminance is preferably 250 mW/cm$^2$ to 2,000 mW/cm$^2$, more preferably 300 mW/cm$^2$ to 1,000 mW/cm$^2$.

Further, the post-heating is preferably carried out with a hot plate or an oven at a temperature of 100° C. to 300° C., and more preferably 150° C. to 250° C. The time for post-heating is preferably in the range of 30 seconds to 30,000 seconds, and more preferably 60 seconds to 1,000 seconds.

In the post-curing step, the post-exposure and the post-heating may be carried out in combination, and either one may be performed prior to the other. However, it is preferred to perform post-exposure prior to post-curing, since deformation of the pattern shape due to thermal sagging or hemming bottom, which may occur during the post-heating step, can be suppressed by promoting the curing of the pattern by performing post-exposure.

The thus obtained colored pattern constitutes the colored pixels of the color filter.

A color filter having pixels of plural colors can be formed by performing a series of steps including a colored layer formation step, an exposure step and a development step (and optionally a post-curing step) for a number of times corresponding to the number of colors to be used in the color filter.

The colored composition of the present invention can be easily removed with a known cleaning liquid, even if the colored composition is attached to nozzles of an ejecting unit of a coating apparatus, a piping unit of the coating apparatus, the inside of the coating apparatus, or the like. In order to highly efficiently remove the colored composition, the above-mentioned solvents that may be included in the colored composition of the present invention are suitably used.

Further, cleaning liquids described in JP-A Nos. 7-128867, 7-146562, 8-278637, 2000-273370, 2006-85140, 2006-291191, 2007-2101, 2007-2102, 2007-281523 and the like may also be preferably used as a cleaning liquid for cleaning and removing the colored composition of the present invention.

As the cleaning liquid, alkylene glycol monoalkyl ether carboxylate or alkylene glycol monoalkyl ether is preferably used.

The solvents may be used alone or in a combination of two or more kinds thereof.

When two or more kinds of solvents are mixed, a mixed solvent including a solvent having a hydroxyl group and a solvent not having a hydroxyl group is preferable. The mass ratio of the solvent with a hydroxyl group to the solvent not having a hydroxyl group is preferably from 1/99 to 99/1, more preferably from 10/90 to 90/10, and further preferably from 20/80 to 80/20. The mixed solvent is particularly preferably a mixed solvent of propylene glycol monomethyl ether acetate (PGMEA) and propylene glycol monomethyl ether (PGME) in which the mixing ratio is 60/40.

In order to enhance the permeability of the cleaning liquid to the colored composition, the cleaning liquid may contain the above-described surfactant as a surfactant which may be contained in the colored composition.

As the method of fabricating a color filter, there is also a method using an inkjet method, in addition to the above-mentioned method.

The method of fabricating a color filter by an inkjet method is not particularly limited, but includes a step of preparing a substrate having recessed portions defined by partition walls, and depositing droplets of the colored composition of the present invention (specifically, an inkjet ink of the present invention to be described later) to the recessed portions according to an inkjet method, thereby forming colored pixels of a color filter. For example, a method described in paragraph numbers [0114] to [0128] of JP-A No. 2008-250188 may be used.

The color filter of the present invention may further include an indium tin oxide (ITO) layer as a transparent conductive film. Examples of the method of forming the ITO layer include an in-line low-temperature sputtering method, an in-line high-temperature sputtering method, a batchwise low-temperature sputtering method, a batchwise high-temperature sputtering method, a vacuum deposition method, and a plasma CVD method. In the present invention, a low-temperature sputtering method is particularly preferably used in order to minimize the damage to a color filter.

<Inkjet Ink>

The inkjet ink of the present invention contains the colored composition of the present invention.

The inkjet ink of the present invention can be used for forming a colored pixel that exhibits excellent fastness (heat resistance and light fastness), storage stability and ejection stability.

The inkjet ink of the present invention preferably contains a specific dye multimer, and at least one of a solvent and a polymerizable compound.

In other words, the inkjet ink of the present invention may or may not contain a solvent. One example of the inkjet ink that does not contain a solvent is an ink in which a polymerizable compound serves also as a solvent.

<Solvent>

The solvent is not particularly limited as long as it satisfies the requirements for the solubility of respective components or the boiling point of the solvent, but the solvent is preferably selected under consideration of the solubility, coatability and safety of the binder to be described hereinafter. Specific examples of the solvent include the solvents described in paragraph numbers [0030] to [0040] of JP-A No. 2009-13206.

Further, the previously mentioned solvents that may be included the colored composition of the present invention may be used as the solvent.

The content of the solvent is preferably in the range of 30% by mass to 90% by mass, with respect to the total mass of the inkjet ink, and more preferably 50% by mass to 90% by mass. When the content of the solvent is 30% by mass or more, the amount of ink to be deposited in one pixel cab be maintained, and wet-spreading of the ink in the pixel is favorable. When the content of the solvent is 90% by mass or less, the amount of the components other than the solvent in the ink, which components serve to form a functional film (for example, pixels) can be maintained to be not less than the given contents. As a result, when a color filter is formed, the amount of ink required to form each pixel is not excessively large. For example, when the ink is deposited in recessed portions defined by partition walls by an inkjet method, flooding out of the ink from the recessed portions or mixing with the ink forming the adjacent pixels can be suppressed.

The inkjet ink of the present invention preferably contains a solvent with a high boiling point selected from the above-mentioned solvents, from the viewpoints of ejection properties of the ink from nozzles and wettability of the ink with respect to a support.

The boiling point of the solvent is preferably in the range of 130° C. to 280° C.

If the boiling point of the solvent is 130° C. or higher, in-plane uniformity of the shape of the pixels can be further improved.

If the boiling point of the solvent is 280° C. or lower, solvent removability by pre-baking can be further improved.

The boiling point of the solvent means a boiling point under a pressure of 1 atm, and specific values of the boiling point are shown in the physical characteristics table described in the Chemical Dictionary (published by Chapman & Hall) and the like. These solvents may be used alone or in a combination of two or more kinds thereof.

<Binder>

For the purpose of adjusting the viscosity, the hardness or the like of the ink, a binder may be optionally added to the inkjet ink of the present invention. The binder may be a binder resin formed only from a resin not capable of polymerization by itself, and cures simply by drying. However, in order to impart sufficient strength, durability, and adhesion to a coating film formed from the ink, it is preferable to use a binder that can cure via polymerization reaction after the formation of a pattern of pixels on the support by an inkjet method. For example, a binder that can cure by polymerization may be used, such as a photocurable binder that polymerizes and cures when exposed to visible light, ultraviolet light, an electron beam or the like; and a thermosetting binder that polymerizes and cures when heated.

Further, the binders that may be used in the colored composition of the present invention may be used as the binder resin in the inkjet ink of the present invention.

<Crosslinking Agent>

The inkjet ink of the present invention may contain a crosslinking agent.

As the crosslinking agent, there may be appropriately used curing agents and accelerators described in Chapter 3 of "General Introduction to Epoxy Resins, Basic Edition I" (The Japan Society of Epoxy Resin Technology, published on Nov. 19, 2003). For example, a polyfunctional carboxylic acid anhydride or a polyfunctional carboxylic acid can be used as the crosslinking agent.

<Surfactant>

The inkjet ink of the present invention may further contain a surfactant.

Preferable examples of the surfactant include surfactants disclosed in paragraph number [0021] of JP-A No. 7-216276, and surfactants disclosed in JP-A Nos. 2003-337424 and 11-133600. The content of the surfactant is preferably 5% by mass or less with respect to the total mass of the colored composition.

Further, the surfactants that may be used in the colored composition of the present invention may be used as the surfactant in the inkjet ink of the present invention.

<Additives>

The additives that may be optionally added to the inkjet ink of the present invention include the additives described in paragraph numbers [0058] to [0071] of JP-A No. 2000-310706.

<Method of Preparing Inkjet Ink>

The inkjet ink according to the present invention can be prepared by a known method of preparing an inkjet ink.

During the preparation of a solution of the polymerizable compound, when the material to be used has a low solubility with respect to a solvent, a treatment such as heating or ultrasonication can be carried out within the range in which the polymerizable compound does not cause polymerization reaction.

The physical properties of the inkjet ink of the present invention are not particularly limited as long as these properties are within the range in which the inkjet ink can be ejected from an inkjet head, but the viscosity of the ink during the ejection is preferably in the range of 2 mPa·s to 30 mPa·s, more preferably 2 mPa·s to 20 mPa·s, from the viewpoint of achieving stable ejection. In addition, when the inkjet ink is ejected using an apparatus, the temperature of the inkjet ink is preferably maintained to be substantially constant in the range of 20° C. to 80° C. When the temperature of the apparatus is high, the ink viscosity is lowered, thereby making it possible to eject an ink having a higher viscosity. On the other hand, denaturizing and/or thermal heat polymerization reaction of the ink may occur due to the high temperature within the head, or the solvent in the ink may evaporate at a surface of nozzles for ejecting ink to cause clogging of the nozzles. Therefore, the temperature of the apparatus is preferably in the range of 20° C. to 80° C.

The viscosity mentioned above is a value measured with a commonly used E-type viscometer (for example, RE-80L, trade name, manufactured by TOKI SANGYO CO., LTD.) while maintaining the temperature of the inkjet ink at 25° C.

The surface tension (static surface tension) at 25° C. of the inkjet ink of the present invention is preferably in the range of 20 mN/m to 40 mN/m and more preferably 20 mN/m to 35 mN/m, from the viewpoint of improving the wettability with respect to a non-penetrative substrate and improving the ejection stability. When the inkjet ink is ejected by an apparatus, it is preferable to maintain the temperature of the inkjet ink to be substantially constant in the range of from 20° C. to 80° C., and the surface tension during ejection is preferably within a range of from 20 mN/m to 40 mN/m. In order to keep the temperature of the inkjet ink to be constant with a certain degree of accuracy, it is preferable to use an apparatus equipped with an ink temperature detection unit, an ink heating or cooling unit, and a controlling unit that controls the heating or cooling in response to the detected ink temperature. Alternatively, it is also preferable to provide a unit that controls the energy applied to the unit that ejects the inkjet ink in accordance with the ink temperature, and reduces the influence from the change in the physical properties of the inkjet ink.

The surface tension is a value measured with a commonly used surface tensiometer (for example, CBVB-A3, trade name, manufactured by Kyowa Interface Science Co., LTD.) according to the Wilhermy method at a liquid temperature of 25° C. and 60% RH.

In order to maintain a favorable shape of the inkjet ink while it is wet-spreading on a support after the deposition of the inkjet ink onto the support, it is preferable to maintain the liquid properties of the inkjet ink after being deposited onto the substrate to be within a predetermined range. For this purpose, it is preferable to maintain the temperature of the support and/or in the vicinity of the support to be within a predetermined range. Alternatively, it is also effective to reduce the influence due to changes in the temperature by, for example, increasing the heat capacity of a table under the support.

When the inkjet ink of the present invention is used in the fabrication of a color filter by an inkjet method, the storage stability of the ink is excellent and aggregation or decomposition of ink is suppressed. Further, ejection disorders such as deviation in a direction in which the ink flies or failure to eject the ink can be suppressed when continuous or intermittent ejection of ink is performed. Moreover, the inkjet ink exhibits favorable recovery properties after a pause for a certain period of time, and recovery properties from a state in which the ejection fails to be carried out.

The method of fabricating a color filter with the inkjet ink of the present invention by an inkjet method is not particularly limited, and a method described in paragraph numbers [0114] to [0128] of JP-A No. 2008-250188 can be used, for example.

<Use of Color Filter of Present Invention>

The color filter of the present invention can be suitably used without particular limitation, for example, for applications in portable terminals such as liquid crystal displays, organic EL displays, liquid crystal projectors, games and mobile phones, displays such as digital cameras and navigators, and particularly color displays.

In addition, the color filter of the present invention can be preferably used as a color filter for solid-state image sensors of CCD image sensors and CMOS image sensors used in digital cameras, digital video cameras, endoscopes, and mobile phones. In particular, the color filter is suitable for CCD devices or CMOS devices of high resolution, which may contain more than one million pixels.

<Solid-State Image Sensor>

The solid-state image sensor of the present invention includes the color filter of the present invention.

The solid-state image sensor of the present invention may be suitably used as, specifically, CCD image sensors or CMOS image sensors used in digital cameras, digital video cameras, endoscopes, and mobile phones. Among these, the solid-state image sensor of the present invention is particularly suitable as CCD image sensors or CMOS image sensors having a high resolution of more than one million pixels.

The configuration of the solid-state image sensor is not specifically limited as long as it includes the color filter of the present invention and functions as a solid-state image sensor, and an example thereof is a configuration including a support, plural photodiodes that constitute a light receiving area and transfer electrodes made of polysilicon or the like formed on the support, the color filter of the present invention formed thereon, and a microlens formed thereon.

Further, in the camera system having the color filter of the present invention, a camera lens or an IR cut film is preferably provided with a dichroic-coated cover glass, a microlens or the like, in view of the discoloration properties of the dye. Further, the material for the cover glass or the microlens preferably has an optical property of absorbing part or all of ultraviolet light of 400 nm or less. Moreover, in order to suppress discoloration due to oxidization of the dye, the camera system preferably has a structure in which oxygen permeability to the color filter is reduced. For example, part or the entire body of the camera system is preferably sealed with a nitrogen gas.

<Display Device>

The display device of the present invention includes the color filter of the present invention.

Examples of the display device of the present invention include, specifically, liquid crystal displays (LCD), organic EL displays, liquid crystal projectors, display devices for game machines, display devices for portable terminals such as mobile phones, display devices for digital cameras and display devices for car navigators, and color display devices are particularly suitable.

The definition of a display device and the explanation of each display device are described, for example, in "Electronic Display Device (Akio Sasaki, Kogyo Chosakai Publishing Co., Ltd., 1990", "Display Device (Sumiaki Ibuki, Sangyo Tosho Publishing Co., Ltd., 1989)" and the like.

Liquid crystal display devices are described, for example, in "Next Generation Liquid Crystal Display Techniques (Tatsuo Uchida, Kogyo Chosakai Publishing Co., Ltd., 1994)". The liquid crystal display device to which the present invention may be applied is not particularly limited, and the present invention may be applied to various liquid crystal display devices described, for example, in "Next Generation Liquid Crystal Display Techniques".

The color filter of the present invention is particularly effectively used in a color TFT liquid crystal display device. Color TFT liquid crystal display devices are described, for example, in "Color TFT Liquid Crystal Display (Kyoritsu Shuppan Co., Ltd., 1996)". Further, the present invention may be applied to a liquid crystal display device with a wider view angle such as an in-plane switching (IPS) system or a multi-domain vertical alignment (MVA) system, or STN, TN, VA, OCS, FFS, R-OCB and the like.

The color filter of the present invention may also be applied to a COA (Color-filter On Array) system, which has high brightness and high definition. In the COA type liquid crystal display device, the color filter layer needs to satisfy the properties required for an interlayer dielectric film, such as a low dielectric constant and a resistance to a removing liquid, in addition to the ordinary requirements as mentioned above. It is thought that the transmissivity of the color filter with respect to ultraviolet laser used as an exposure light can be increased by selecting the method of performing exposure or selecting the color or the film thickness of the colored pixels. As a result, curability of the colored pixels is improved and the colored pixels can be formed without chipping, peeling or unevenness, thereby improving the resistance to a removing liquid of the colored layer provided directly or indirectly on the TFT substrate. For these reasons, the color filter of the present invention is useful for a COA type liquid crystal display device. In order to achieve a low dielectric constant, a resin coating may be provided on the color filter layer.

In the colored layer formed by the COA system, in order to electrically connect the ITO electrode disposed on the colored layer with the terminal of a driving substrate disposed under the colored layer, an electrically-conducting path such as a rectangular through hole having a side length of about 1 µm to 15 µm or a U-shaped depressed area needs to be formed. The size (that is, the side length) of the electrically-conducting path is preferably 5 µm or less, and an electrically-conducting path having a size of 5 µm or less can be formed according to the present invention, These image display systems are described, for example, on page 43 of "EL, PDP, LCD Display—Latest Trends of Technology and Markets (Research Study Division of Toray Research Center, Inc., 2001)" and the like.

The liquid crystal display device of the present invention includes, in addition to the color filter of the present invention, various kinds of other members such as an electrode substrate, a polarization film, a phase difference film, a back light, a spacer, and a view angle compensation film. The color filter of the present invention can be applied to a liquid crystal display device including these known members.

Details of these members are described, for example, in "'94 Market of Liquid Crystal Display Related Materials And Chemicals (Kentaro Shima, CMC Publishing Co., Ltd., 1994)" and "2003 Current State And Perspective Of Liquid Crystal Related Market (the second volume, Ryokichi Omote, Fuji Chimera Research Institute, Inc., 2003)".

Back lights are described, for example, in SID meeting Digest 1380 (2005) (A. Konno et al) and Monthly Display, 2005 December, pages 18-24 (Hiroyasu Shima) and pages 25-30 (Takaaki Yagi).

When the color filter of the present invention is used in a liquid crystal display device, a high contrast may be obtained when combined with a known three-wavelength cold-cathode tube. However, when combined with an LED light source of red, green and blue is used as a back light, a liquid crystal display device that exhibits high brightness, high color purity, and excellent color reproducibility can be achieved.

Details of the colored composition, the inkjet ink, the color filter and the method for preparing the color filter, the solid-state image sensor, and the display device according to the present invention have been described above by way of illustrating various embodiments. However, the present invention is not limited to these embodiments, and various modifications and alterations can be made thereto without departing from the gist of the invention.

EXAMPLES

Hereinafter, the present invention will be further described in detail with reference to the following examples. Materials, reagents, ratios, instruments, operations, and the like given in the following examples may be appropriately modified without departure from the scope of the present invention. Therefore, the present invention is by no means limited to the following specific examples. In the following examples, "%" and "part(s)" refer to "% by mass" and "part(s) by mass" respectively, unless otherwise specifically indicated.

Example 1

(1) Preparation of Resist Solution A (Negative-Type)

The following components were mixed and dissolved to prepare a resist solution A.
  Propylene glycol monomethyl ether acetate: 5.20 parts
  Cyclohexanone: 52.60 parts
  Binder: 30.50 parts
    (benzyl methacrylate/methacrylic acid/2-hydroxyethyl methacrylate copolymer, molar ratio=60:20:20, average molecular weight: 30200 (in terms of polystyrene), 41% cyclohexanone solution)
  Dipentaerythritol hexaacrylate: 10.20 parts
  Polymerization inhibitor (p-methoxyphenol): 0.006 parts
  Fluorosurfactant (trade name: F-475, manufactured by DIC Corporation): 0.80 parts
  Photopolymerization initiator: 4-benzoxolane-2,6-bis (trichloromethyl)-s-triazine (trade name: TAZ-107, manufactured by Midori Kagaku Co., Ltd.): 0.58 parts.

(2) Preparation of Glass Substrate with Undercoat Layer

A glass substrate (trade name: CORNING 1737) was subjected to ultrasonic washing with an aqueous solution of 0.5% NaOH, and then washing with water and dehydration baking (200° C./20 minutes). Next, on the glass substrate, the resist solution A obtained in step (1) was coated to a thickness after being dried of 2 μm with a spin coater and dried by heating at 220° C. for 1 hour, thereby preparing a glass substrate with an undercoat layer.

(3) Preparation of Colored Composition

The following components were mixed, dispersed and dissolved to prepare a colored composition.
  Cyclohexanone: 1.133 parts
  Benzyl methacrylate/methacrylic acid copolymer (20% CyH solution) (molar ratio=70:30, weight-average molecular weight: 30,000): 1.009 parts
  Polymerizable monomer (trade name: KAYARAD DPHA, manufactured by Nippon Kayaku Co., Ltd.): 3.84 parts
  Fluorosurfactant (1% CyH solution) (trade name: SOLSPERSE 20000, manufactured by AstraZeneca K.K.): 0.125 parts
  Oxime photopolymerization initiator (the following structure): 0.087 parts
  Dye multimer (exemplary compound 1-4, weight-average molecular weight (Mw): 5200, dispersity (Mw/Mn) 1.66): 0.183 parts
  Pigment Blue 15:6 dispersion: 2.418 parts
  (solid concentration: 17.70%, pigment concentration: 11.80%)
  Nonionic surfactant: glycerol propoxylate (1% CyH solution): 0.048 parts

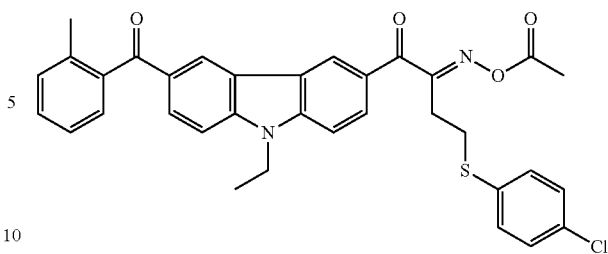

Preparation of C.I. Pigment Blue 15:6 dispersion

The C.I. Pigment Blue 15:6 dispersion was prepared by the following process.

11.8 parts by mass (average particle diameter: 55 nm) of C.I. Pigment Blue 15:6, 5.9 parts by mass of a pigment dispersant BY-161 (trade name, manufactured by BYK), and 82.3 parts by mass of PGMEA were mixed and dispersed with a bead mill (zirconia bead diameter: 0.3 mm) for 3 hours, thereby preparing a pigment dispersion. Thereafter, the mixed solution was further subjected to a dispersion treatment with a high-pressure dispersing apparatus equipped with a pressure reduction mechanism (NANO-3000-10, trade name, manufactured by Nippon BEE Chemical Co., Ltd.) at a flow rate of 500 g/min under a pressure of 2,000 kg/cm$^3$. This dispersion treatment was repeated 10 times to obtain a pigment dispersion (C.I. Pigment Blue 15:6 dispersion). The average primary particle diameter of the pigment of the resulting pigment dispersion was measured by a dynamic light scattering method with a measurement apparatus (NANOTRAC UPA-EX150, trade name, manufactured by Nikkiso Co., Ltd.) The average primary particle diameter of the pigment was 24 nm.

(4) Exposure and Development of Colored Composition (Formation of Colored Pattern)

The colored composition obtained in step (3) was applied on the undercoat layer formed on the glass substrate in step (2) to a thickness after being dried of 0.6 μm with a spin coater, and the coating film was pre-baked at 100° C. for 120 seconds.

Subsequently, the coating film was exposed to light having a wavelength of 365 nm through a mask with a line width of 2 μm at an exposure dose of 200 mJ/cm$^2$ with an exposure apparatus (UX3100-SR, trade name, manufactured by Ushio, Inc.) After the exposure, the coating film was developed with a developer solution (CD-2000, trade name, manufactured by Fuji Film Electronics Materials Co., Ltd.) under the conditions of 25° C. for 40 seconds. Then, after rinsing with running water for 30 seconds, spray-drying was carried out to obtain a colored pattern.

Thereafter, the colored pattern was heated to cure at 200° C. for 300 seconds (post-baking).

A glass substrate with a colored pattern (a blue monochromatic color filter) was thus obtained.

(5) Evaluation

The alkali dissolution resistance, solvent resistance, color transfer due to thermal diffusion, formation of development residues to the substrate, and infiltration of the development residues or the dye into the other color (infiltration into a colored pattern of a different color) were evaluated as described below. The evaluation results are shown in Tables 1 to 5.

[Alkali Dissolution Resistance]

The spectral transmission of the coating film after being pre-baked in step (4) (spectral transmission A) and the spectral transmission of the coating film after being developed at the exposed portion (spectral transmission B) were measured, respectively. The dye residual ratio (%) was calculated by a difference between the spectral transmission A and the spectral transmission B, and the result was used as an indicator for the evaluation of the resistance to alkali dissolution. The closer the dye residual ratio is to 100%, the more favorable the resistance to alkali dissolution is.

[Solvent Resistance]

The spectral transmission of the colored pattern after the post-baking in step (4) was measured (spectral transmission A). Onto the colored pattern (color filter), a resist solution A obtained in step (1) was applied to a thickness of 1 µm, and then subjected to pre-baking. Development was performed with a developer solution (CD-2000, trade name, manufactured by Fuji Film Electronics Materials Co., Ltd.) under the conditions of 23° C. for 120 seconds, and the spectral transmission was measured again (spectral transmission B). The dye residual ratio (%) were calculated from the difference between the spectral transmission A and the spectral transmission B, and the result was used as an indicator for the evaluation of the solvent resistance. The closer the dye residual ratio is to 100%, the more favorable the solvent resistance is.

[Color Transfer Due to Thermal Diffusion]

A transparent solution for forming a primer layer (CT-2000 L, trade name, manufactured by Fuji Film Electronics Materials Co., Ltd.) was applied onto the colored filter prepared in step (4) to a dried film thickness of 1 µm, and dried to form a transparent film. Thereafter, the transparent film was subjected to a heating treatment at 200° C. for 5 minutes. After the heating, an absorbance of the transparent film formed adjacent to the colored pattern was measured with a microspectroscopy system (LCF-1500 M, trade name, manufactured by Otsuka Electronics Co., Ltd.). The ratio [%] of the absorbance value of the resulting transparent film to the absorbance value of the colored pattern measured before the heating was calculated used as an indicator for the evaluation of color transfer.

—Evaluation Criteria—

Color transfer (%) to adjacent pixels

A: color transfer to adjacent pixels<1%
B: 1%<color transfer to adjacent pixels≤10%
C: 10%≤color transfer to adjacent pixels≤30%
D: color transfer to adjacent pixels>30%

[Development Residues Formed on Substrate]

The unexposed portion of the colored pattern after being developed in step (4) was examined with a scanning electron microscope (trade name: Hitachi ultra-high resolution field emission scanning electron microscope S-4800, ×20,000). The result was subjected to a sensory evaluation in accordance with the following criteria.

A: the colored pattern was developed without residues
B: the colored pattern was developed with some residues
C: the colored pattern was not able to be developed

[Infiltration of Development Residues/Dyes into Other Color]

The following colored composition (G) was applied on the undercoat layer formed on the glass substrate in step (2) to a thickness after being dried of 0.6 µm with a spin coater, and pre-baked at 100° C. for 120 seconds. Then, the entire surface of the coating film was exposed to light having a wavelength of 365 nm without a mask at an exposure dose of 200 mJ/cm² by using an exposure apparatus (UX3100-SR, trade name, manufactured by Ushio, Inc.). After the exposure, the coating film was developed with a developer solution (CD-2000, trade name, manufactured by Fuji Film Electronics Materials Co., Ltd.) under the conditions of 25° C. for 40 seconds. Then, after rinsing with running water for 30 seconds, spray-drying was carried out. Thereafter, post-baking was carried out at 200° C. for 15 minutes, and the spectral transmission of the coating film was measured (spectral transmission A). Further, the colored composition prepared in step (3) above was coated thereon to have a thickness after being dried of 0.6 µm with a spin coater, and pre-baked at 100° C. for 120 seconds. The coating film was developed without performing exposure with a developer solution (CD-2000, trade name, manufactured by Fuji Film Electronics Materials Co., Ltd.) under the conditions of 25° C. for 40 seconds. Then, after rinsing with running water for 30 seconds, spray-drying was carried out and the spectral transmission was measured (spectral transmission B). From the difference between the spectral transmission A and the spectral transmission B, an absolute value of a decrease in transmission (T % decrease) was calculated and used as an indicator for the evaluation of the infiltration of development residues/dyes into the other color.

—Evaluation Criteria—

Infiltration of Development Residues/Dye into Other Color (T % Decrease)

A: T % decrease<1%
B: 1%≤T % decrease≤5%
C: T % decrease≥5%

—Colored Composition G—

40 parts of a 30/70 [mass ratio] mixture of C.I. Pigment Green 36 and C.I. Pigment Yellow 219, 50 parts of DISPER-BYK-161 (trade name: manufactured by BYK, 30% solution) as a dispersant, and 110 parts of propylene glycol monomethyl ether as a solvent were mixed and dispersed with a bead mill for 15 hours to prepare a pigment dispersion (P1).

The pigment dispersion (P1) and the following components were mixed and stirred to prepare a colored composition G.

<Composition>

Dye (pigment dispersion (P1)): 350 parts
Polymerization initiator (oxime photopolymerization initiator) (trade name: CGI-124, manufactured by BASF Japan): 30 parts
TO-1382: 25 parts
(polymerizable compound, carboxyl group-containing pentafunctional acrylate, manufactured by Toagosei Co., Ltd.)
Dipentaerythritol hexaacrylate: 30 parts
Solvent (PGMEA): 200 parts
Substrate adhesion promoter (3-methacryloxypropyltrimethoxysilane): 1 part Examples 2 to 33 and Comparative Examples 1 to 27

Evaluation of Examples 2 to 33 and Comparative Examples 1 to 27 was carried out in the same manner as in Example 1, except that the dye multimer of Example 1 was changed to the dye multimers described in Tables 1 to 5.

The weight-average molecular weight (Mw) of the exemplary compounds in the Examples and the exemplary compounds in the Comparative Examples was adjusted by changing the amount of a chain transfer agent and the amount of an initiator. In the present invention, the weight-average molecular weight is adjusted by means of polymerization reaction, which is a relatively easy way of adjusting the weight-average molecular weight with the use of a chain transfer agent.

Specifically, polymerization reaction of a preliminary experiment is carried out under a nitrogen atmosphere, at a fixed ratio of a polymerization initiator/a chain transfer agent (2/1, molar ratio), at three points of 3 mol %, 6 mol % and 9 mol % in terms of the polymerization initiator, with respect to the total moles of a polymerizable dye monomer (and a copolymerization component monomer). Then, the reaction liquid is measured by GPC to obtain each of the intended weight-average molecular weight (Mw).

A calibration curve is drawn based on these three points, and the amounts of the polymerization initiator and the chain transfer agent necessary to achieve a desired weight-average molecular weight (Mw) are calculated, whereby a dye multimer having a desired weight-average molecular weight (Mw) can be synthesized. When a desired weight-average molecular weight (Mw) cannot be obtained in this calibration curve range, the weight-average molecular weight (Mw) can be adjusted by a known molecular weight control method, for example, by changing the reaction temperature, the kind of the solvent, polymerization initiator or chain transfer agent, or the degree of reaction concentration.

Specifically, in Examples 1 to 33, as described above, the amount of the polymerization initiator and the amount of the chain transfer agent were calculated such that the weight-average molecular weight (Mw) obtained from the calibration curve was within the range of from 5,000 to 20,000, whereby the weight-average molecular weight (Mw) was adjusted to be within the range of from 5,000 to 20,000 by performing polymerization reaction (the same also applies to Examples 2-1, 3-1 and 3-2).

In Comparative Examples 1 to 27, as described above, the amount of the polymerization initiator and the amount of the chain transfer agent were calculated such that the weight-average molecular weight (Mw) obtained from the calibration curve was less than 5,000, whereby the weight-average molecular weight (Mw) was adjusted to be less than 5,000 by performing polymerization reaction. Alternatively, the amount of the polymerization initiator and the amount of the chain transfer agent were calculated such that the weight-average molecular weight (Mw) obtained from the calibration curve was more than 20,000, whereby the weight-average molecular weight (Mw) was adjusted to be more than 20,000 by performing polymerization reaction.

In the Examples and the Comparative Examples, the dispersity (Mw/Mn) was adjusted by determining whether or not to perform re-precipitation, changing the kind and the amount of a re-precipitation solvent, and changing the number of carrying out the re-precipitation.

Specifically, in Examples 1 to 33, the dispersity was adjusted to a desired dispersity by diluting the polymerization reaction solution with PGMEA/methanol (1/1, volume ratio) to an amount of 3 times by volume the polymerization reaction liquid, and subjecting this solution to re-precipitation with acetonitrile (or acetonitrile/methanol mixed solvent, volume ratio: 7/3) in an amount of about 20 to 100 times the solution.

When a desired dispersity was not obtained, the dye multimer obtained from the re-precipitation was dissolved in THF (or cyclohexanone, PGMEA) in an amount of 3 to 5 times by weight the dye multimer, and this solution was subjected to re-precipitation with acetonitrile (or acetonitrile/methanol mixed solvent, volume ratio: 7/3) in an amount of about 20 to 100 times the solution. The re-precipitation was repeated until the dispersity (Mw/Mn) was adjusted to be from 1.00 to 2.50 (the same shall apply to following Examples 2-1, 3-1 and 3-2). In Comparative Examples 1 to 27, the dispersity (Mw/Mn) was adjusted to exceed 2.50 by not performing re-precipitation or by concentrating the reaction liquid.

TABLE 1

| | Exemplary Compound | Weight-average Molecular Weight (Mw) | Dispersity Mw/Mn | Acid Value (mmol/g) | Alkali Dissolution Resistance | Solvent Resistance | Color Transfer due to Heat Diffusion | Development Residues on Substrate |
|---|---|---|---|---|---|---|---|---|
| Example 1 | 1-4 | 5200 | 1.66 | 1.72 | 98 | 95 | A | A |
| Example 2 | | 5820 | 1.98 | 1.82 | 99 | 95 | A | A |
| Example 3 | | 6700 | 1.77 | 1.99 | 99 | 97 | A | A |
| Example 4 | | 7300 | 1.99 | 1.99 | 98 | 95 | A | A |
| Example 5 | | 8400 | 1.41 | 2.01 | 99 | 98 | A | A |
| Example 6 | | 8510 | 1.30 | 1.87 | 97 | 99 | A | A |
| Example 7 | | 9020 | 1.55 | 1.88 | 99 | 100 | A | A |
| Example 8 | | 9180 | 1.74 | 1.70 | 99 | 100 | A | A |
| Example 9 | | 10500 | 1.28 | 1.67 | 98 | 100 | A | A |
| Example 10 | | 11800 | 1.38 | 1.54 | 99 | 100 | A | A |
| Example 11 | | 13200 | 1.50 | 1.99 | 99 | 100 | A | A |
| Example 12 | | 14000 | 1.88 | 1.98 | 100 | 100 | A | A |
| Example 13 | | 15500 | 2.44 | 1.77 | 100 | 100 | A | A |
| Example 14 | | 16700 | 2.10 | 1.88 | 100 | 100 | A | A |
| Example 15 | | 19800 | 1.99 | 1.66 | 99 | 100 | A | A |
| Comparative Example 1 | | 4010 | 1.90 | 1.58 | 81 | 85 | D | A |
| Comparative Example 2 | | 4890 | 1.99 | 1.99 | 88 | 90 | C | A |
| Comparative Example 3 | | 4680 | 2.82 | 2.04 | 77 | 80 | D | A |
| Comparative Example 4 | | 4890 | 3.51 | 1.82 | 68 | 71 | D | A |
| Comparative Example 5 | | 8110 | 2.61 | 1.83 | 89 | 88 | C | A |
| Comparative Example 6 | | 12800 | 2.78 | 1.83 | 91 | 92 | B | A |
| Comparative Example 7 | | 16800 | 2.90 | 1.91 | 96 | 94 | B | B |
| Comparative Example 8 | | 21800 | 1.99 | 1.94 | 100 | 100 | A | B |
| Comparative Example 9 | | 25000 | 1.68 | 1.55 | 100 | 100 | A | B |
| Comparative Example 10 | | 38100 | 1.71 | 1.67 | 100 | 100 | A | C |
| Comparative Example 11 | | 20090 | 2.81 | 1.77 | 94 | 97 | B | C |
| Comparative Example 12 | | 20200 | 3.11 | 1.88 | 95 | 97 | B | C |

TABLE 2

| | Exemplary Compound | Weight-average Molecular Weight (Mw) | Dispersity Mw/Mn | Acid Value (mmol/g) | Alkali Dissolution Resistance | Solvent Resistance | Color Transfer due to Heat Diffusion | Development Residues on Substrate |
|---|---|---|---|---|---|---|---|---|
| Example 16 | 2-3 | 6100 | 1.71 | 2.25 | 99 | 96 | A | A |
| Example 17 | | 8820 | 1.77 | 2.11 | 99 | 98 | A | A |
| Example 18 | | 9210 | 1.81 | 2.31 | 99 | 98 | A | A |
| Example 19 | | 10300 | 1.90 | 2.34 | 99 | 98 | A | A |
| Example 20 | | 11890 | 1.51 | 2.11 | 100 | 99 | A | A |
| Comparative Example 13 | | 4810 | 1.99 | 2.12 | 81 | 85 | C | B |
| Comparative Example 14 | | 4700 | 2.81 | 2.33 | 77 | 79 | D | B |
| Comparative Example 15 | | 8210 | 2.66 | 2.41 | 88 | 89 | D | B |
| Comparative Example 16 | | 20100 | 1.78 | 2.36 | 98 | 98 | B | C |
| Comparative Example 17 | | 22200 | 2.68 | 2.22 | 91 | 94 | B | C |

TABLE 3

| | Exemplary Compound | Weight-average Molecular Weight (Mw) | Dispersity Mw/Mn | Acid Value (mmol/g) | Alkali Dissolution Resistance | Solvent Resistance | Color Transfer due to Heat Diffusion | Development Residues on Substrate |
|---|---|---|---|---|---|---|---|---|
| Example 21 | 4-3 | 6100 | 1.71 | 2.81 | 99 | 96 | A | A |
| Example 22 | | 8820 | 1.77 | 2.65 | 99 | 98 | A | A |
| Example 23 | | 9210 | 1.81 | 2.78 | 99 | 98 | A | A |
| Example 24 | | 10300 | 1.90 | 2.77 | 99 | 98 | A | A |
| Example 25 | | 11890 | 1.51 | 2.65 | 100 | 99 | A | A |
| Comparative Example 18 | | 4810 | 1.99 | 2.55 | 81 | 85 | C | B |
| Comparative Example 19 | | 4700 | 2.81 | 2.66 | 77 | 79 | D | B |
| Comparative Example 20 | | 8210 | 2.66 | 2.88 | 88 | 89 | D | B |
| Comparative Example 21 | | 20100 | 1.78 | 2.51 | 98 | 98 | B | C |
| Comparative Example 22 | | 22200 | 2.68 | 2.66 | 91 | 94 | B | C |

TABLE 4

| | Exemplary Compound | Weight-average Molecular Weight (Mw) | Dispersity Mw/Mn | Acid Value (mmol/g) | Alkali Dissolution Resistance | Solvent Resistance | Color Transfer due to Heat Diffusion | Development Residues on Substrate |
|---|---|---|---|---|---|---|---|---|
| Example 26 | 3-3 | 6100 | 1.71 | 2.88 | 99 | 96 | A | A |
| Example 27 | 5-1 | 8820 | 1.77 | 2.91 | 99 | 98 | A | A |
| Example 28 | 6-1 | 9210 | 1.81 | 1.54 | 99 | 98 | A | A |
| Example 29 | 7-1 | 10300 | 1.90 | 2.81 | 99 | 98 | A | A |
| Example 30 | 8-2 | 11890 | 1.51 | 2.11 | 100 | 99 | A | A |
| Comparative Example 23 | 9-1 | 4810 | 1.99 | 2.33 | 81 | 85 | A | A |
| Comparative Example 24 | 10-1 | 4700 | 2.81 | 1.86 | 77 | 79 | A | A |
| Comparative Example 25 | 11-1 | 8210 | 2.66 | 1.53 | 88 | 89 | A | A |
| Example 31 | 12-2 | 20100 | 1.78 | 2.88 | 98 | 98 | A | A |

TABLE 5

| | Exemplary Compound | Weight-average Molecular Weight (Mw) | Dispersity Mw/Mn | Acid Value (mmol/g) | Alkali Dissolution Resistance | Solvent Resistance | Color Transfer due to Heat Diffusion | Development Residues on Substrate |
|---|---|---|---|---|---|---|---|---|
| Example 32 | A | 8000 | 1.44 | 1.65 | 97 | 96 | A | A |
| Example 33 | | 15100 | 1.64 | 1.88 | 95 | 98 | A | A |
| Comparative Example 26 | | 52100 | 1.54 | 1.99 | 94 | 98 | A | C |
| Comparative Example 27 | | 3600 | 2.81 | 1.89 | 81 | 84 | C | C |

The exemplary compound A shown in Table 5 is polymer A described in Japanese Patent No. 3736221 (a copolymer of a dye monomer having the following structure, 2-acrylamide-2-methylpripane sulfonic acid, 2-hydroxyethyl methacrylate and methacrylic acid).

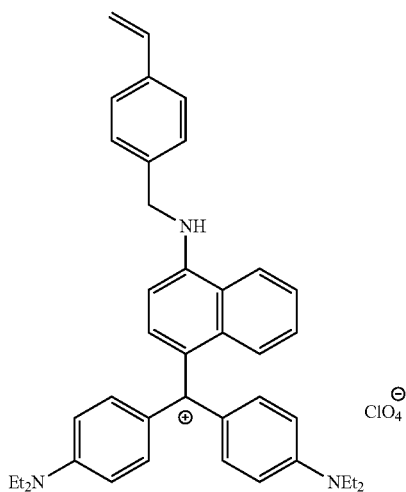

As shown in Tables 1 to 5, it is proved that Examples 1 to 33, in which a dye multimer controlled to have a specific property according to the present invention is used, exhibit superior alkali dissolution resistance and solvent resistance compared with Comparative Examples 1 to 27. Moreover, the Examples exhibit favorable results in the color transfer due to heat diffusion, formation of residues on the substrate or the other color, and suppression of dye infiltration, thereby proving a remarkable effect of suppressing color mixing.

Further, the coating solutions (colored compositions), in which a dye multimer controlled to have a specific property according to the present invention is used, is unexpectedly found to exhibit favorable coating suitability that forms few slits or color unevenness on a coating surface.

In Examples 1 to 33 as explained above, a blue colored pattern (blue color filter) was formed on a glass substrate. However, it is possible to form color filters of three colors on a substrate (a silicon wafer substrate on which a solid-state image sensor such as CCD or CMOS is formed) by forming a blue color filter according to the process of Examples 1 to 33, a green color filter from a green color resist by a known method, and a red color filter from a red color resist by a known method, respectively. The thus obtained solid-state image sensor having color filters of three colors exhibits suppressed infiltration of the dye, suppressed heat diffusion (color transfer) of the dye due to heat treatment, and suppressed color mixing due to development residues. Further, the solid-state image sensor exhibits excellent color reproducibility and sensitivity.

Example 2-1

(1) Preparation of Colored Composition (Positive-Type)

Ethyl lactate (EL): 30 parts
Resin P-1 (see below): 3.0 parts
Naphthoquinone diazide N-1 (see below): 1.8 parts
Crosslinking agent (hexamethoxymethylolated melamine): 0.6 parts
Photo-acid generator (TAZ-107, trade name, manufactured by Midori Kagaku Co. Ltd.): 1.2 parts
Fluorosurfactant (F-475, trade name, manufactured by DIC Corporation): 0.0005 parts
Dye (exemplary compound 1.4, average molecular weight: 5200, dispersity: 1.66): 0.3 parts The above components were mixed and dissolved to obtain a colored composition (positive-type).

The resin P-1 and the naphthoquinone diazide compound N-1 were synthesized according to the following processes.

(2) Synthesis of Resin P-1

70.0 g of benzyl methacrylate, 13.1 g of methacrylic acid, 17.0 g of 2-hydroxyethyl methacrylate and 600 g of 2-methoxypropanol were placed in a three-neck flask, and a stirrer, a reflux condenser and a thermometer were attached thereto. Under a nitrogen flow at 65° C., a catalyst amount of a polymerization initiator (V-65, trade name, manufactured by Wako Pure Chemical Industries, Ltd.) was added and stirred for 10 hours. The obtained resin solution was dropped in 20 L of ion exchange water while vigorously stirring, thereby obtaining a white powder. The white powder was vacuum-dried at 40° C. for 24 hours, thereby obtaining resin P-1. The weight-average molecular weight (Mw) and the number-average molecular weight (Mn) as measured by GPC were 28,000 and 11,000, respectively.

(3) Synthesis of Naphthoquinone Diazide Compound N-1

42.45 g pf TrisP-PA (manufactured by Honshu Chemical Industry Co., Ltd.), 61.80 g of o-naphthoquinone diazide-5-sulfonyl chloride and 300 ml of acetone were placed in a three-neck flask, and 24.44 g of triethylamine were dropped thereto under room temperature over 1 hour. After the completion of the dropping, the reaction solution was further stirred for 2 hours, and the resulting reaction solution was poured into a large amount of water while stirring. Naphthoquinone diazide sulfonate formed as a precipitate in water was collected by suction filtration and vacuum-dried at 40° C. for 24 hours, thereby obtaining photosensitive compound N-1.

The colored compound (positive-type) obtained in the above process was evaluated according to the method of Example 1. The colored composition exhibited favorable results in terms of improved alkali dissolution resistance, solvent resistance, suppressed color transfer due to heat diffusion, suppressed formation of development residues to a substrate or the other color, and suppressed infiltration of the dye.

Examples 3-1 and 3-2

Preparation of a Dark Color Composition for Forming Partition Walls

A dark color composition K1 was prepared by the following process.

K pigment dispersion 1 (carbon black) and propylene glycol monomethyl ether acetate in the amounts shown in Table 6 were weighed and mixed at 24° C. (±2° C.), and stirred for 10 minutes at 150 rpm. While further stirring the mixture, methyl ethyl ketone (2-butanone), binder 2, hydroquinone monomethyl ether, DPHA solution, 2,4-bis(trichloromethyl)-6-[4'-(N,N-bisethoxycarbonyl methyl)amino-3'-bromophenyl]-s-triazine, and surfactant 1 were weighed and added in this order at 25° C. (±2° C.), and the mixture was stirred for 30 minutes at 150 rpm at 40° C. (±2° C.). The amounts described in Table 6 are on the mass basis, and the specific composition is as follows.

<K Pigment Dispersion 1>
Carbon black (Nipex 35, trade name, manufactured by Evonik Degussa Japan Co., Ltd.): 13.1%
Dispersant (following compound B1): 0.65%
Polymer (random copolymer of benzyl methacrylate/ methacrylic acid=72/28 (molar ratio)), molecular weight: 37000): 6.72%
Propylene glycol monomethyl ether acetate: 79.53%

Compound B1

<Binder 2>
Polymer (random copolymer of benzyl methacrylate/ methacrylic acid=78/22 (molar ratio)), molecular weight: 38000): 27%
Propylene glycol monomethyl ether acetate: 73%
<DHPA Solution>
Dipentaerythritol hexaacrylate (polymerization inhibitor MEHQ 5000 ml containing, KAYARAD DPHA, trade name, manufactured by Nippon Kayaku Co., Ltd.): 76%
Propylene glycol monomethyl ether acetate: 24%
<Surfactant 1>
Compound having the following structure 1: 30%
Methyl ethyl ketone: 70%

Structure 1

(N=6, x=55, y=5, Mw=33940, Mw/Mn=2.55, PO: propylene oxide, EO: ethylene oxide)

TABLE 6

| Dark color composition | K1 |
| --- | --- |
| K pigment dispersion 1 (carbon black) | 25 |
| Propylene glycol monomethyl ether acetate | 8 |
| 2-butanone | 53 |

TABLE 6-continued

| Dark color composition | K1 |
| --- | --- |
| Binder 2 | 9.1 |
| Hydroquinone monomethyl ether | 0.002 |
| DPHA solution | 4.2 |
| 2,4-bis(trichloromethyl)-6-[4'-(N,N-bisethoxycarbonylmethyl)amino-3'-bromophenyl]-s-triazine | 0.16 |
| Surfactant 1 | 0.044 |

(Formation of Partition Wall)

An alkali-free glass substrate was washed with a UV washing machine, and then washed with a brush and a cleaner, and subsequently subjected to ultrasonic washing with pure water. The state of the surface of the substrate was stabilized by performing a heat treatment at 120° C. for 3 minutes.

After cooling the substrate to 23° C., the dark color composition K1 was applied onto the glass substrate with a coater for a glass substrate having a slit-shaped nozzle (MH-1600, trade name, manufactured by FAS Asia). Subsequently, part of the solvent was dried for 30 seconds to eliminate the solubility of the coating layer with a VCD (a vacuum drying machine, manufactured by Tokyo Ohka Kogyo Co., Ltd.), and pre-baked at 120° C. for 3 minutes to form a dark color composition layer K1 having a thickness of 2.3 μm.

Pattern exposure was performed under a nitrogen atmosphere at an exposure amount of 300 mJ/cm$^2$, partition wall width of 20 μm and a space width of 100 μm, with a proximity exposure machine (manufactured by Hitachi High-Technologies Corporation) having an ultrahigh-pressure mercury lamp, while placing the substrate and a mask (a quartz exposure mask having an image pattern) in a vertical manner with a space between the mask surface and the dark color composition layer K1 of 200 μm.

Thereafter, pure water was sprayed with a shower nozzle to uniformly moisten the surface of dark color composition layer K1, and shower development was performed with a KOH developer (nonionic surfactant containing, trade name: CDK-1, manufactured by FUJIFILM Electronic Materials Co., Ltd., diluted 100 times) at 23° C. for 80 seconds and a flat nozzle pressure of 0.04 MPa, thereby obtaining a patterning image. Subsequently, residues were removed by jetting ultra-pure water at a pressure of 9.8 MPa with an ultra-high pressure nozzle. Thereafter, post exposure was performed from a side of the substrate on which the dark color composition layer K1 was formed at an atmospheric pressure and an exposure amount of 2500 mJ/cm$^2$. The resultant was heated in an oven at 240° C. for 50 minutes, thereby obtaining partition walls in a stripe pattern with a thickness of 2.0 μm, optical density of 4.0 and a 100 μm-width opening.

(Plasma Treatment for Imparting Ink Repellency)

The substrate on which partition walls were formed was subjected to a plasma treatment to impart ink repellency under the following conditions, with a cathode coupling parallel plate plasma treatment apparatus.

Gas: CF4
Gas flow rate: 80 sccm
Pressure: 40 Pa
RF power: 50 W
Treatment time: 30 sec (Preparation of Violet (V) Ink)

The components shown in Table 7 were mixed and stirred for 1 hour. Thereafter, the mixture was subjected to filtration with reduced pressure using a micro filter having an average pore size of 0.25 μm, thereby preparing a violet ink (ink V-1 and ink V-2).

Details of the components used are as follows.

Dye: exemplary compound 2-3 (average molecular weight: 8,820, dispersity: 1.77, acid value: 2.65 mmol/g)

DPCA-60 (KAYARAD DPCA, trade name, manufactured by Nippon Kayaku Co., Ltd., caprolactone-modified dipentaerythritol hexaacrylate)

KF-353 (manufactured by Shin-Etsu Chemical Co., Ltd., polyether-modified silicone oil)

TABLE 7

| Class | Material | Example 3-1 Ink V-1 | Example 3-2 Ink V-2 |
|---|---|---|---|
| Solvent | Cyclohexanone | 69.95% | 79.95% |
| Monomer | DPCA-60 | 20% | 10% |
| Surfactant | KF-353 | 0.05% | 0.05% |
| Dye | Exemplary Compound 2-3 | 10% | 10% |
| Ink Viscosity (mPa · s) | | 9 | 5.3 |
| Surface Tension (mN/m) | | 25.2 | 29 |

(Measurement of Viscosity and Surface Tension)

The viscosity of the obtained ink was measured under the following conditions with an E-type viscometer (RE-80L, trade name, manufactured by Toki Sangyo Co., Ltd.) while maintaining the temperature of the ink at 25° C.

Measurement Conditions
Rotor: 134° 34'×R24
Measurement time: 2 minutes
Measurement temperature: 25° C.

The surface tension of the ink was measured with a surface tensiometer (CBVB-A3, trade name, manufactured by Kyowa Interface Science Co., Ltd.)

(Method of Measuring Contrast)

A cold-cathode tube to which a diffusion plate was place was used as a backlight unit, and a single-color substrate was placed between two polarizing plates (PORAX-15N, trade name, manufactured by Luceo Co., Ltd.). The contrast was calculated by dividing the Y value of chromaticity of light when it passes through the polarizing plates positioned in parallel nicole by the Y value of chromaticity of light when it passes through the polarizing plates positioned in cross nicole. The chromaticity was measured with a color luminance meter (BM-5A, trade name, manufactured by Topcon Corporation). A single-color substrate was prepared by the following method.

Ink (ink V-1 and ink V-2) for forming a color filter was applied on a glass substrate by an inkjet method or a spin coat method to form a solid film, and this was subjected to pre-baking at 100° C. for 2 minutes in a similar manner to the formation of a color filter, and post-baking at 220° C. for 30 minutes, thereby forming a film having a thickness of 2 μm.

The measurement angle of the color luminance meter was set at 1° and the measurement was conducted at a field of vision (diameter: 5 mm) on the sample. The light amount of the backlight was set at 400 cd/m² when the two polarizing plates were positioned in parallel nicole without placing the sample.

The contrast of each of the single-color substrates (2 types) obtained in the above process was over 50,000, respectively.

(Preparation of ITO Layer)

Subsequently, an ITO film having a thickness of 1500 angstroms was formed on the single-color substrate obtained in the above process by sputtering ITO (indium tin oxide) at a film surface temperature of 200° C. for 15 minutes, thereby obtaining a color filter substrate with an ITO film.

(Change in Spectral Characteristic Before and After ITO Sputtering)

A spectral transmission curve in the wavelength range of from 400 to 700 nm was obtained using a UV-Vis absorption spectrometer (V-570, trade name, manufactured by JASCO Corporation). When the change in the amount of spectral transmission at a maximum peak before and after the sputtering is small, it indicates that a favorable heat resistance is achieved. The substrate before and after the ITO sputtering showed a negligible change in the spectral shape, which proved a favorable heat resistance.

Comparative Example 3-1

17.5 parts by mass of C. I. Pigment Violet 23 (manufactured by Dainichiseika Color & Chemicals mfg Co., Ltd.) were combined with 2.5 parts by mass of a pigment dispersion (compound B1) and 80 parts by mass of a solvent (1,3-butanedioldiacetate, hereinafter referred to as 1,3-BGDA) and MMPGAC (ethylene glycol monomethyl ether acetate), and after pre-mixing, the mixture was dispersed with a motor mill (M-50, trade name, manufactured by Eiger Japan) with zirconia beads having a diameter of 0.65 mm at a filling ratio of 80% and at a peripheral speed of 9 m/s for 25 hours, thereby preparing a violet pigment dispersion.

(Preparation of Ink for Comparative Example)

A pigment ink having the composition shown in Table 8 was prepared by using the pigment dispersion prepared in the above process.

In Table 8, DPS 100 refers to KAYARAD DPS 100, trade name, manufactured by Nippon Kayaku Co., Ltd.; TMPTA refers to KAYARAD TMPTA, trade name, manufactured by Nippon Kayaku Co., Ltd.; surfactant refers to surfactant 1 as previously mentioned; and V-40 refers to azobis(cyclohexane-1-carbonitrile), manufactured by Wako Pure Chemical Industries, Ltd.

TABLE 8

| Class | Material | Comparative Example 3-1 Comparative Ink V |
|---|---|---|
| Solvent | 1,3-cyclohexanone | 23.90% |
| | MMPGAC | 20% |
| Monomer | DPS100 | 20% |
| | TMPTA | none |
| Surfactant | Surfactant 1 | 0.10% |
| Pigment | Pigment dispersion for V | 35% |
| Initiator | V-40 | 1% |

(Method of Producing Color Filter for Evaluation)

The ink prepared in the above process was ejected into portions defined by partition walls formed on the substrate (recessed portions surrounded by projecting portions) with an inkjet printer (DMP-2831, trade name, manufactured by Fujifilm Dimatix Inc.), and subsequently heated in an oven at 100° C. for 2 minutes. Thereafter, the resultant was placed in an oven and allowed to stand at 220° C. for 30 minutes, thereby preparing a color filter of a single color.

(Evaluation of Storage Stability of Ink)

The ink of each color prepared in the above process was stored in a thermostat room at 50° C., and 30 days after, the viscosity of the ink was measured. The storage stability of the ink was evaluated based on the difference (%) between the viscosity of the ink immediately after the preparation and the viscosity of the ink after the 30-day storage, which is calculated by {(viscosity 30 days after storage−viscosity immediately after preparation)/viscosity immediately after preparation}×100. The evaluation criteria are as follows.

A: Difference between the viscosity of the ink before and after the preparation is less than 10%.

B: Difference between the viscosity of the ink before and after the preparation is from 10% and less than 20%.

C: Difference between the viscosity of the ink before and after the preparation is from 20% to less than 30%.

D: Difference between the viscosity of the ink before and after the preparation is 30% or greater.

(Evaluation of Continuous Ejection Stability)

Ejection stability of the ink prepared in the above process was evaluated by performing 30-minute continuous ejection with an inkjet printer (DMP-2831, trade name, manufactured by Fujifilm Dimatix Inc.) using a head cartridge that ejects ink at a droplet amount of 10 pL, at an ejection frequency of 10 kHz. The evaluation criteria are as follows.

A: Continuous ejections could be carried out without problems.

B: A slight degree of ejection disorder was observed but a normal state was recovered during the ejection, which was almost acceptable.

C: Ejection disorder was observed and a normal state was not recovered during the ejection. However, a normal state was recovered by carrying out maintenance.

D: Ejection disorder was observed and a normal state was not recovered during the ejection. A normal state was not recovered by carrying out maintenance.

The maintenance was carried out by purging (forcibly ejecting ink from nozzles by pressuring the ink within the head), blotting (absorbing ink at a nozzle surface by contacting a cleaning pad) with the inkjet printer (DMP-2831).

(Evaluation of Ejection Stability after Pause)

Ejection stability of the ink prepared in the above process was evaluated by performing 5-minute ejection with an inkjet printer (DMP-2831, trade name, manufactured by Fujifilm Dimatix Inc.) using a head cartridge that ejects ink at a droplet amount of 10 pL, at an ejection frequency of 10 kHz; stopping the ejection to have a pause of 24 hours; and starting the ejection again under the same conditions. The evaluation criteria are as follows.

A: Ejection could be carried out upon receipt of ejection instructions, without problems.

B: A slight degree of ejection disorder was observed immediately after the receipt of ejection instructions, but a normal state was recovered during the ejection, which was almost acceptable.

C: Ejection disorder was observed and a normal state was not recovered during the ejection. However, a normal state was recovered by carrying out maintenance.

D: Ejection disorder was observed and a normal state was not recovered during the ejection. A normal state was not recovered by carrying out maintenance.

The maintenance was carried out by purging (forcibly ejecting ink from nozzles by pressuring the ink within the head), blotting (absorbing ink at a nozzle surface by contacting a cleaning pad) with the inkjet printer (DMP-2831).

(Evaluation of Heat Resistance)

The color filter of each color prepared in the above process was placed in an oven heated at 230° C., and after allowing the same to stand for 1 hour, the color hue of the color filter was measured. The color hue was measured with UV-560 (trade name, manufactured by JASCO Corporation), and the value of ΔEa before and after the evaluation was evaluated according to the following criteria.

A: ΔEa was less than 5.
B: ΔEa was from 5 to less than 15.
C: ΔEa was 5 or greater.

(Evaluation of Chemical Resistance)

The color filter of each color prepared in the above process was immersed in a chemical solution (N-methylpyrrolidone, 2-propanol, 5% sulfuric acid aqueous solution, 5% sodium hydroxide aqueous solution), and the color hue of the color filter before and after the immersion was measured with UV-560 (trade name, manufactured by JASCO Corporation) according to the following criteria.

A: ΔEa was less than 5.
B: ΔEa was from 5 to less than 15.
C: ΔEa was 5 or greater.

The evaluation criteria of the inkjet ink and the color filter are shown in Table 9.

TABLE 9

| Evaluation Items | Example 3-1 | Example 3-2 | Comparative Example 3-1 |
|---|---|---|---|
| Ink Storage Stability | A | A | A |
| Continuous Ejection Stability | A | A | C |
| Ejection Stability after Pause | A | B | D |
| Heat Resistance | A | A | A |
| Chemical Resistance (N-methylpyrrolidone) | A | A | A |
| Chemical Resistance (2-propanol) | A | A | A |
| Chemical Resistance (5% sulfuric acid aqueous solution) | A | A | A |
| Chemical Resistance (5% sodium hydroxide aqueous solution) | A | A | B |

As shown in Table 9, the inkjet ink according to the invention exhibited favorable storage stability and ejection stability. Further, the color filter produced by using the ink jet ink according to the invention exhibited chemical resistance and heat resistance which were as favorable as that of the color filter formed by using a pigment.

On the other hand, the comparative example, in which a pigment ink was used, exhibited poor storage stability which was not acceptable for practical applications.

All publications, patent applications, and technical standards mentioned in this specification are herein incorporated by reference to the same extent as if each individual publication, patent application, or technical standard was specifically and individually indicated to be incorporated by reference.

The invention claimed is:

1. A colored composition comprising a dye multimer, a polymerizable compound, a polymerization initiator and a solvent,
   the dye multimer having an alkali-soluble group, a weight-average molecular weight (Mw) of from 5,000 to 20,000, and a dispersity (weight-average molecular weight (Mw)/number-average molecular weight (Mn)) of from 1.00 to 2.50, and
   the dye multimer comprising a skeleton of a dye selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a phthalocyanine dye, a dioxazine dye, a dipyrromethene dye, and metal complexes thereof.

2. The colored composition according to claim 1, wherein the dye multimer has an acid value of from 0.5 mmol/g to 3.0 mmol/g.

3. The colored composition according to claim 1, wherein the dye multimer comprises at least one of structural units represented by following formula (A), formula (B) or formula (C), or is a dye multimer represented by following formula (D):

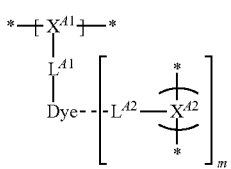

formula (A)

wherein, in the formula (A), $X^{A1}$ represents a linking group formed by polymerization; $L^{A1}$ represents a single bond or a divalent linking group; Dye represents a dye residue obtained by removing any one or more hydrogen atoms in a number of from 1 hydrogen atom to (1+m) hydrogen atoms from a dye compound selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a, phthalocyanine dye, a dioxazine dye, a dipyrromethene dye, and metal complexes thereof; $X^{A2}$ represents a linking group formed by polymerization; $L^{A2}$ represents a single bond or a divalent linking group; m represents an integer from 0 to 3; and Dye and $L^{A2}$ may be linked to each other by any one of covalent bonding, ionic bonding or coordinate bonding;

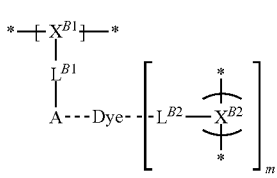

formula (B)

wherein, in the formula (B), $X^{B1}$ represents a linking group formed by polymerization; $L^{B1}$ represents a single bond or a divalent linking group; A represents a group capable of being bonded to Dye by ionic bonding or coordinate bonding; Dye represents a dye compound having a group capable of being bonded to A by ionic bonding or coordinate bonding, or a dye residue obtained by removing any one or more hydrogen atoms in a number of from 1 hydrogen atom to m hydrogen atoms from the dye compound, wherein the dye compound is selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a, phthalocyanine dye, a dioxazine dye, a dipyrromethene dye, and metal complexes thereof; $X^{B2}$ represents a linking group formed by polymerization; $L^{B2}$ represents a single bond or a divalent linking group; m represents an integer from 0 to 3; and Dye and $L^{B2}$ may be linked to each other by any one of covalent bonding, ionic bonding or coordinate bonding;

formula (C)

wherein, in the formula (C), $L^{C1}$ represents a single bond or a divalent linking group; and Dye represents a dye residue obtained by removing any two hydrogen atoms from a dye compound selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a, phthalocyanine dye, a dioxazine dye, a dipyrromethene dye, and metal complexes thereof;

formula (D)

wherein, in the formula (D), $L^{D1}$ represents an m-valent linking group; m represents an integer from 2 to 100; and Dye represents a dye residue obtained by removing any one hydrogen atom from a dye compound selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a, phthalocyanine dye, a dioxazine dye, a dipyrromethene dye, and metal complexes thereof.

4. The colored composition according to claim 3, wherein the dye multimer comprises at least one of structural units represented by the formula (A) or formula (C), or is a dye multimer represented by the formula (D).

5. The colored composition according to claim 3, wherein the dye multimer is represented by the formula (D).

6. A color filter formed from the colored composition according to claim 1.

7. A solid-state image sensor comprising the color filter according to claim 6.

8. A display device comprising the color filter according to claim 6.

9. An inkjet ink comprising the colored composition according to claim 1.

10. A method of producing a color filter, the method comprising:
providing a support having depressed portions defined by partitions; and
applying droplets of the inkjet ink according to claim 6 to the depressed portions by inkjetting, thereby forming colored pixels of the color filter.

11. A method of producing a color filter, the method comprising:
applying the colored composition according to claim 1 onto a support to form a colored layer;
exposing the colored layer to light via a mask; and
developing the exposed colored layer to form a colored pattern.

12. The colored composition according to claim 1, wherein the dye multimer comprises a skeleton of a dye selected from the group consisting of a cyanine dye, a xanthene dye, and a squarylium dye.

13. The colored composition according to claim 1, wherein the dye multimer has a weight-average molecular weight (Mw) of from 5,000 to 16,000.

14. The colored composition according to claim 1, wherein the dye multimer has a weight-average molecular weight (Mw) of from 5,000 to 12,000.

15. The colored composition according to claim 1, wherein the polymerization initiator is an oxime compound.

16. The colored composition according to claim 1, wherein the content of the dye multimer, which is the total content when two or more dye multimers are used, with respect to the total solids content of the colored composition is from 0.1% by mass to 70% mass.

17. A colored composition comprising a dye multimer, a polymerizable compound, and a polymerization initiator,
the dye multimer having an alkali-soluble group, a weight-average molecular weight (Mw) of from 5,000 to 20,000, and a dispersity (weight-average molecular weight (Mw)/number-average molecular weight (Mn)) of from 1.00 to 2.50, the polymerization initiator being an oxime compound, and
the dye multimer comprising a skeleton of a dye selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a bisazo dye, a disazo dye, a trisazo dye, an anthrapyridone dye, a perylene dye, a diketopyrrolopyrrole dye, an isoindoline dye, a phthalocyanine dye, a dioxazine dye, a dipyrromethene dye, and metal complexes thereof.

18. The colored composition according to claim 17, further comprising a solvent.

19. The colored composition according to claim 17, wherein the dye multimer has an acid value of from 0.5 mmol/g to 3.0 mmol/g.

20. The colored composition according to claim 17, wherein the dye multimer comprises at least one of structural units represented by the following formula (A), formula (B) or formula (C), or is a dye multimer represented by the following formula (D):

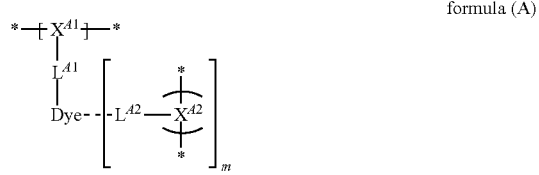

formula (A)

wherein, in the formula (A), $X^{A1}$ represents a linking group formed by polymerization; $L^{A1}$ represents a single bond or a divalent linking group; Dye represents a dye residue obtained by removing any one or more hydrogen atoms in a number of from 1 hydrogen atom to (1+m) hydrogen atoms from a dye compound; $X^{A2}$ represents a linking group formed by polymerization; $L^{A2}$ represents a single bond or a divalent linking group; m represents an integer from 0 to 3; and Dye and $L^{A2}$ may be linked to each other by any one of covalent bonding, ionic bonding or coordinate bonding;

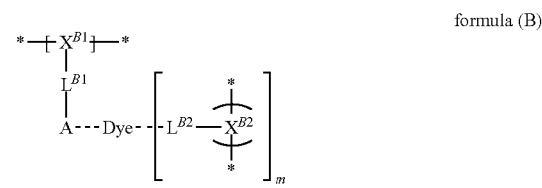

formula (B)

wherein, in the formula (B), $X^{B1}$ represents a linking group formed by polymerization; $L^{B1}$ represents a single bond or a divalent linking group; A represents a group capable of being bonded to Dye by ionic bonding or coordinate bonding; Dye represents a dye compound having a group capable of being bonded to A by ionic bonding or coordinate bonding, or a dye residue obtained by removing any one or more hydrogen atoms in a number of from 1 hydrogen atom to m hydrogen atoms from the dye compound; $X^{B2}$ represents a linking group formed by polymerization; $L^{B2}$ represents a single bond or a divalent linking group; m represents an integer from 0 to 3; and Dye and $L^{B2}$ may be linked to each other by any one of covalent bonding, ionic bonding or coordinate bonding;

formula (C)

wherein, in the formula (C), $L^{C1}$ represents a single bond or a divalent linking group; and Dye represents a dye residue obtained by removing any two hydrogen atoms from a dye compound;

formula (D)

wherein, in the formula (D), $L^{D1}$ represents an m-valent linking group; m represents an integer from 2 to 100; and Dye represents a dye residue obtained by removing any one hydrogen atom from a dye compound.

21. The colored composition according to claim 20, wherein the dye multimer comprises at least one of structural units represented by the formula (A) or formula (C), or is a dye multimer represented by the formula (D).

22. The colored composition according to claim 20, wherein the dye multimer is represented by the formula (D).

23. A color filter formed from the colored composition according to claim 17.

24. A solid-state image sensor comprising the color filter according to claim 23.

25. A display device comprising the color filter according to claim 23.

26. An inkjet ink comprising the colored composition according to claim 17.

27. A method of producing a color filter, the method comprising:
providing a support having depressed portions defined by partitions; and
applying droplets of the inkjet ink according to claim 26 to the depressed portions by inkjetting, thereby forming colored pixels of the color filter.

28. A method of producing a color filter, the method comprising:
applying the colored composition according to claim 17 onto a support to form a colored layer;
exposing the colored layer to light via a mask; and
developing the exposed colored layer to form a colored pattern.

29. The colored composition according to claim 17, wherein the dye multimer comprises a skeleton of a dye selected from the group consisting of a cyanine dye, a xanthene dye, and a squarylium dye.

30. The colored composition according to claim 17, wherein the dye multimer has a weight-average molecular weight (Mw) of from 5,000 to 16,000.

31. The colored composition according to claim 17, wherein the dye multimer has a weight-average molecular weight (Mw) of from 5,000 to 12,000.

32. The colored composition according to claim 1, wherein the dye multimer comprises a skeleton of a dye selected from the group consisting of a cyanine dye, a xanthene dye, a squarylium dye, and a triphenylmethane dye.

33. The colored composition according to claim 17, wherein the dye multimer comprises a skeleton of a dye selected from the group consisting of a cyanine dye, a xanthene dye, a squarylium dye, and a triphenylmethane dye.

34. A colored composition comprising a dye multimer and a solvent, wherein:
the dye multimer has an alkali-soluble group;
the dye multimer has a weight-average molecular weight (Mw) of from 5,000 to 20,000 and a dispersity (weight-average molecular weight (Mw)/number-average molecular weight (Mn)) of from 1.00 to 2.50; and
the dye multimer is represented by following formula (D):

$$(L^{D1}\text{─}(\text{Dye})_m \quad \text{formula (D)}$$

wherein $L^{D1}$ represents an m-valent linking group; m represents an integer from 2 to 100; and Dye represents a dye residue obtained by removing any one hydrogen atom from a dye compound selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a monoazo dye, a bisazo dye, a disazo dye, a trisazo dye, an anthrapyridone dye, a perylene dye, a diketopyrrolopyrrole dye, an isoindoline dye, a, phthalocyanine dye, an azomethine dye, a dioxazine dye, a dipyrromethene dye, and metal complexes thereof.

35. The colored composition according to claim 34, further comprising a polymerizable compound and a polymerization initiator.

36. A color filter formed from the colored composition according to claim 34.

37. A solid-state image sensor comprising the color filter according to claim 36.

38. A display device comprising the color filter according to claim 36.

39. The colored composition according to claim 34, wherein the dye multimer comprises a skeleton of a dye selected from the group consisting of a cyanine dye, a xanthene dye, and a squarylium dye.

40. The colored composition according to claim 34, wherein the dye compound is selected from the group consisting of a monomethine dye, a dimethine dye, a trimethine dye, a cyanine dye, a merocyanine dye, a dicyanostyryl dye, a diphenylmethane dye, a xanthene dye, a quinophthalone dye, a monoazo dye, a bisazo dye, a disazo dye, a trisazo dye, an anthrapyridone dye, a perylene dye, a diketopyrrolopyrrole dye, an isoindoline dye, a phthalocyanine dye, an azomethine dye, a dioxazine dye, a dipyrromethene dye, and metal complexes thereof.

41. A colored composition comprising a dye multimer, a polymerizable compound, and a polymerization initiator,
the dye multimer having an alkali-soluble group a weight-average molecular weight (Mw) of from 5,000 to 20,000, and a dispersity (weight-average molecular weight (Mw)/number-average molecular weight (Mn)) of from 1.00 to 2.50,
the polymerization initiator being an oxime compound, and
the dye multimer being represented by following formula (D):

$$(L^{D1}\text{─}(\text{Dye})_m \quad \text{formula (D)}$$

wherein $L^{D1}$ represents an m-valent linking group; m represents an integer from 2 to 100; and Dye represents a dye residue obtained by removing any one hydrogen atom from a dye compound selected from the group consisting of a monomethine dye, a dimethine dye, a trimethine dye, a cyanine dye, a merocyanine dye, a dicyanostyryl dye, a diphenylmethane dye, a triphenylmethane dye, a xanthene dye, a squarylium dye, a quinophthalone dye, a monoazo dye, a bisazo dye, a disazo dye, a trisazo dye, an anthrapyridone dye, a perylene dye, a diketopyrrolopyrrole dye, an isoindoline dye, a, phthalocyanine dye, an azomethine dye, a dioxazine dye, a dipyrromethene dye, and metal complexes thereof.

42. A color filter formed from the colored composition according to claim 41.

43. A solid-state image sensor comprising the color filter according to claim 42.

44. A display device comprising the color filter according to claim 42.

* * * * *